(12) United States Patent
Masuoka et al.

(10) Patent No.: US 8,530,960 B2
(45) Date of Patent: Sep. 10, 2013

(54) SEMICONDUCTOR DEVICE

(75) Inventors: Fujio Masuoka, Tokyo (JP); Hiroki Nakamura, Tokyo (JP)

(73) Assignee: Unisantis Electronics Singapore Pte. Ltd., Peninsula Plaza (SG)

( * ) Notice: Subject to any disclaimer, the term of this patent is extended or adjusted under 35 U.S.C. 154(b) by 0 days.

(21) Appl. No.: 13/298,508

(22) Filed: Nov. 17, 2011

(65) Prior Publication Data

US 2012/0139035 A1 Jun. 7, 2012

Related U.S. Application Data

(60) Provisional application No. 61/420,538, filed on Dec. 7, 2010.

(51) Int. Cl.
*H01L 29/66* (2006.01)

(52) U.S. Cl.
USPC ............ 257/329; 257/327; 257/368; 257/369

(58) Field of Classification Search
USPC ................. 257/329, E27.06, 327, 347, 351, 257/368, 369, 393
See application file for complete search history.

(56) References Cited

U.S. PATENT DOCUMENTS

| | | | | |
|---|---|---|---|---|
| 4,495,693 A | * | 1/1985 | Iwahashi et al. | 438/258 |
| 5,436,506 A | * | 7/1995 | Kim et al. | 257/347 |
| 2008/0042218 A1 | * | 2/2008 | Igarashi et al. | 257/391 |
| 2012/0139035 A1 | * | 6/2012 | Masuoka et al. | 257/329 |

FOREIGN PATENT DOCUMENTS

| | | |
|---|---|---|
| JP | 02-071556 A | 3/1990 |
| JP | 02-188966 A | 7/1990 |
| JP | 03-145761 A | 6/1991 |
| JP | 08-148582 A | 6/1996 |
| JP | 2002-237529 A | 8/2002 |
| JP | 2008-227344 A | 9/2008 |
| JP | 2009-182317 A | 8/2009 |
| WO | WO 2009/095998 A1 | 8/2009 |
| WO | WO 2009095998 A1 * | 8/2009 |

OTHER PUBLICATIONS

Kawasaki, H. et al., "Demonstration of Highly Scaled FinFET SRAM Cells with High-κ/Metal Gate and Investigation of Characteristic Variability for the 32 nm node and beyond," IEDM, 2008, pp. 237-240.

* cited by examiner

*Primary Examiner* — N Drew Richards
*Assistant Examiner* — Jay C Chang
(74) *Attorney, Agent, or Firm* — Brinks Hofer Gilson & Lione

(57) ABSTRACT

A semiconductor memory device includes a static memory cell having six MOS transistors arranged on a substrate. The six MOS transistors include first and second NMOS access transistors, third and fourth NMOS driver transistors, and first and second PMOS load transistors. Each of the first and second NMOS access transistors has a first diffusion layer, a pillar-shaped semiconductor layer, and a second diffusion layer arranged vertically on the substrate in a hierarchical manner. Each of the third and fourth NMOS driver transistors has a third diffusion layer, a pillar-shaped semiconductor layer, and a fourth diffusion layer arranged vertically on the substrate in a hierarchical manner. The lengths between the upper ends of the third diffusion layers and the lower ends of the fourth diffusion layers are shorter than the lengths between the upper ends of the first diffusion layer and the lower ends of the second diffusion layers.

10 Claims, 58 Drawing Sheets

SEMICONDUCTOR DEVICE

RELATED APPLICATIONS

This application claims the benefit of the filing date of U.S. Provisional Application Ser. No. 61/420,538 filed on Dec. 7, 2011 pursuant to 35 U.S.C.§119(e). The entire content of this application is hereby incorporated by reference.

BACKGROUND OF THE INVENTION

1. Field of the Invention

The present invention relates to a semiconductor device.

2. Description of the Related Art

The degree of integration of semiconductor integrated circuits, namely, integrated circuits using metal oxide semiconductor (MOS) transistors, has been increasing. The increasing degree of integration of such integrated circuits results in MOS transistors having small sizes reaching nano-scale dimensions. Inverter circuits are fundamental circuits of digital circuits, and the increasing decrease in the size of MOS transistors included in inverter circuits causes difficulty in suppressing leak currents, leading to problems of reduced reliability due to hot carrier effects and of the reduction in the area of the circuits being prevented because of the requirements of the secure retention of necessary currents. To overcome the above problems, a surrounding gate transistor (SGT) having a structure in which a source, gate, and drain are arranged vertically with respect to a substrate and in which the gate surrounds an island-shaped semiconductor layer has been proposed (for example, Japanese Unexamined Patent Application Publications No. 2-71556, No. 2-188966, and No. 3-145761).

It is known that in a static memory cell, the current driving force of a driver transistor is made double the current driving force of an access transistor to ensure operational stability (H. Kawasaki, M. Khater, M. Guillorn, N. Fuller, J. Chang, S. Kanakasabapathy, L. Chang, R. Muralidhar, K. Babich, Q. Yang, J. Ott, D. Klaus, E. Kratschmer, E. Sikorski, R. Miller, R. Viswanathan, Y. Zhang, J. Silverman, Q. Ouyang, A. Yagishita, M. Takayanagi, W. Haensch, and K. Ishimaru, "Demonstration of Highly Scaled FinFET SRAM Cells with High-κ/Metal Gate and Investigation of Characteristic Variability for the 32 nm node and beyond", IEDM, pp. 237-240, 2008).

To construct a static memory cell using the above SGT, two driver transistors are used because of the need for a double gate width in order to make it feasible to make the current driving force of a driver transistor double the current driving force of an access transistor to ensure operational stability. This leads to an increase in memory cell area.

Further, an SGT production method has been proposed of forming a pillar-shaped semiconductor layer, depositing a gate conductive film on the pillar-shaped semiconductor layer, performing planarization, and then etching back the gate conductive film to obtain a desired length (Japanese Unexamined Patent Application Publication No. 2009-182317). This high-degree-of-integration, high-performance, and high-yield SGT production method allows the physical gate length of the SGT to be kept uniform over all the transistors on a wafer.

Additionally, the increasing decrease in the size of static memory cells reduces the gate capacitance or diffusion layer capacitance of a MOS transistor to be connected to a storage node because of the reduction in dimensions. In this case, if the static memory cell is irradiated with radiation from the outside, electron-hole pairs are generated in a semiconductor substrate along the path of radiation, and at least the electrons or holes of the electron-hole pairs flow into a diffusion layer that forms the drain, causing data inversion. Thus, a soft-error phenomenon occurs in that data cannot be correctly held. The soft-error phenomenon has become a serious problem in recent static memory cells whose sizes have been reduced because as the decrease in the size of memory cells increases, the reduction in the gate capacitance or diffusion layer capacitance of the MOS transistor to be connected to the storage node becomes more noticeable than the electron-hole pairs generated by radiation. Therefore, it has been reported that a capacitor is formed in a storage node of a static memory cell to ensure sufficient electrical charges in the storage node so that the occurrence of soft errors can be avoided to ensure operational stability (Japanese Unexamined Patent Application Publication No. 2008-227344).

SUMMARY OF THE INVENTION

Accordingly, the present invention provides a high-degree-of-integration, operational stability-secured static memory cell using an SGT.

In an aspect of the present invention, a semiconductor device includes a static memory cell having six MOS transistors arranged on a substrate. The six MOS transistors include first and second NMOS access transistors for accessing a memory, third and fourth NMOS driver transistors for driving a storage node that holds data of the memory cell, and first and second PMOS load transistors that supply charges for holding the data of the memory cell. Each of the first and second NMOS access transistors for accessing the memory has a first diffusion layer, a pillar-shaped semiconductor layer, and a second diffusion layer arranged vertically with respect to the substrate in a hierarchical manner so that the pillar-shaped semiconductor layer is arranged between the first diffusion layer and the second diffusion layer, and the pillar-shaped semiconductor layer has a side wall on which a gate is formed. Each of the third and fourth NMOS driver transistors for driving the storage node that holds the data of the memory cell has a third diffusion layer, a pillar-shaped semiconductor layer, and a fourth diffusion layer arranged vertically with respect to the substrate in a hierarchical manner so that the pillar-shaped semiconductor layer is arranged between the third diffusion layer and the fourth diffusion layer, and the pillar-shaped semiconductor layer has a side wall on which a gate is formed. Each of the first and second PMOS load transistors that supply the charges for holding the data of the memory cell has a fifth diffusion layer, a pillar-shaped semiconductor layer, and a sixth diffusion layer arranged vertically with respect to the substrate in a hierarchical manner so that the pillar-shaped semiconductor layer is arranged between the fifth diffusion layer and the sixth diffusion layer, and the pillar-shaped semiconductor layer has a side wall on which a gate is formed. The first diffusion layers, the third diffusion layers, and the fifth diffusion layers are arranged so as to be electrically insulated from the substrate. A length between an upper end of the third diffusion layer and a lower end of the fourth diffusion layer of each of the third and fourth NMOS driver transistors is shorter than a length between an upper end of the first diffusion layer and a lower end of the second diffusion layer of each of the first and second NMOS access transistors.

In another aspect of the present invention, a semiconductor device includes a static memory cell having six MOS transistors arranged on a substrate. The six MOS transistor include first and second NMOS access transistors for accessing a memory, third and fourth NMOS driver transistors that drive a storage node for holding data of the memory cell, and first and second PMOS load transistors that supply charges for holding the data of the memory cell. Each of the first and second NMOS access transistors for accessing the memory has a first diffusion layer, a pillar-shaped semiconductor layer, and a second diffusion layer arranged vertically with respect to the substrate in a hierarchical manner so that the pillar-shaped semiconductor layer is arranged between the first diffusion layer and the second diffusion layer, and the pillar-shaped semiconductor layer has a side wall on which a gate is formed. Each of the third and fourth NMOS driver transistors for driving the storage node that holds the data of the memory cell has a third diffusion layer, a pillar-shaped semiconductor layer, and a fourth diffusion layer arranged vertically with respect to the substrate in a hierarchical manner so that the pillar-shaped semiconductor layer is arranged between the third diffusion layer and the fourth diffusion layer, and the pillar-shaped semiconductor layer has a side wall on which a gate is formed. Each of the first and second PMOS load transistors that supply the charges for holding the data of the memory cell has a fifth diffusion layer, a pillar-shaped semiconductor layer, and a sixth diffusion layer arranged vertically with respect to the substrate in a hierarchical manner so that the pillar-shaped semiconductor layer is arranged between the fifth diffusion layer and the sixth diffusion layer, and the pillar-shaped semiconductor layer has a side wall on which a gate is formed. The first diffusion layers, the third diffusion layers, and the fifth diffusion layers are arranged so as to be electrically insulated from the substrate. A length between an upper end of the third diffusion layer and a lower end of the fourth diffusion layer of each of the third and fourth NMOS driver transistors is shorter than a length between an upper end of the fifth diffusion layer and a lower end of the sixth diffusion layer of each of the first and second PMOS load transistors.

Preferably, the length between the upper end of the first diffusion layer and the lower end of the second diffusion layer of each of the first and second NMOS access transistors is within a range of 1.3 times to three times the length between the upper end of the third diffusion layer and the lower end of the fourth diffusion layer of each of the third and fourth NMOS driver transistors.

Preferably, the length between the upper end of the fifth diffusion layer and the lower end of the sixth diffusion layer of each of the first and second PMOS load transistors is within a range of 1.3 times to three times the length between the upper end of the third diffusion layer and the lower end of the fourth diffusion layer of each of the third and fourth NMOS driver transistors.

Lengths from lower ends to upper ends of the gates can be the same.

The upper end of the third diffusion layer of each of the third and fourth NMOS driver transistors can be at a position higher than the upper end of the first diffusion layer of each of the first and second NMOS access transistors.

The lower end of the fourth diffusion layer of each of the third and fourth NMOS driver transistors can be at a position lower than the lower end of the second diffusion layer of each of the first and second NMOS access transistors.

The upper end of the third diffusion layer of each of the third and fourth NMOS driver transistors can be at a position higher than the upper end of the first diffusion layer of each of the first and second NMOS access transistors, and the lower end of the fourth diffusion layer of each of the third and fourth NMOS driver transistors can be at a position lower than the lower end of the second diffusion layer of each of the first and second NMOS access transistors.

The first diffusion layer of each of the first and second NMOS access transistors can be formed after the third diffusion layer of each of the third and fourth NMOS driver transistors is formed.

The fourth diffusion layers of the third and fourth NMOS driver transistors and the second diffusion layers of the first and second NMOS access transistors can be formed by ion implantation. Further, energy of ion implantation for forming the fourth diffusion layer of each of the third and fourth NMOS driver transistors can be higher than energy of ion implantation for forming the second diffusion layer of each of the first and second NMOS access transistors.

The fourth diffusion layers of the third and fourth NMOS driver transistors can include phosphorus.

According to the present invention, a high-degree-of-integration, operational stability-secured static memory cell in which the channel length of a driver transistor can be shorter than the channel length of an access transistor, and a method for fabricating the static memory cell can be provided.

DETAILED DESCRIPTION OF THE PREFERRED EMBODIMENTS

Figure 1:
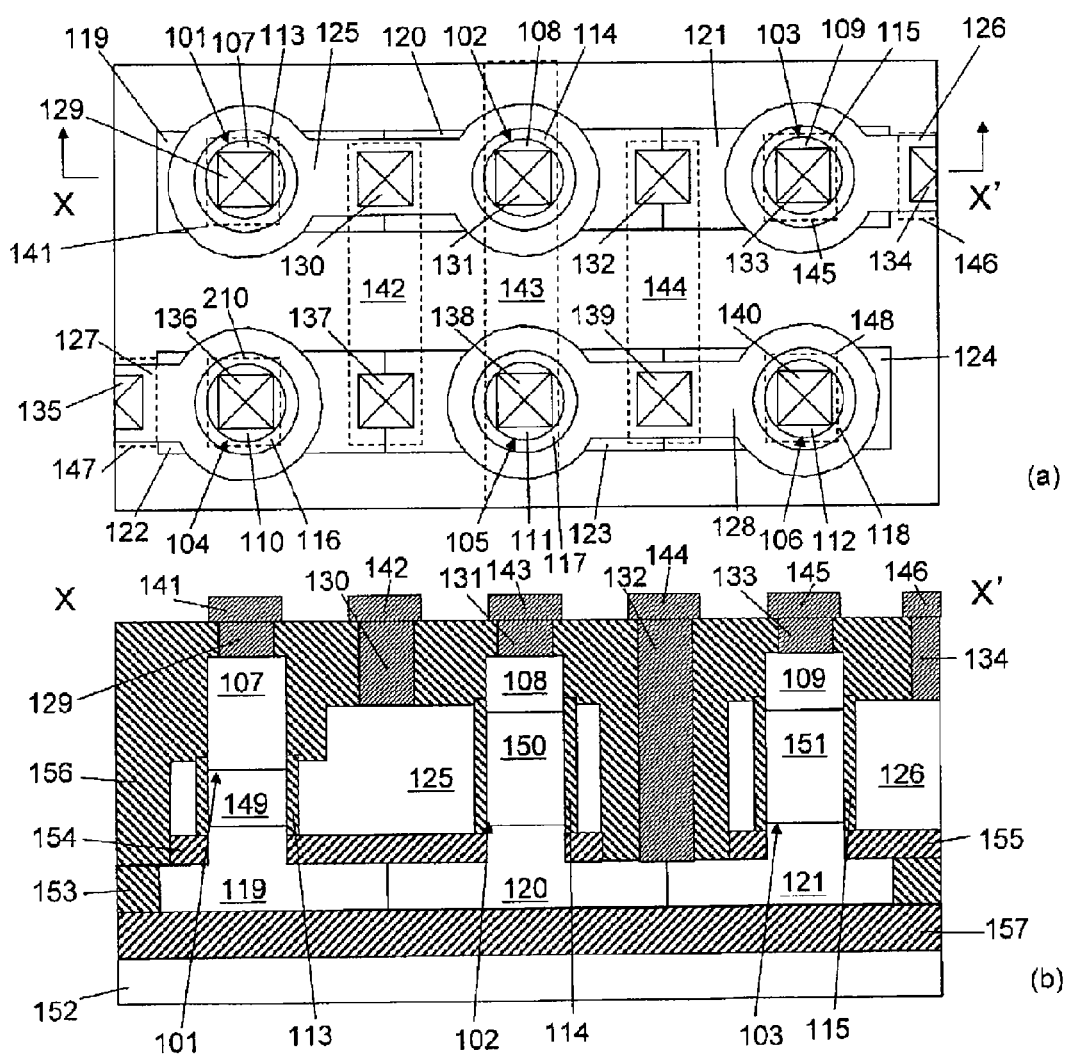
FIG. 1A is a plan view of a static memory cell according to first and second embodiments of the present invention.
FIG. 1B is a cross-sectional view taken along line X-X' in FIG. 1A.

Embodiments of the present invention will be described hereinafter with reference to the drawings. It is to be understood that the present invention is not to be limited to the following embodiments.

FIGS. 1A and 1B illustrate a plan view and a cross-sectional view of a static memory cell according to a first embodiment of the present invention, respectively. A third NMOS driver transistor 101 has a third diffusion layer 119, a pillar-shaped semiconductor layer 149, and a fourth diffusion layer 107. A gate 125 is formed on side walls of the pillar-shaped semiconductor layer 149, a portion of the fourth diffusion layer 107, and a portion of the third diffusion layer 119 of the third NMOS driver transistor 101 via a gate insulating film 113.

A first NMOS access transistor 103 has a first diffusion layer 121, a pillar-shaped semiconductor layer 151, and a second diffusion layer 109. A gate 126 is formed on side walls of the pillar-shaped semiconductor layer 151, a portion of the second diffusion layer 109, and a portion of the first diffusion layer 121 of the first NMOS access transistor 103 via a gate insulating film 115.

The gate height of the gate 125 is low in the vicinity of the third NMOS driver transistor 101, and the physical gate length of the gate 125 is shorter than that of the gate 126. The length between the first diffusion layer 121 and the second diffusion layer 109 of the first NMOS access transistor 103 is twice the length between the third diffusion layer 119 and the fourth diffusion layer 107 of the third NMOS driver transistor 101. Therefore, the current driving force of the driver transistor can be made double the current driving force of the access transistor without increasing the area, and operational stability can be ensured.

A first PMOS load transistor 102 has a fifth diffusion layer 120, a pillar-shaped semiconductor layer 150, and a sixth diffusion layer 108. The gate 125 is formed on side walls of the pillar-shaped semiconductor layer 150, a portion of the fifth diffusion layer 120, and a portion of the sixth diffusion layer 108 of the first PMOS load transistor 102 via a gate insulating film 114.

The third NMOS driver transistor 101 and the first PMOS load transistor 102 are connected to each other via the gate 125. Further, the third diffusion layer 119, the fifth diffusion layer 120, and the first diffusion layer 121 are connected to one another via a silicide layer (not illustrated in the drawings). In the drawings, a silicon-on-insulator (SOI) substrate is used to electrically insulate the third diffusion layer 119, the fifth diffusion layer 120, and the first diffusion layer 121 from a substrate; however, any other method that can provide electrical insulation may be used. For example, a PN junction may be formed using a Si substrate and electrical insulation may be formed using the reverse bias state of the PN junction.

A fourth NMOS driver transistor 106 has a third diffusion layer 124, a pillar-shaped semiconductor layer, and a fourth diffusion layer 112. A gate 128 is formed on side walls of the pillar-shaped semiconductor layer, a portion of the third diffusion layer 124, and a portion of the fourth diffusion layer 112 of the fourth NMOS driver transistor 106 via a gate insulating film 118.

A second NMOS access transistor 104 has a first diffusion layer 122, a pillar-shaped semiconductor layer, and a second diffusion layer 110. A gate 127 is formed on side walls of the pillar-shaped semiconductor layer, a portion of the first diffusion layer 122, and a portion of the second diffusion layer 110 of the second NMOS access transistor 104 via a gate insulating film 116. Although not illustrated in the drawings, the length between the first diffusion layer 122 and the second diffusion layer 110 of the second NMOS access transistor 104 is twice the length between the third diffusion layer 124 and the fourth diffusion layer 112 of the fourth NMOS driver transistor 106.

A second PMOS load transistor 105 has a fifth diffusion layer 123, a pillar-shaped semiconductor layer, and a sixth diffusion layer 111. The gate 128 is formed on side walls of the pillar-shaped semiconductor layer, a portion of the fifth diffusion layer 123, and a portion of the sixth diffusion layer 111 of the second PMOS load transistor 105 via a gate insulating film 117. The fourth NMOS driver transistor 106 and the second PMOS load transistor 105 are connected to each other via the gate 128. Further, the first diffusion layer 122, the fifth diffusion layer 123, and the third diffusion layer 124 are connected to one another via a silicide layer (not illustrated in the drawings).

In the drawings, an SOI substrate is used to electrically insulate the first diffusion layer 122, the fifth diffusion layer 123, and the third diffusion layer 124 from the substrate; however, any other method that can provide electrical insulation may be used. For example, a PN junction may be formed using a Si substrate and electrical insulation may be formed using the reverse bias state of the PN junction.

A contact 130 is formed on the gate 125, and a contact 137 is formed on the first diffusion layer 122 and the fifth diffusion layer 123. The contacts 130 and 137 are connected to each other via a metal 142. Further, a contact 139 is formed on the gate 128, and a contact 132 is formed on the fifth diffusion layer 120 and the first diffusion layer 121. The contacts 139 and 132 are connected to each other via a metal 144. A contact 131 is formed on the sixth diffusion layer 108, and a contact 138 is formed on the sixth diffusion layer 111. A metal 143 is connected to the contacts 131 and 138, and power is supplied.

A contact 129 is formed on the fourth diffusion layer 107, a metal 141 is formed, and power is supplied. A contact 140 is formed on the fourth diffusion layer 112, a metal 148 is formed, and power is supplied. A contact 133 is formed on the second diffusion layer 109, and a metal 145 is formed, which serves as a bit line. A contact 136 is formed on the second diffusion layer 110, and a metal 210 is formed, which serves as a bit line. A contact 134 is formed on the gate 126, and a metal 146 is formed, which serves as a word line. A contact 135 is formed on the gate 127, and a metal 147 is formed, which serves as a word line.

The plan view and the cross-sectional view of a static memory cell according to a second embodiment of the present invention are the same as those illustrated in FIG. 1. In the second embodiment, the length between the third diffusion layer 119 and the fourth diffusion layer 107 of the third NMOS driver transistor 101 is shorter than the length between the fifth diffusion layer 120 and the sixth diffusion layer 108 of the first PMOS load transistor 102. In an SRAM, a PMOS load transistor is formed with a minimum size and is formed so that the current driving force of the PMOS load transistor is smaller than the current driving force of an NMOS access transistor. That is, an NMOS access transistor and a PMOS load transistor are formed so as to have the same channel length. Therefore, in the present invention, the channel length of the NMOS driver transistor 101 is shorter than the channel length of the PMOS driver transistor 102.

Figure 2:
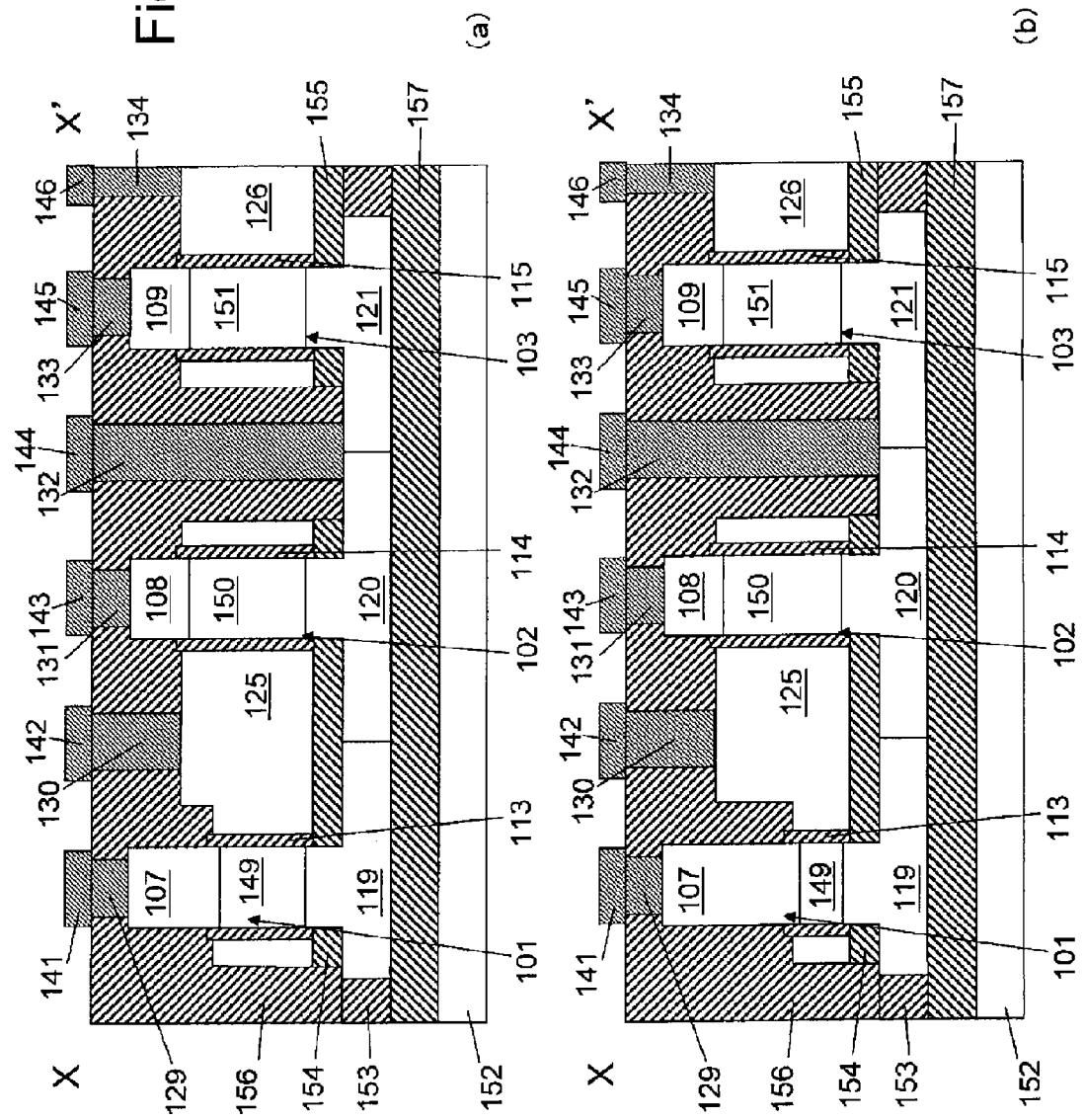
FIG. 2A is a cross-sectional view of a static memory cell according to third and fifth embodiments of the present invention.
FIG. 2B is a cross-sectional view of a static memory cell according to fourth and sixth embodiments of the present invention.

FIGS. 2A and 2B illustrate cross-sectional views of static memory cells according to third and fourth embodiments of the present invention, respectively. In FIG. 2A, the length between the upper end of the first diffusion layer 121 of the first NMOS access transistor 103 and the lower end of the second diffusion layer 109 of the first NMOS access transistor 103 is made 1.3 times the length between the upper end of the third diffusion layer 119 of the third NMOS driver transistor 101 and the lower end of the fourth diffusion layer 107 of the third NMOS driver transistor 101. In FIG. 2B, the length between the upper end of the first diffusion layer 121 of the first NMOS access transistor 103 and the lower end of the second diffusion layer 109 of the first NMOS access transistor 103 is made three times the length between the upper end of the third diffusion layer 119 of the third NMOS driver transistor 101 and the lower end of the fourth diffusion layer 107 of the third NMOS driver transistor 101. As the channel length of a driver transistor decreases, operational stability can be ensured, whereas if the channel length is short, the short-channel effects arise, which prevents the transistor from being cut off. Therefore, by way of example, the range from 1.3 times to three times, as described above, can ensure operational stability and can suppress or reduce short-channel effects, where the range may be selected as desired in accordance with the actual demand.

The cross-sectional views of static memory cells according to fifth and sixth embodiments of the present invention are the same as those in FIGS. 2A and 2B, respectively. In the fifth embodiment, the length between the upper end of the fifth diffusion layer 120 of the first PMOS load transistor 102 and the lower end of the sixth diffusion layer 108 of the first PMOS load transistor 102, is made 1.3 times the length between the upper end of the third diffusion layer 119 of the third NMOS driver transistor 101 and the lower end of the fourth diffusion layer 107 of the third NMOS driver transistor 101. In the sixth embodiment, the length between the upper end of the fifth diffusion layer 120 of the first PMOS load transistor 102 and the lower end of the sixth diffusion layer 108 of the first PMOS load transistor 102 is three times the length between the upper end of the third diffusion layer 119 of the third NMOS driver transistor 101 and the lower end of the fourth diffusion layer 107 of the third NMOS driver transistor 101. As the channel length of a driver transistor decreases, operational stability can be ensured, whereas if the channel length is short, the short-channel effects arise, which prevents the transistor from being cut off. Therefore, by way of example, the range from 1.3 times to three times, as described above, can ensure operational stability and can suppress or reduce short-channel effects, where the range may be selected as desired in accordance with the actual demand.

Figure 3:
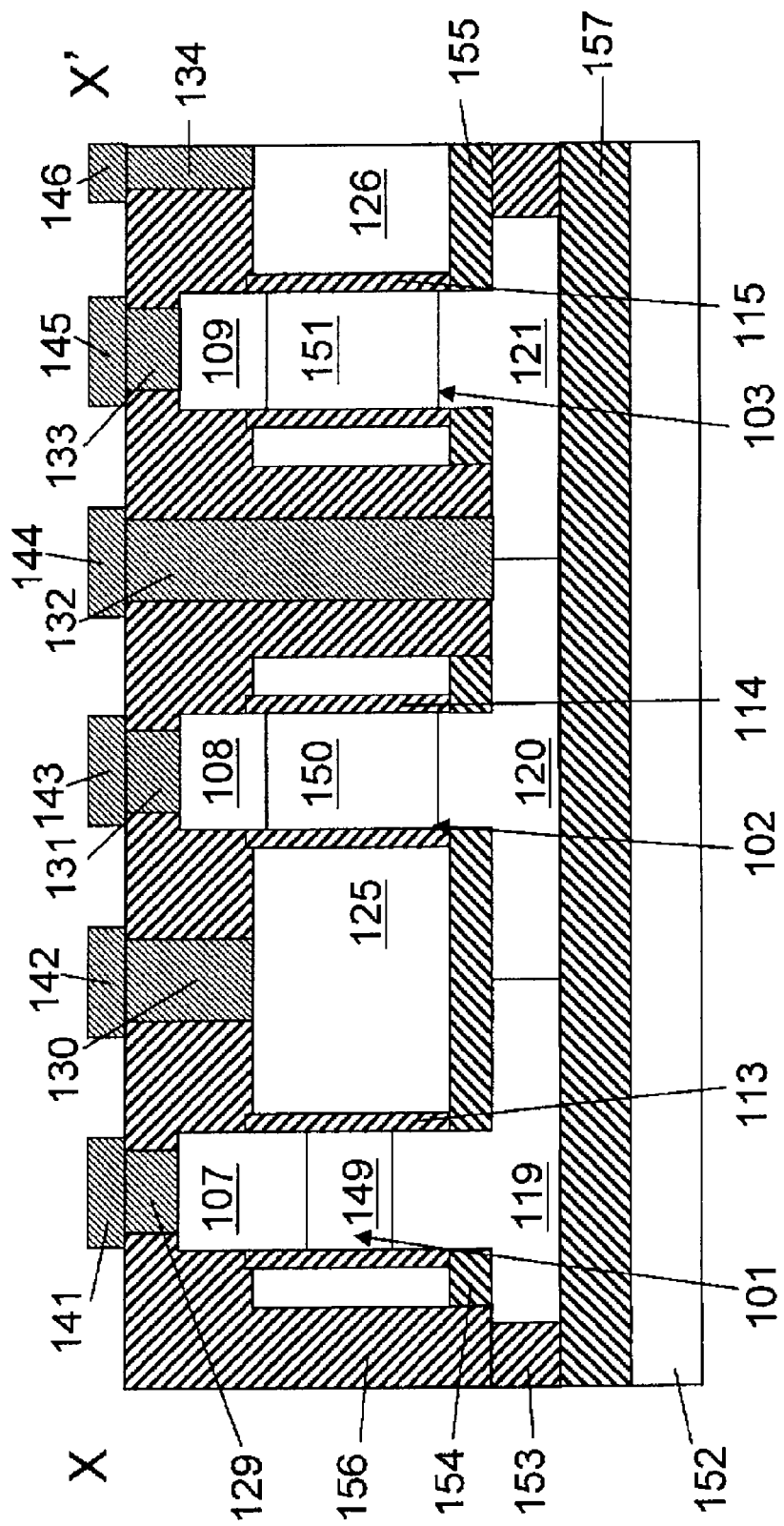
FIG. 3 is a cross-sectional view of a static memory cell according to a seventh embodiment of the present invention.

FIG. 3 illustrates a cross-sectional view of a static memory cell according to a seventh embodiment of the present invention. The physical gate lengths of the gates 125 and 126 are made the same. Since the lengths from the lower ends to the upper ends of the gates 125 and 126, that is, the physical gate lengths, are the same, the SGT production method described above can be used of forming a pillar-shaped semiconductor layer, depositing a gate conductive film on the pillar-shaped semiconductor layer, performing planarization, and then etching back the gate conductive film to obtain a desired length.

In general, reducing the channel length is equivalent to reducing the physical gate length, as in FIG. 1. If the physical gate length is reduced, the gate capacitance is reduced. If the gate capacitance is reduced, a soft error occurs, resulting in operational stability not being ensured. In FIG. 3, in contrast, the physical gate lengths are the same while only the channel length of a driver transistor is reduced. Therefore, the gate capacitance is not reduced although the current driving force of the driver transistor is doubled. That is, the current driving force of a driver transistor can be made double the current driving force of an access transistor, resulting in operational stability being ensured. In addition, the occurrence of soft errors can be avoided to ensure operational stability.

Figure 4:
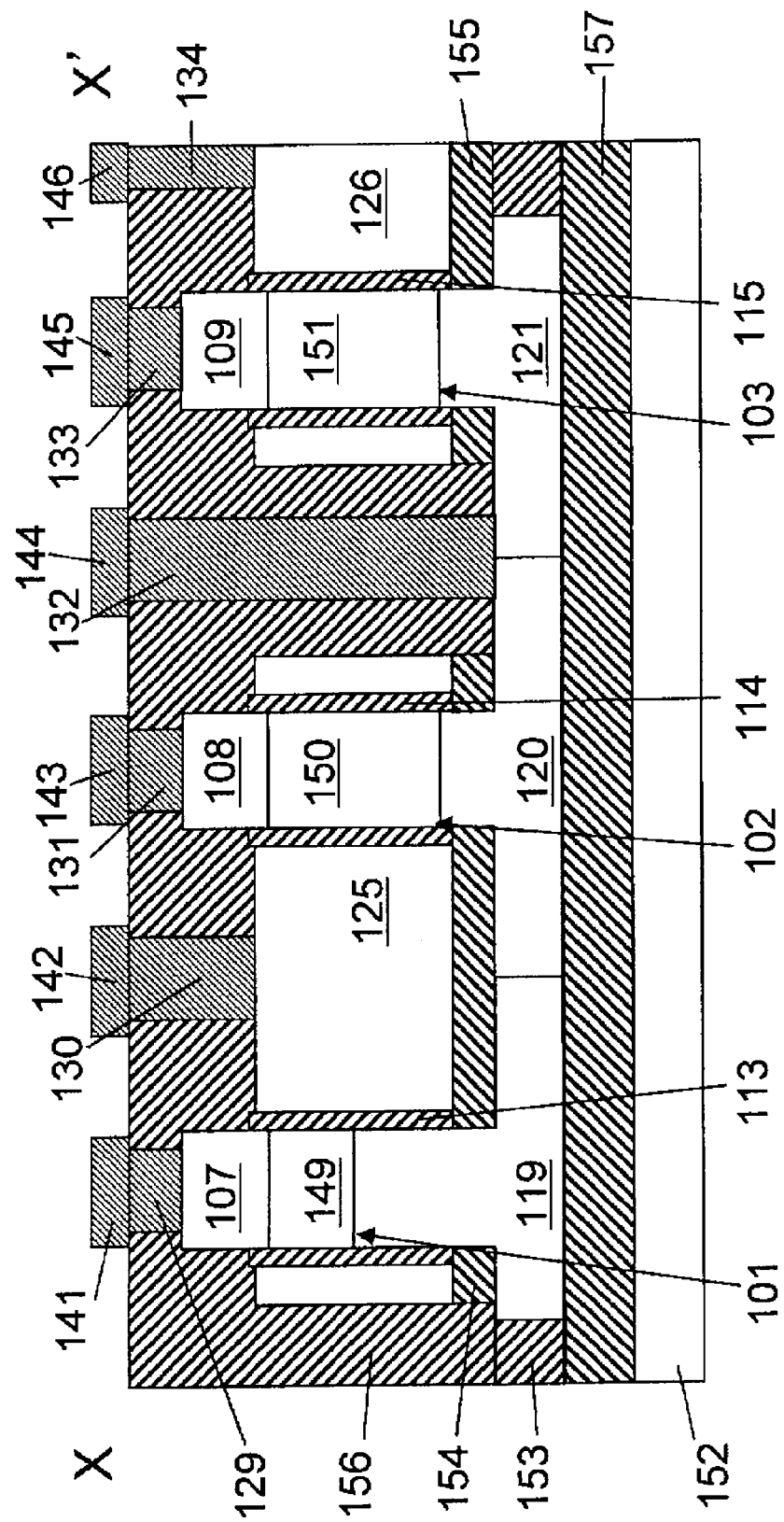
FIG. 4 is a cross-sectional view of a static memory cell according to an eighth embodiment of the present invention.

FIG. 4 illustrates a cross-sectional view of a static memory cell according to an eighth embodiment of the present invention. In the embodiment illustrated in FIG. 4, the physical gate lengths are the same, and the upper end of the third diffusion layer 119 of the third NMOS driver transistor 101 is at a higher portion than the upper end of the first diffusion layer 121 of the first NMOS access transistor 103. This enables the third NMOS driver transistor 101 to increase the overlap capacitance between the gate 125 and the third diffusion layer 119. During the cut-off of the third NMOS driver transistor 101, the overlap capacitance between the gate 125 and the third diffusion layer 119 becomes a parasitic capacitance parasitic to a storage node. Since the overlap capacitance is large, the occurrence of soft errors can further be avoided to ensure operational stability.

Figure 5:
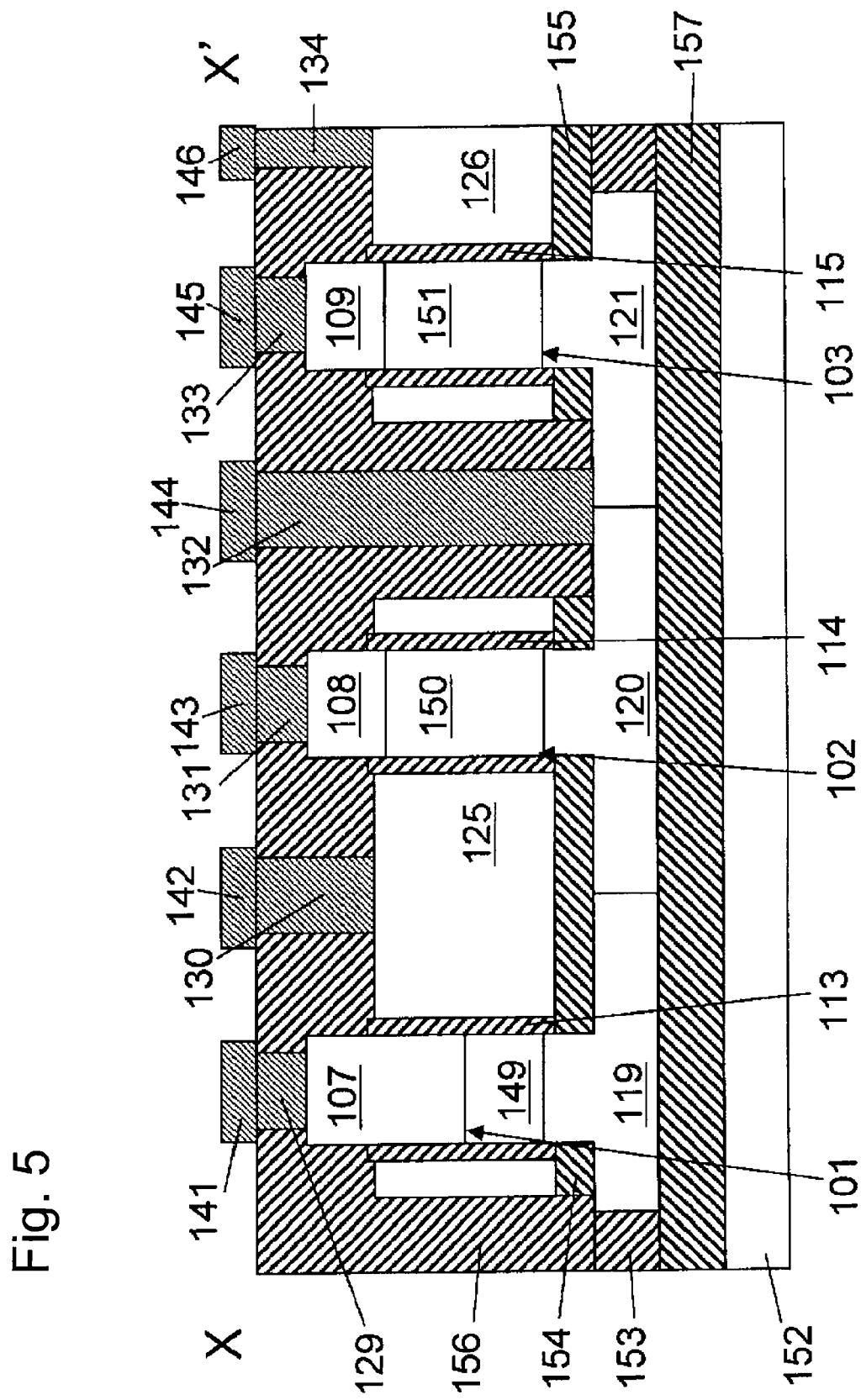
FIG. 5 is a cross-sectional view of a static memory cell according to a ninth embodiment of the present invention.

FIG. 5 illustrates a cross-sectional view of a static memory cell according to a ninth embodiment of the present invention. The difference between FIG. 5 and FIG. 4 is that the upper end of the third diffusion layer 119 of the third NMOS driver transistor 101 is positioned at the same height as the upper end of the first diffusion layer 121 of the first NMOS access transistor 103 and that the lower end of the fourth diffusion layer 107 of the third NMOS driver transistor 101 is at a position lower than the lower end of the second diffusion layer 109 of the first NMOS access transistor 103.

Also in the embodiment illustrated in FIG. 5, the physical gate lengths are the same while only the channel length of a driver transistor is reduced. Therefore, the gate capacitance is not reduced although the current driving force of the driver transistor is doubled. Thus, the current driving force of a driver transistor can be made double the current driving force of an access transistor, resulting in operational stability being ensured. In addition, the occurrence of soft errors can be avoided to ensure operational stability. However, further advantages illustrated in FIG. 4, that is, the advantages that during the cut-off of the third NMOS driver transistor 101, the overlap capacitance between the gate 125 and the third diffusion layer 119 becomes a parasitic capacitance parasitic to a storage node and that since the overlap capacitance is large, the occurrence of soft errors can be avoided to ensure operational stability, are not achievable. However, if a storage node is designed to be located above a transistor, the advantage of further avoiding the occurrence of soft errors can be achieved. As described below with respect to a production method, the creation of the configuration illustrated in FIG. 4 requires a comparatively long heat treatment to be performed after ion implantation for the third diffusion layer 119. When the fourth diffusion layer 107 is to be formed by ion implantation, the energy of the implantation is increased or phosphorus with a long diffusion length is used, thus enabling the lower end of the fourth diffusion layer 107 of the third NMOS driver transistor 101 to be at a position lower than the lower end of the second diffusion layer 109 of the first NMOS access transistor 103. That is, the duration of heat treatment can be shorter than that in FIG. 4.

Figure 6:
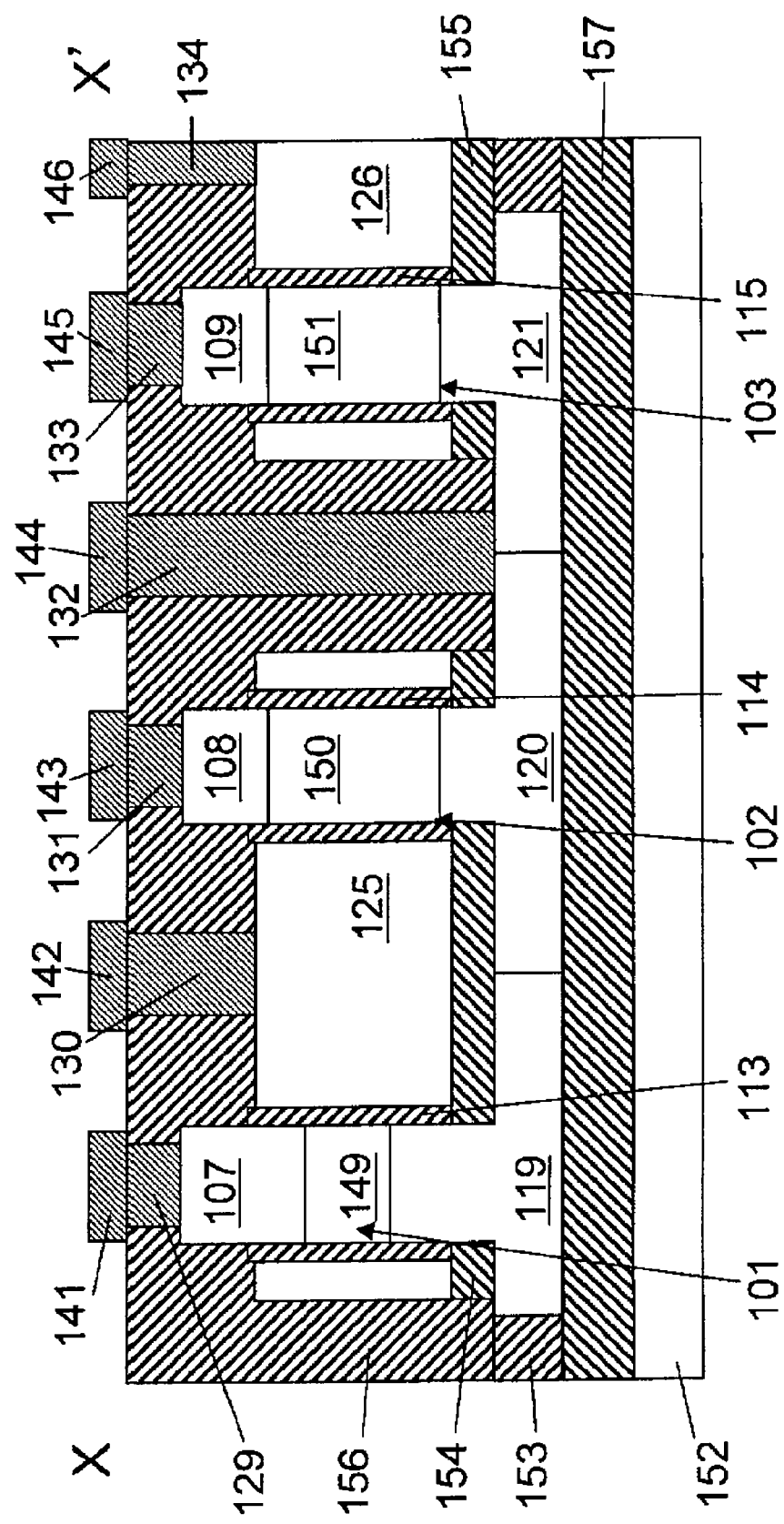
FIG. 6 is a cross-sectional view of a static memory cell according to a tenth embodiment of the present invention.

FIG. 6 illustrates a cross-sectional view of a static memory cell according to a tenth embodiment of the present invention. The difference between FIG. 6 and FIG. 4 is that the upper end of the third diffusion layer 119 of the third NMOS driver transistor 101 is at a position higher than the upper end of the first diffusion layer 121 of the first NMOS access transistor 103 and that the lower end of the fourth diffusion layer 107 of the third NMOS driver transistor 101 is at a position lower than the lower end of the second diffusion layer 109 of the first NMOS access transistor 103.

Also in the embodiment illustrated in FIG. 6, the channel length of a driver transistor is made shorter than the channel length of an access transistor, thus enabling operational stability to be ensured. Additionally, an advantage illustrated in FIG. 4, that is, the advantage of avoiding the occurrence of soft errors, can also be achieved. Since the diffusion length of the third diffusion layer 119 is short, the duration of heat treatment shorter than that required to create the configuration illustrated in FIG. 4 is required for formation. When the fourth diffusion layer 107 is to be formed by ion implantation, the energy of the implantation is increased or phosphorus with a diffusion length is used, thus enabling the lower end of the fourth diffusion layer 107 of the third NMOS driver transistor 101 to be at a position lower than the lower end of the second diffusion layer 109 of the first NMOS access transistor 103. That is, the duration of heat treatment can be shorter than that required in FIG. 4, and the occurrence of soft errors can also be avoided. However, a larger number of steps in the production process than that required to create the configuration illustrated in FIG. 4 or the configuration illustrated in FIG. 5 are required. While various embodiments have been illustrated, any of them may be selected as desired in accordance with the actual demand.

An example of a production process for forming the structure of the static memory cell illustrated in FIG. 4 according to an embodiment of the present invention will be described with reference to FIGS. 7 to 32.

Figure 7:
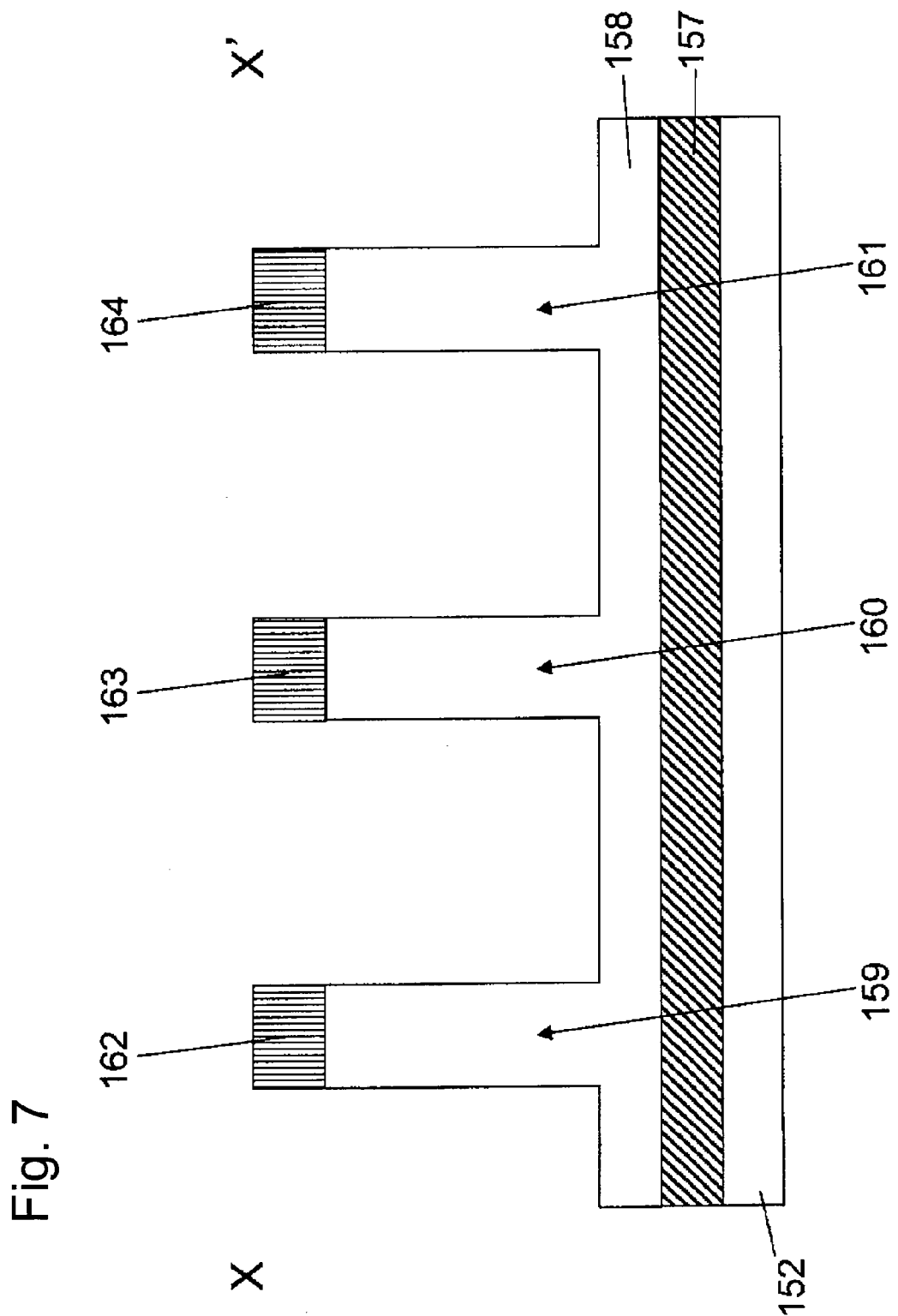
FIG. 7 is a cross-sectional view explaining a method for fabricating a static memory cell according to an embodiment of the present invention.

FIG. 7 illustrates a state where an oxide film 157 is formed on a silicon layer 152, a planar silicon layer 158 is formed on the oxide film 157, and pillar-shaped silicon layers 159, 160, and 161 having nitride film hard masks 162, 163, and 164 in upper portions thereof are formed.

Figure 8:
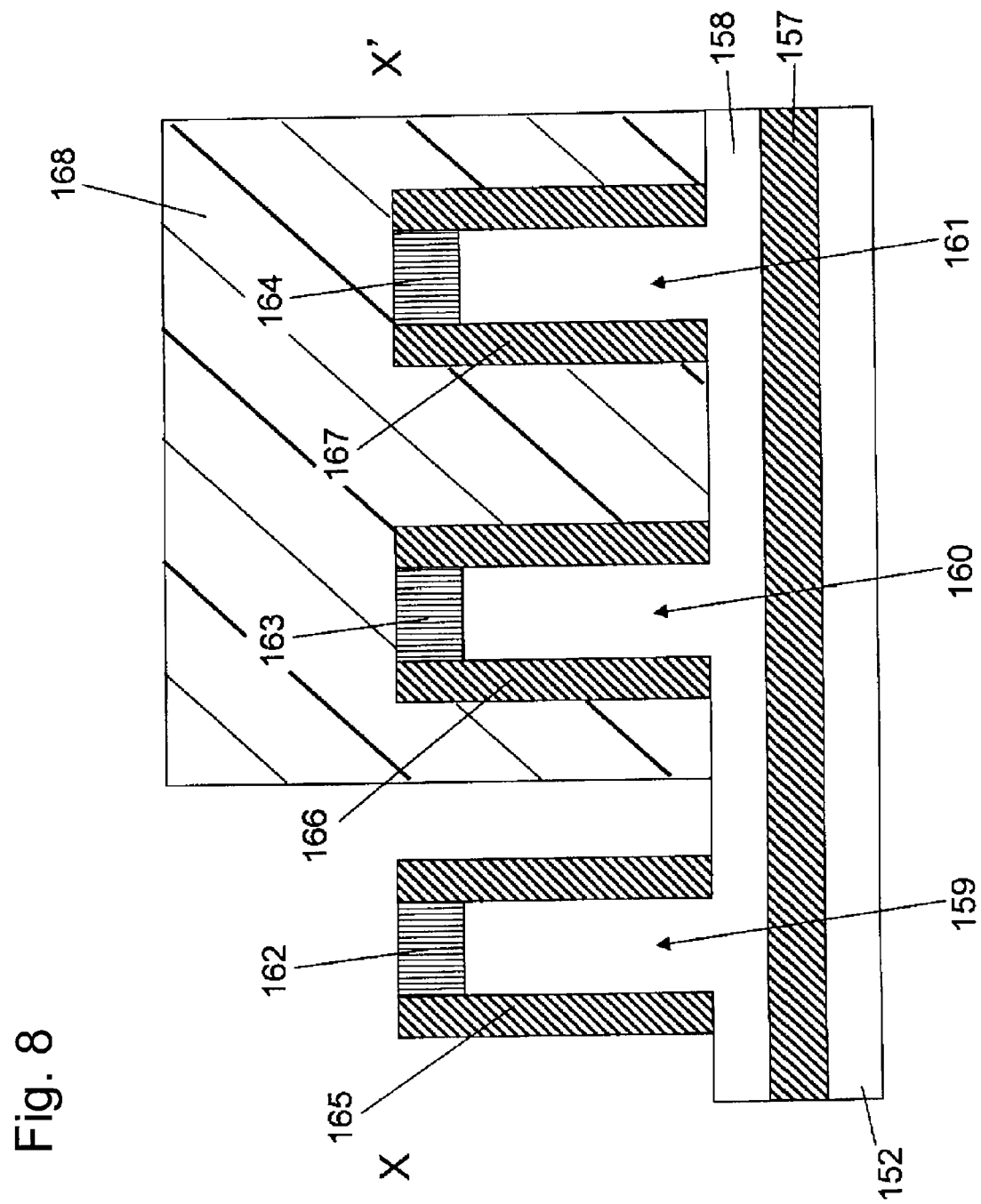
FIG. 8 is a cross-sectional view explaining the method for fabricating a static memory cell according to the embodiment of the present invention.

In the state illustrated in FIG. 7, an oxide film is deposited and is etched back to form oxide film sidewalls 165, 166, and 167, as illustrated in FIG. 8. After that, a resist 168 for forming a third diffusion layer 119 is formed.

Figure 9:
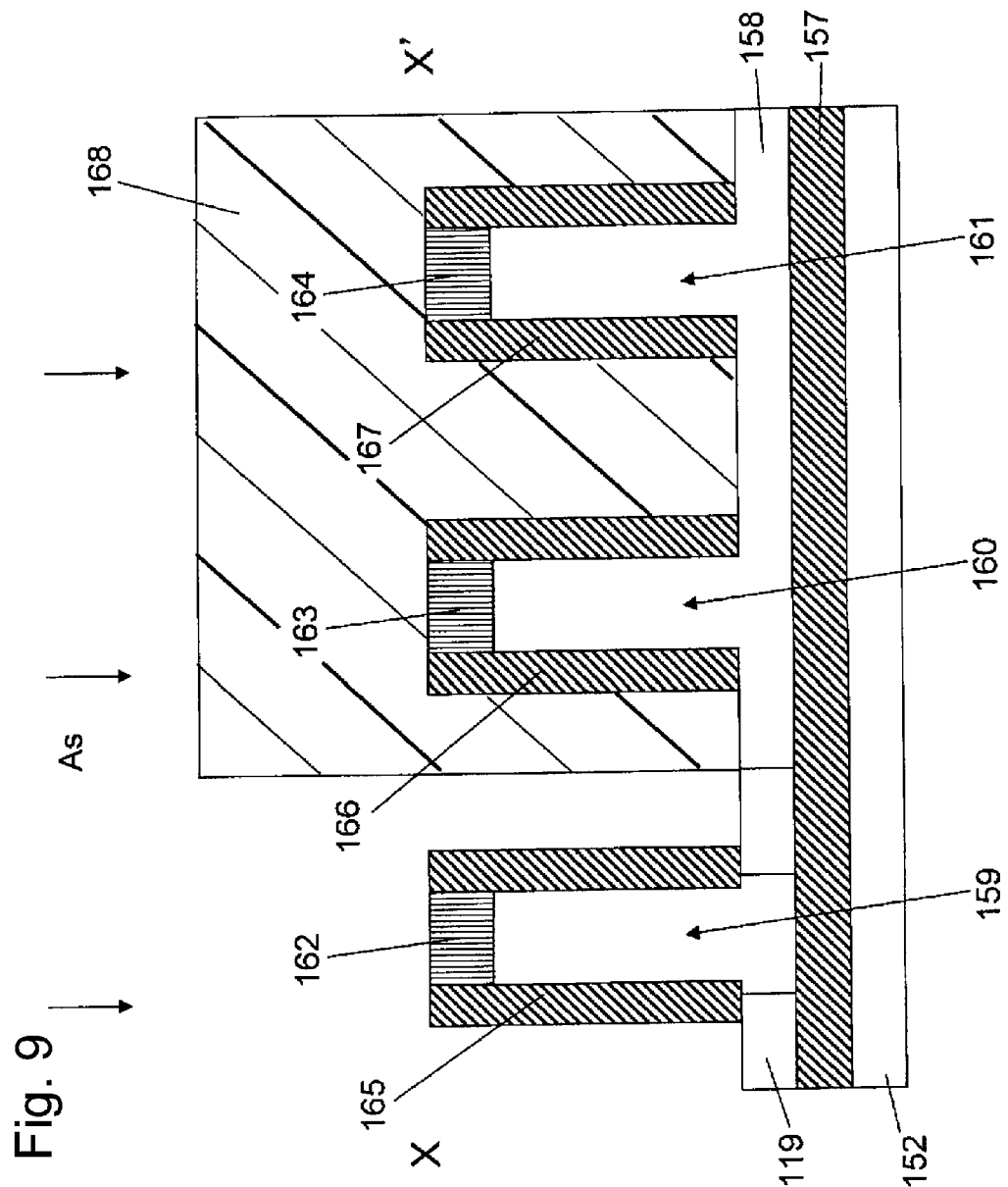
FIG. 9 is a cross-sectional view explaining the method for fabricating a static memory cell according to the embodiment of the present invention.

In this state, as illustrated in FIG. 9, arsenic is implanted to form the third diffusion layer 119.

Figure 10:
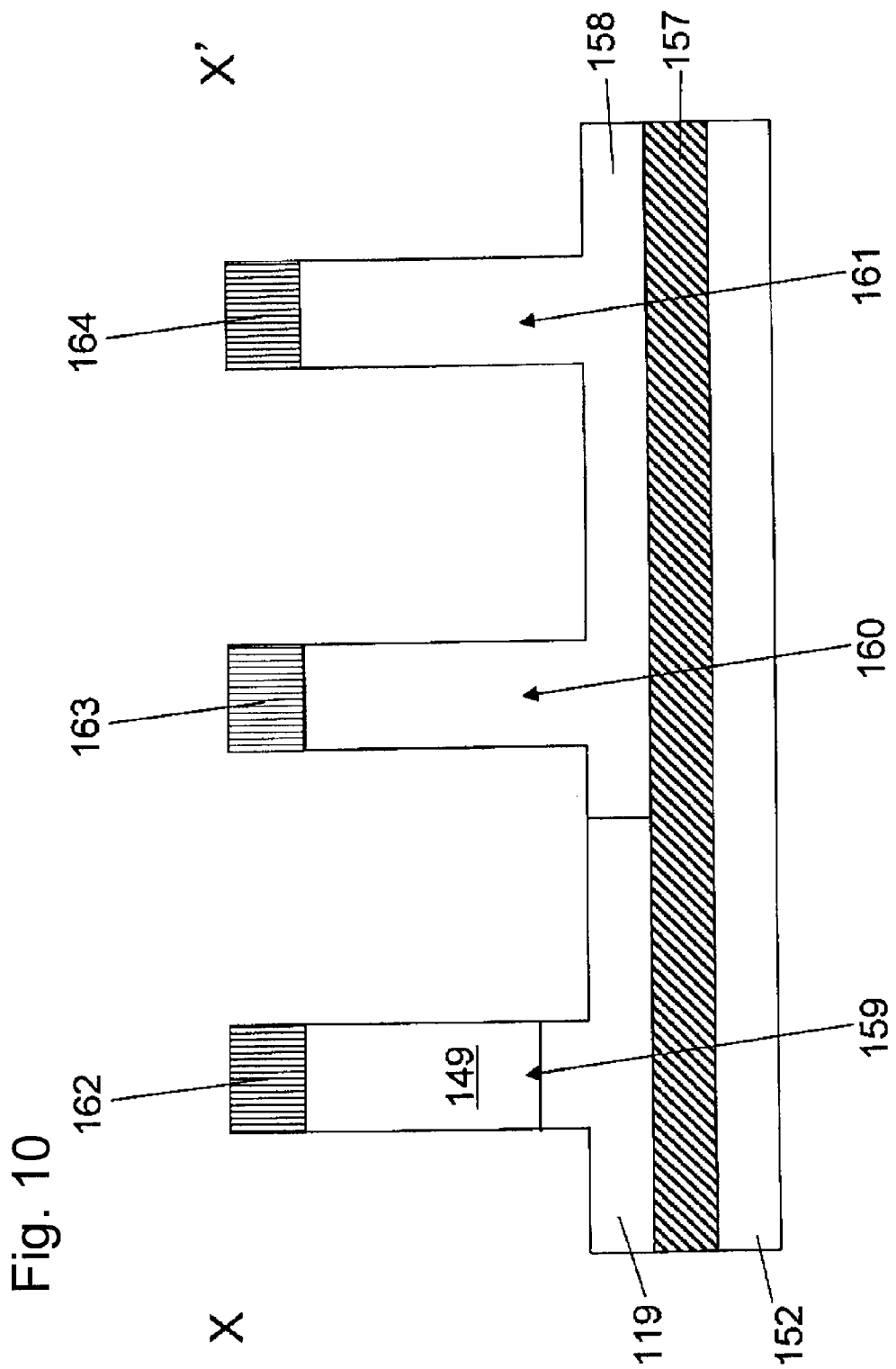
FIG. 10 is a cross-sectional view explaining the method for fabricating a static memory cell according to the embodiment of the present invention.

After that, as illustrated in FIG. 10, the resist 168 is stripped, the oxide film sidewalls 165, 166, and 167 are stripped, and the first heat treatment is carried out.

Figure 11:
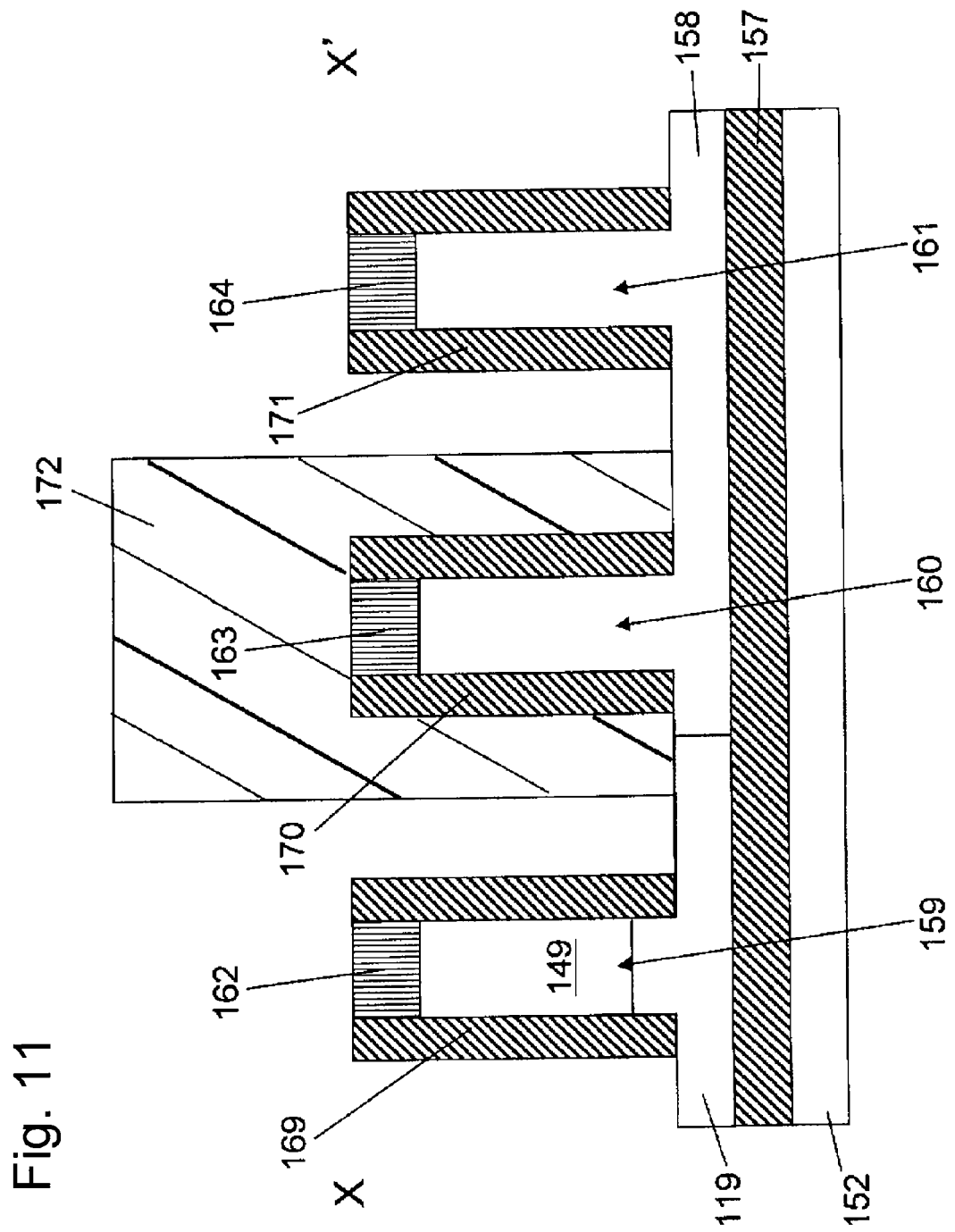
FIG. 11 is a cross-sectional view explaining the method for fabricating of a static memory cell according to the embodiment of the present invention.

Further, as illustrated in FIG. 11, oxide film sidewalls 169, 170, and 171 are formed. After that, a resist 172 for forming a first diffusion layer 121 is formed.

Figure 12:
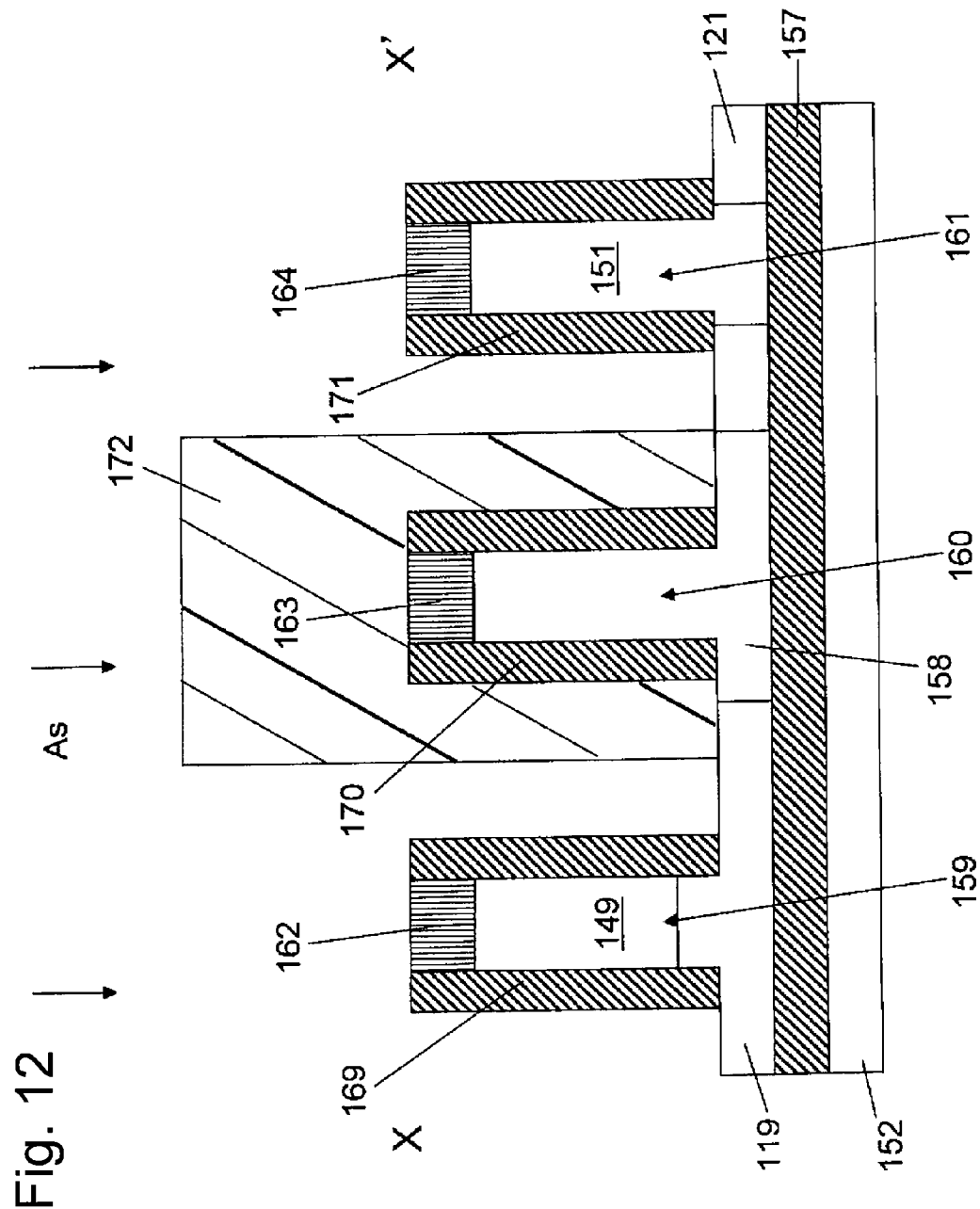
FIG. 12 is a cross-sectional view explaining the method for fabricating a static memory cell according to the embodiment of the present invention.

In this state, as illustrated in FIG. 12, arsenic is implanted to form the first diffusion layer 121.

Figure 13:
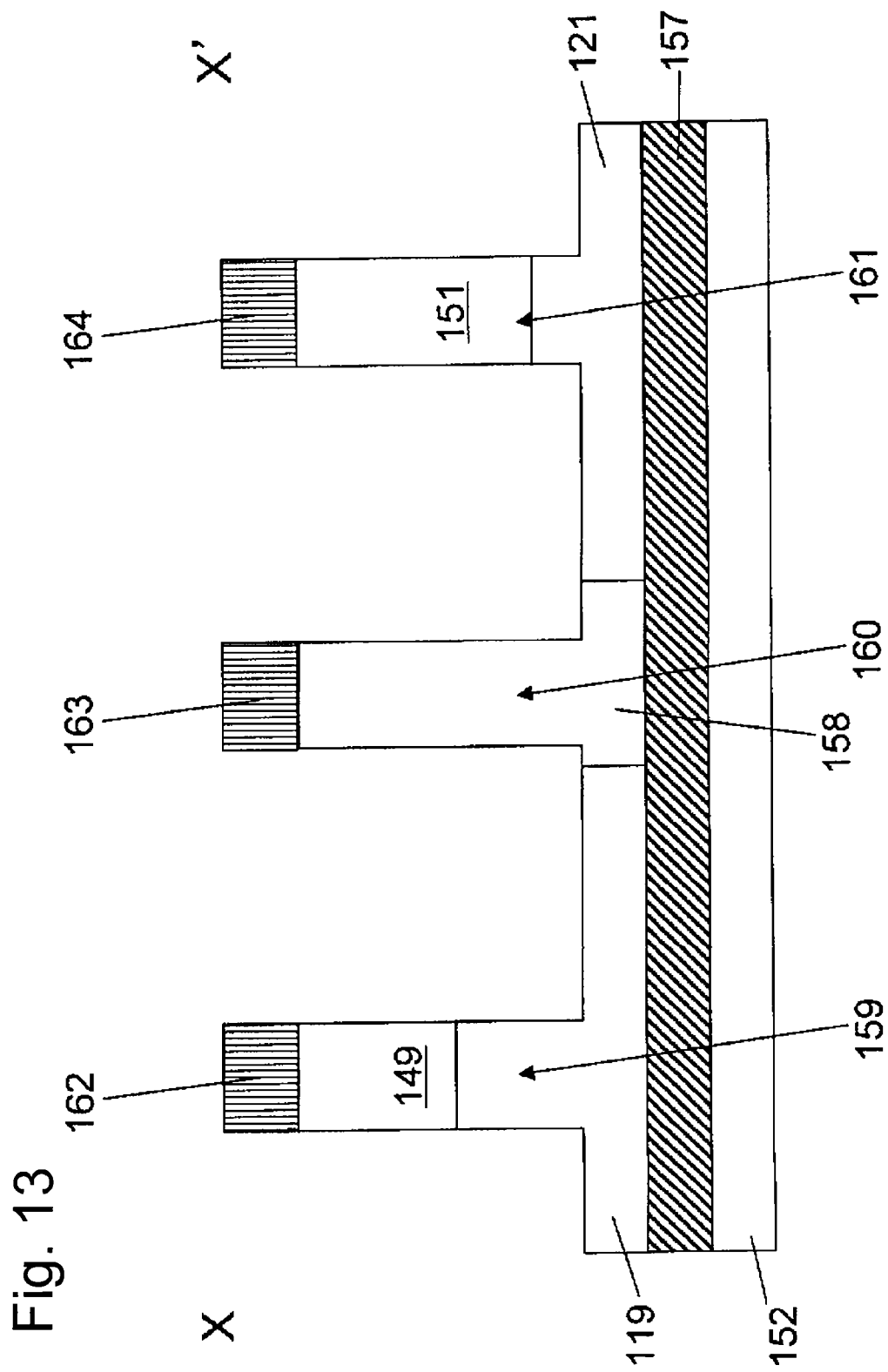
FIG. 13 is a cross-sectional view explaining the method for fabricating a static memory cell according to the embodiment of the present invention.

After that, as illustrated in FIG. 13, the resist 172 is stripped, the oxide film sidewalls 169, 170, and 171 are stripped, and the second heat treatment is carried out. Since the third diffusion layer 119 undergoes heat treatment twice, the upper end of the third diffusion layer 119 is made to be at a position higher than the upper end of the first diffusion layer 121. Therefore, the channel length of a driver transistor is made shorter than the channel length of an access transistor, and operational stability can be ensured.

Figure 14:
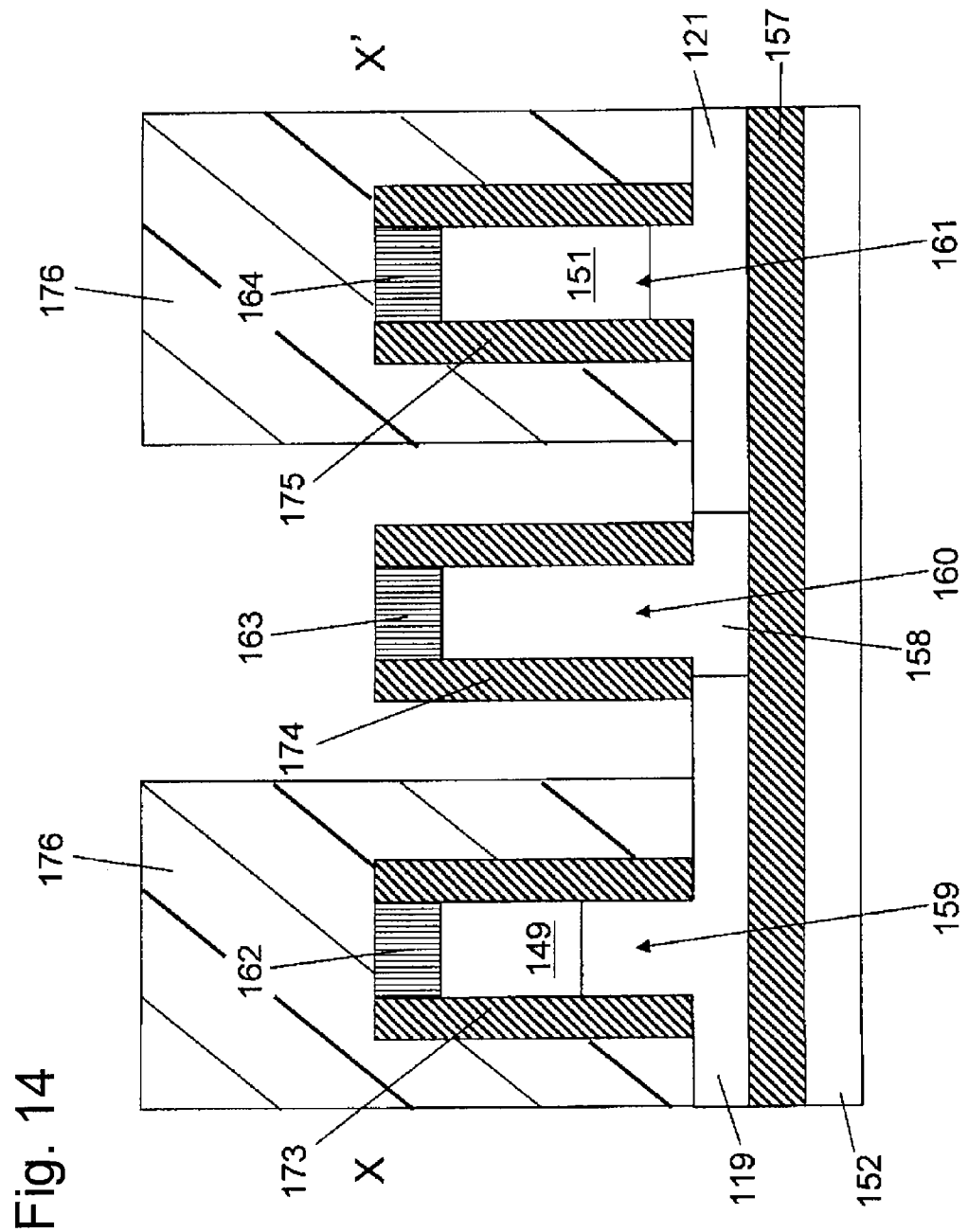
FIG. 14 is a cross-sectional view explaining the method for fabricating a static memory cell according to the embodiment of the present invention.

Subsequently, as illustrated in FIG. 14, oxide film sidewalls 173, 174, and 175 are formed. After that, a resist 176 for forming a fifth diffusion layer 120 is formed.

Figure 15:
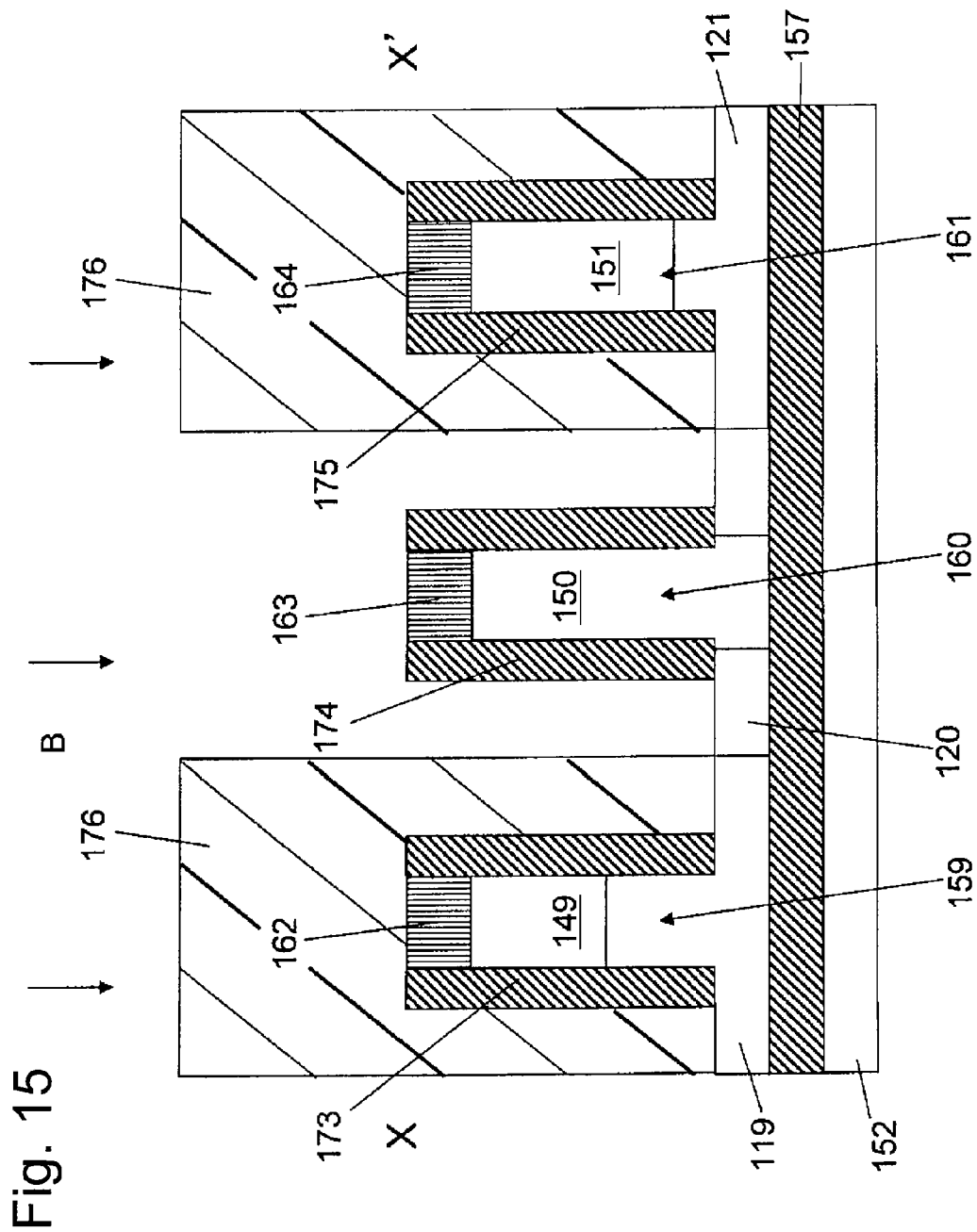
FIG. 15 is a cross-sectional view explaining the method for fabricating a static memory cell according to the embodiment of the present invention.

In this state, as illustrated in FIG. 15, boron is implanted to form the fifth diffusion layer 120.

Figure 16:
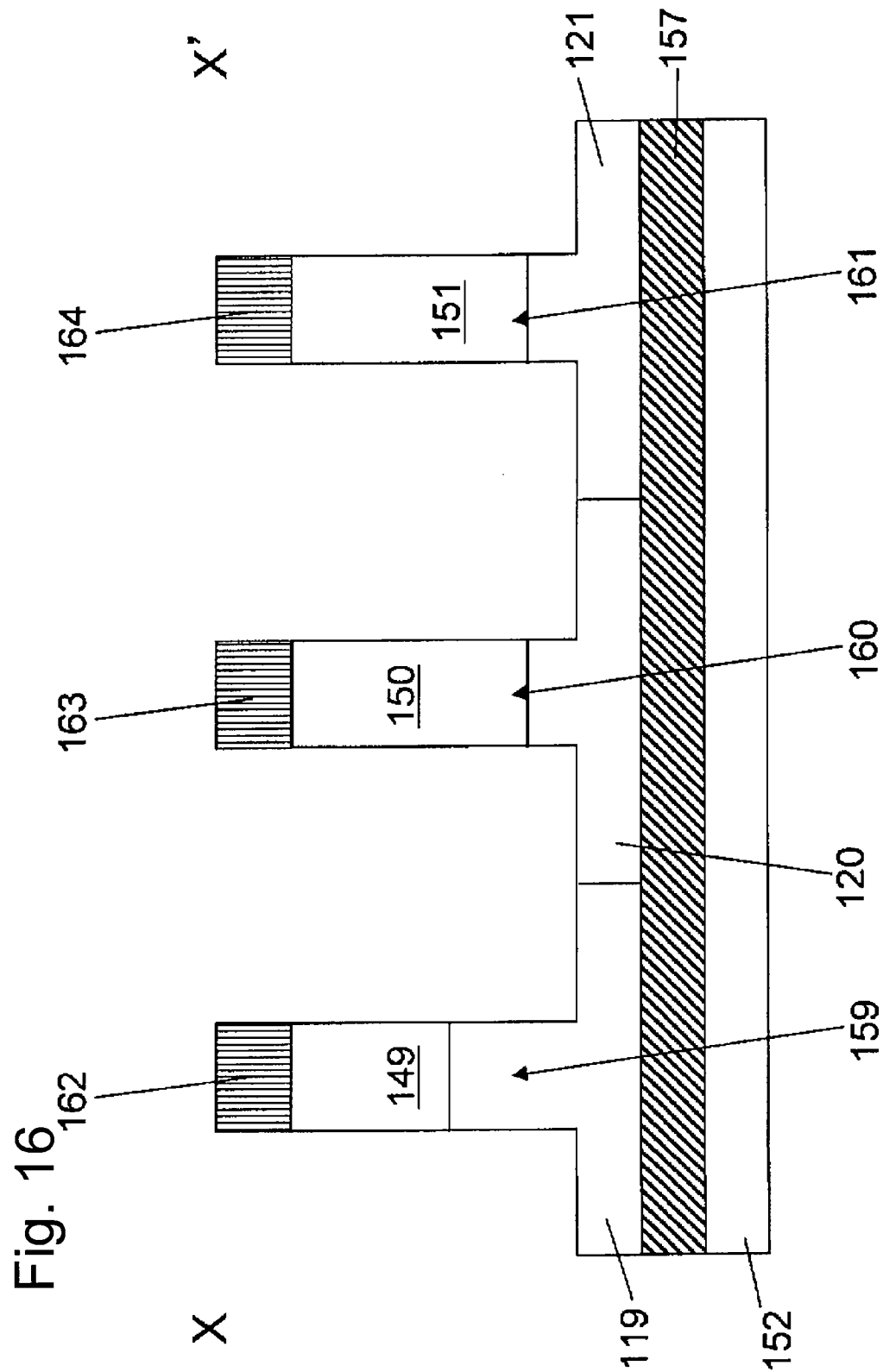
FIG. 16 is a cross-sectional view explaining the method for fabricating a static memory cell according to the embodiment of the present invention.

After the above state, as illustrated in FIG. 16, the resist 176 is stripped, the oxide film sidewalls 173, 174, and 175 are stripped, and heat treatment is carried out.

Figure 17:
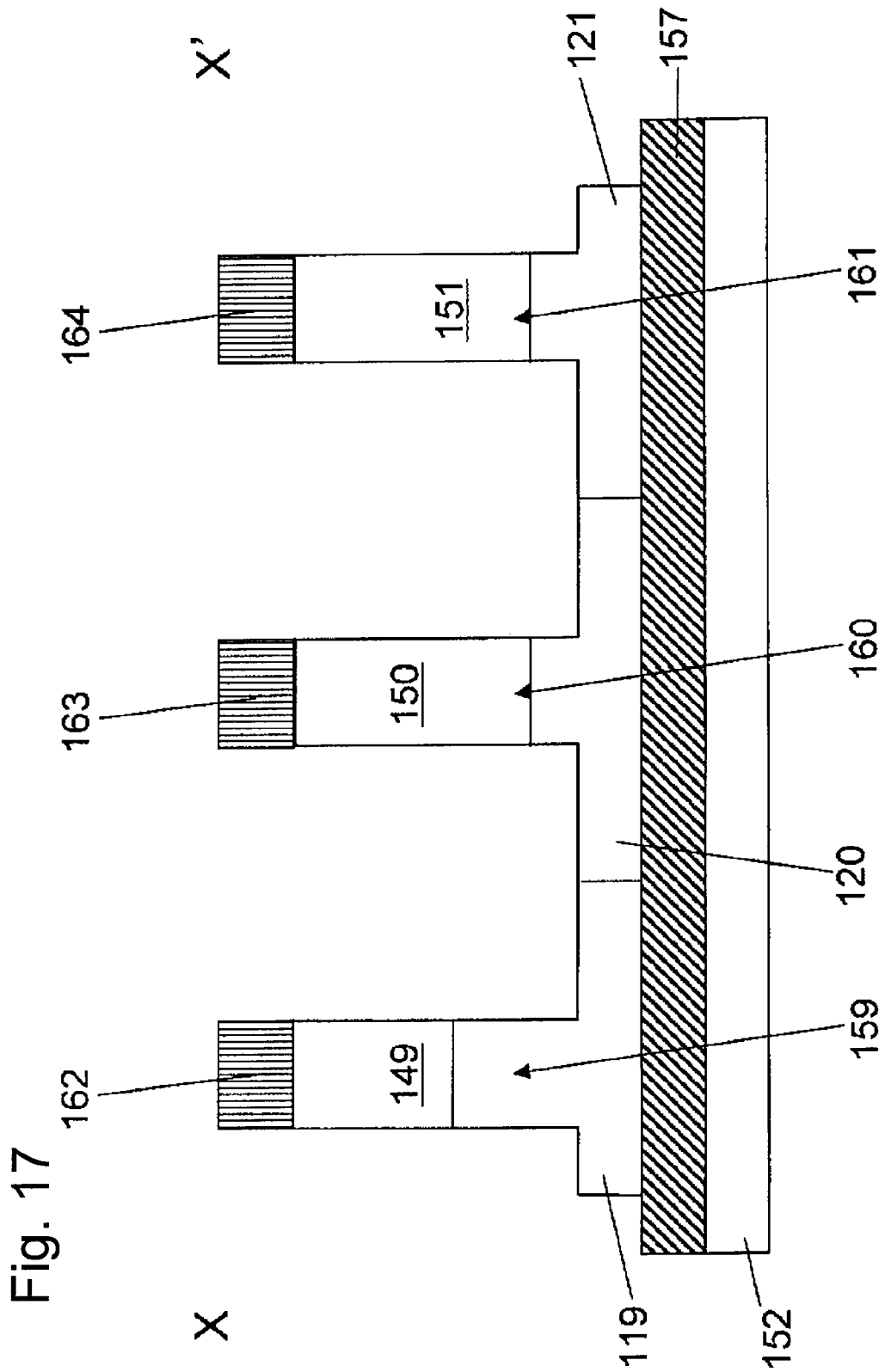
FIG. 17 is a cross-sectional view explaining the method for fabricating a static memory cell according to the embodiment of the present invention.

After that, as illustrated in FIG. 17, a resist for forming elements separately is formed, silicon etching is performed, and the resist is stripped.

Figure 18:
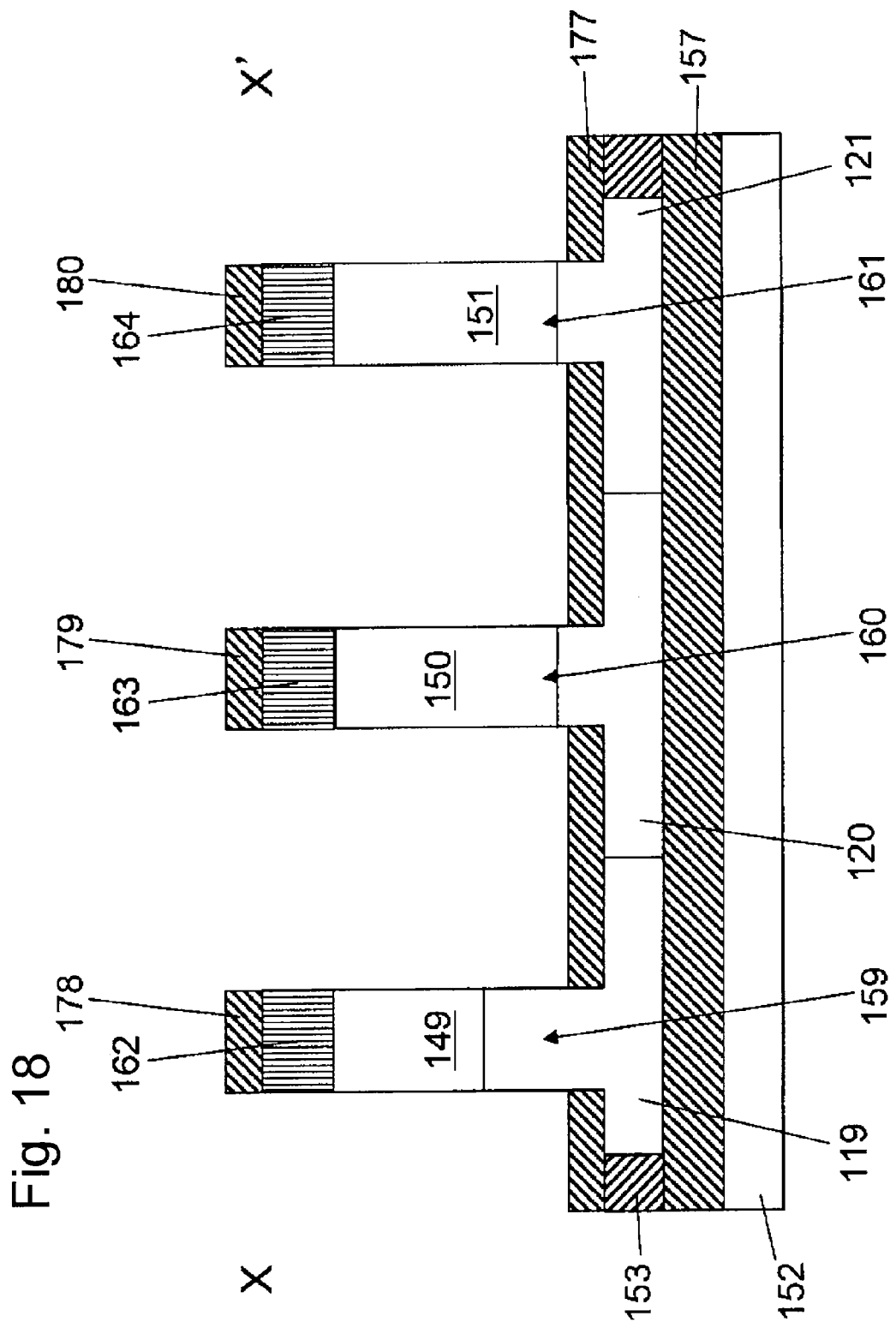
FIG. 18 is a cross-sectional view explaining the method for fabricating a static memory cell according to the embodiment of the present invention.

Subsequently, as illustrated in FIG. 18, an oxide film 153 is formed so as to be buried in spaces between the elements. After that, an atmospheric pressure chemical vapor deposition (CVD) oxide film is deposited and is etched back to form an oxide film 177. In this case, oxide films 178, 179, and 180 remain on the nitride film hard masks 162, 163, and 164, respectively.

Figure 19:
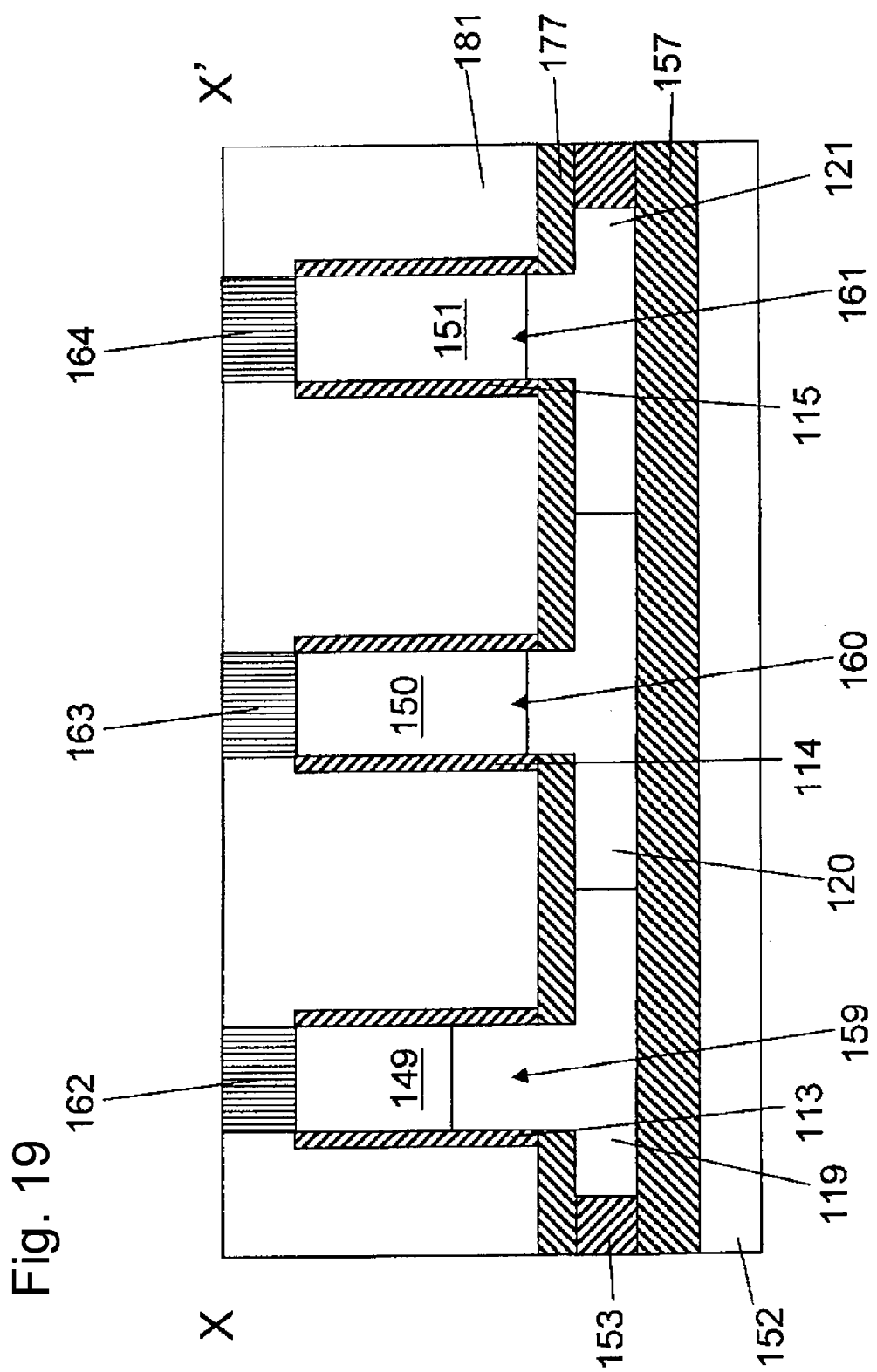
FIG. 19 is a cross-sectional view explaining the method for fabricating a static memory cell according to the embodiment of the present invention.

Further, as illustrated in FIG. 19, gate insulating films 113, 114, and 115 are formed, a gate conductive film 181 is deposited, and planarization is performed. After the oxide films 178, 179, and 180 are exposed, the oxide films 178, 179, and 180 are etched, and planarization is further performed using the nitride film hard masks 162, 163, and 164 as stoppers. Each of the gate insulating films 113, 114, and 115 is one of an oxide film, a nitride film, an oxynitride film, and a high-dielectric film. The gate conductive film 181 is one of a polysilicon film, a metal/polysilicon laminated film, and a metal film.

Figure 20:
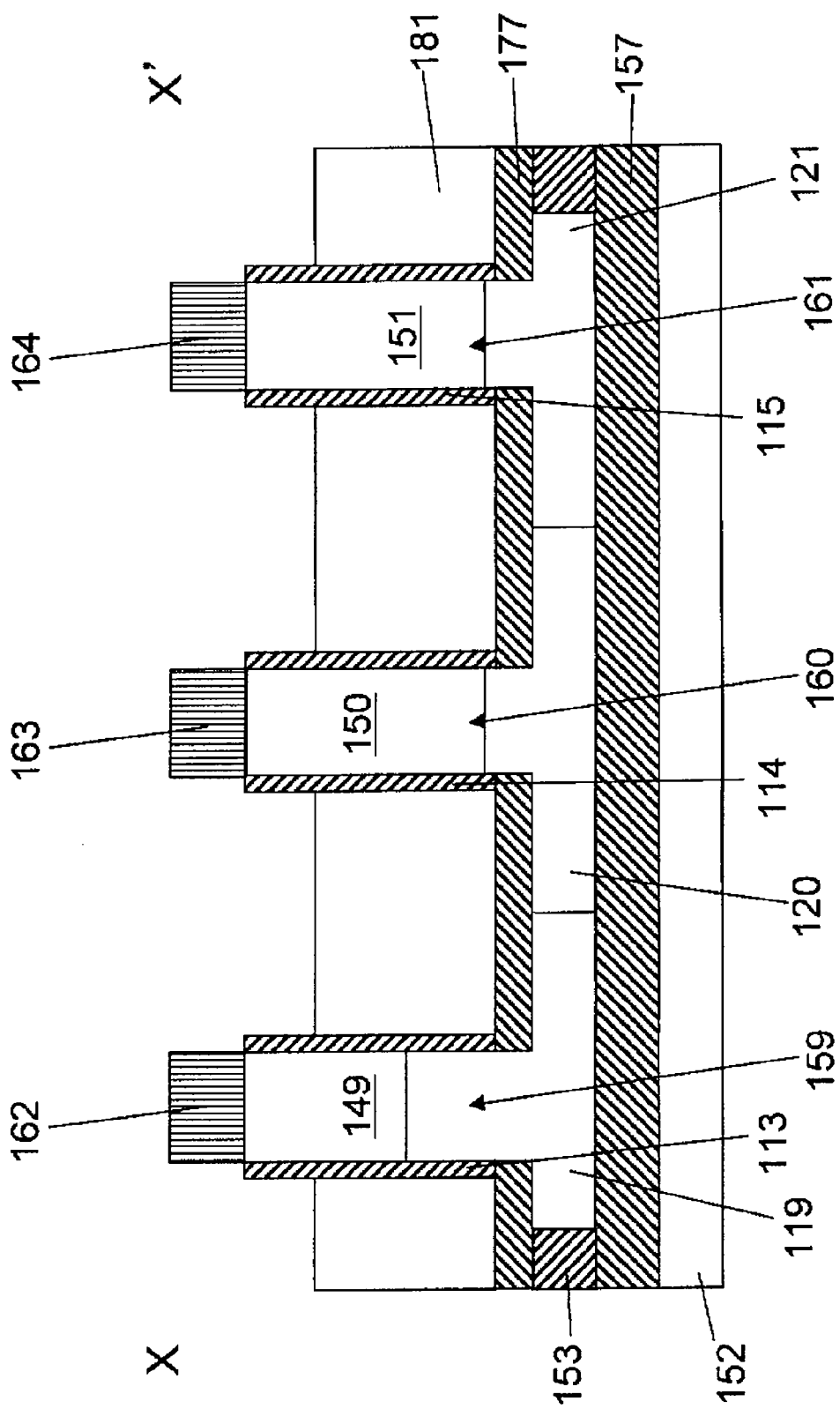
FIG. 20 is a cross-sectional view explaining the method for fabricating a static memory cell according to the embodiment of the present invention.

Subsequently, as illustrated in FIG. 20, the gate conductive film 181 is etched back to obtain a desired physical gate length. Consequently, the physical gate length is made uniform over all the transistors.

Figure 21:
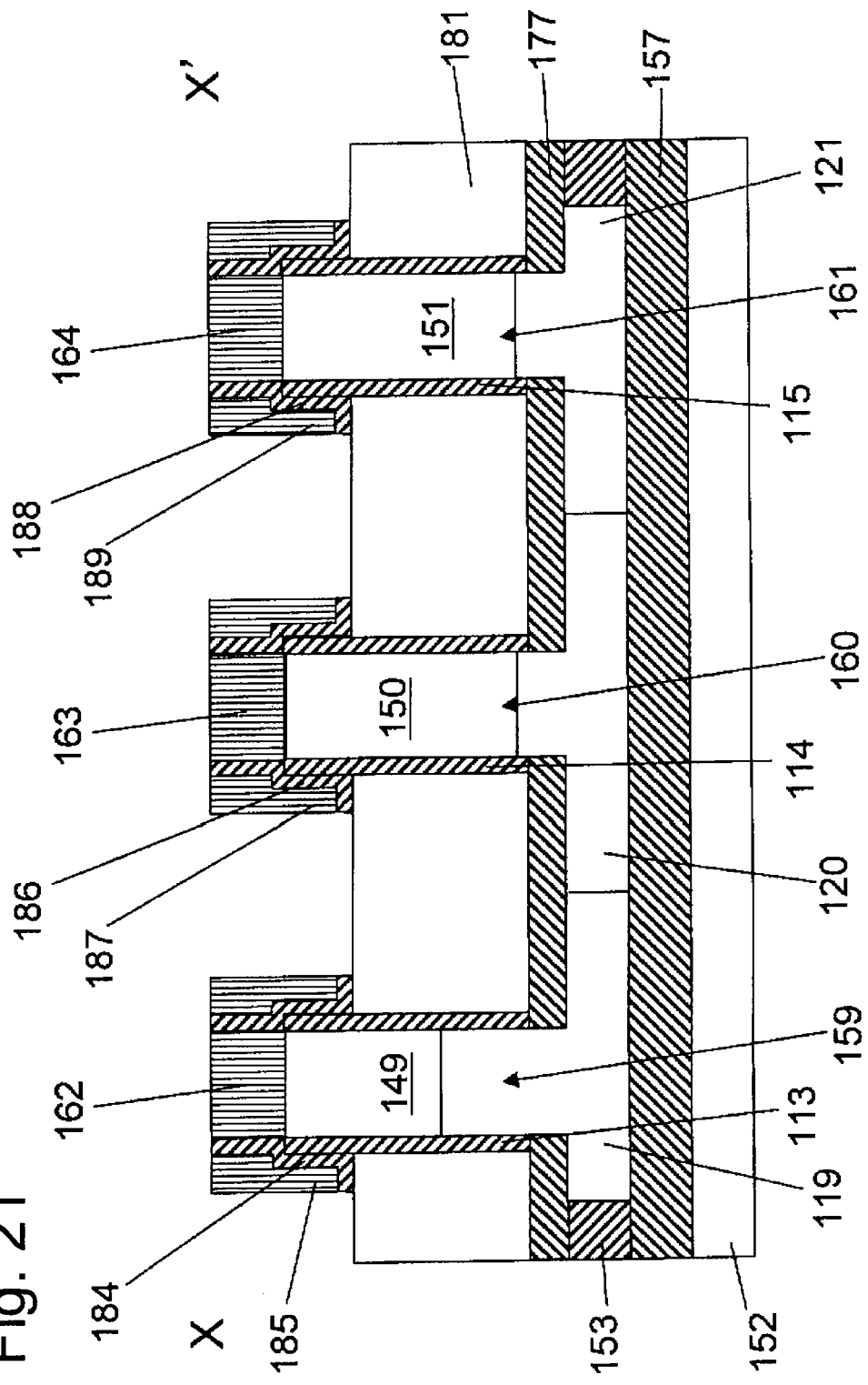
FIG. 21 is a cross-sectional view explaining the method for fabricating a static memory cell according to the embodiment of the present invention.

Then, an oxide film is deposited, a nitride film is deposited, and etching is performed to make the oxide film and the nitride film remain as sidewalls. As illustrated in FIG. 21, an insulating film sidewall composed of an oxide film 184 and a nitride film 185, an insulating film sidewall composed of an oxide film 186 and a nitride film 187, and an insulating film sidewall composed of an oxide film 188 and a nitride film 189 are formed.

Figure 22:
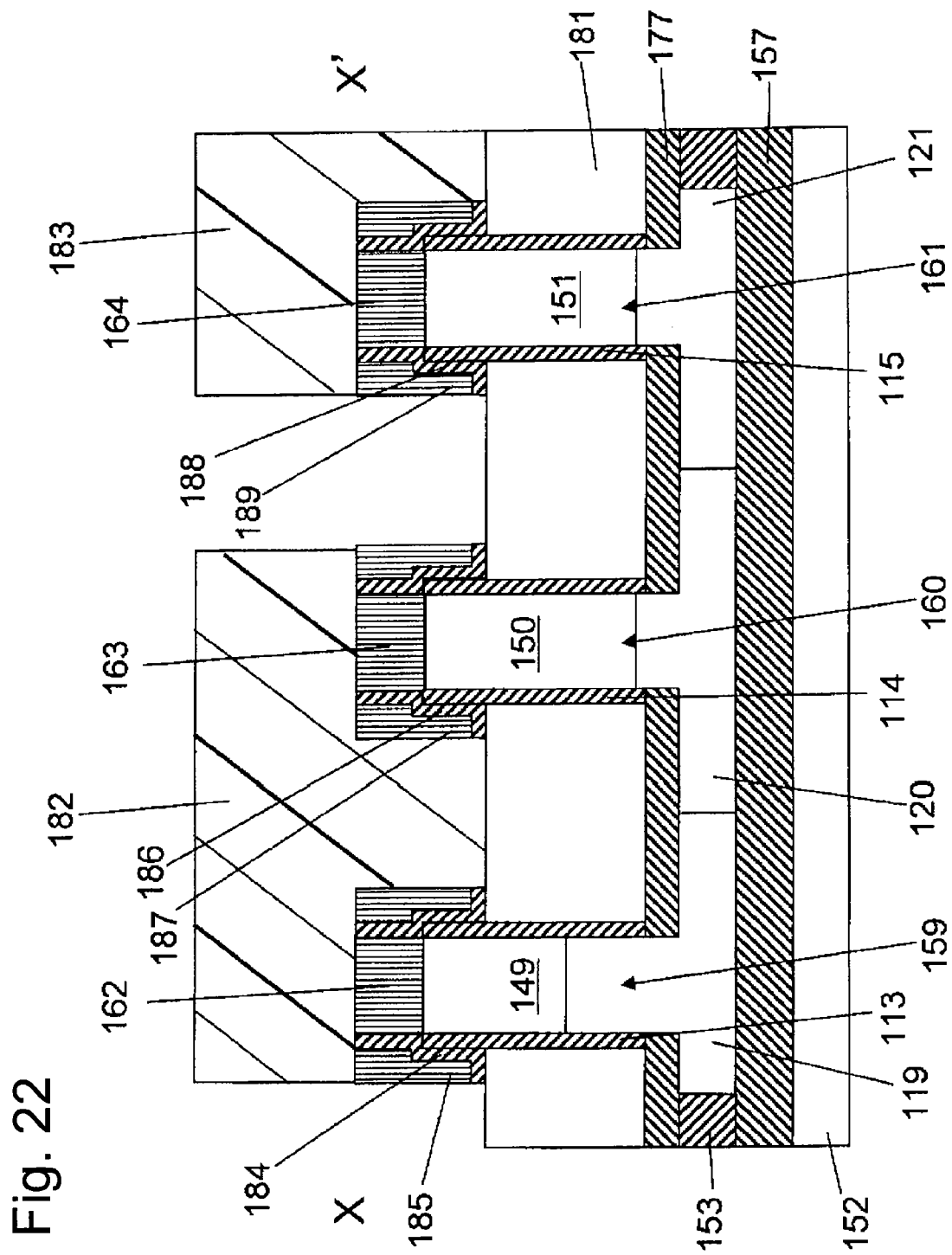
FIG. 22 is a cross-sectional view explaining the method for fabricating a static memory cell according to the embodiment of the present invention.

Subsequently, as illustrated in FIG. 22, resists 182 and 183 for performing gate etching are formed.

Figure 23:
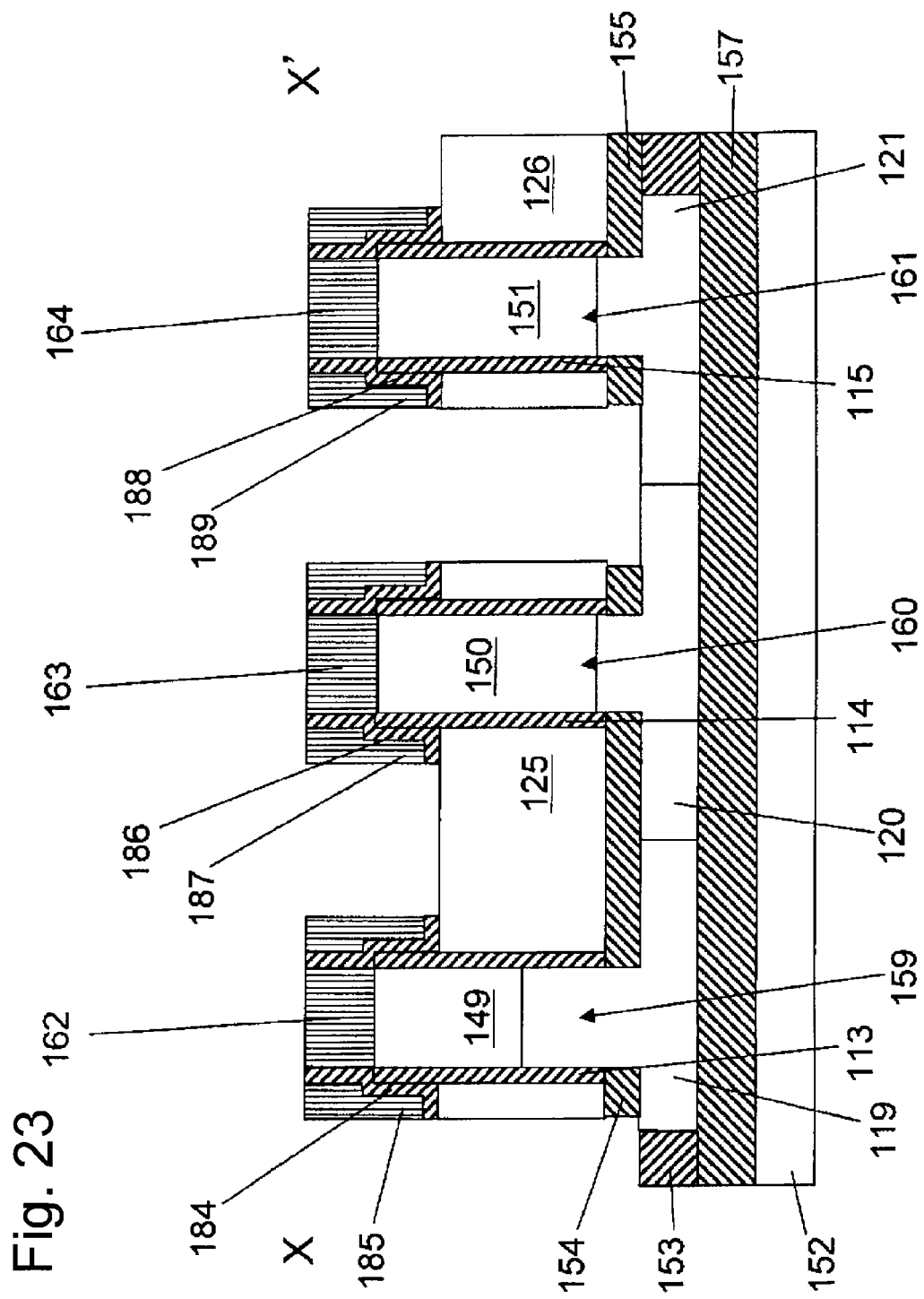
FIG. 23 is a cross-sectional view explaining the method for fabricating a static memory cell according to the embodiment of the present invention.

Then, as illustrated in FIG. 23, the gate conductive film 181 is etched to from gates 125 and 126, and the oxide film 177 is etched to form oxide films 154 and 155. Then, the resists 182 and 183 are stripped.

Figure 24:
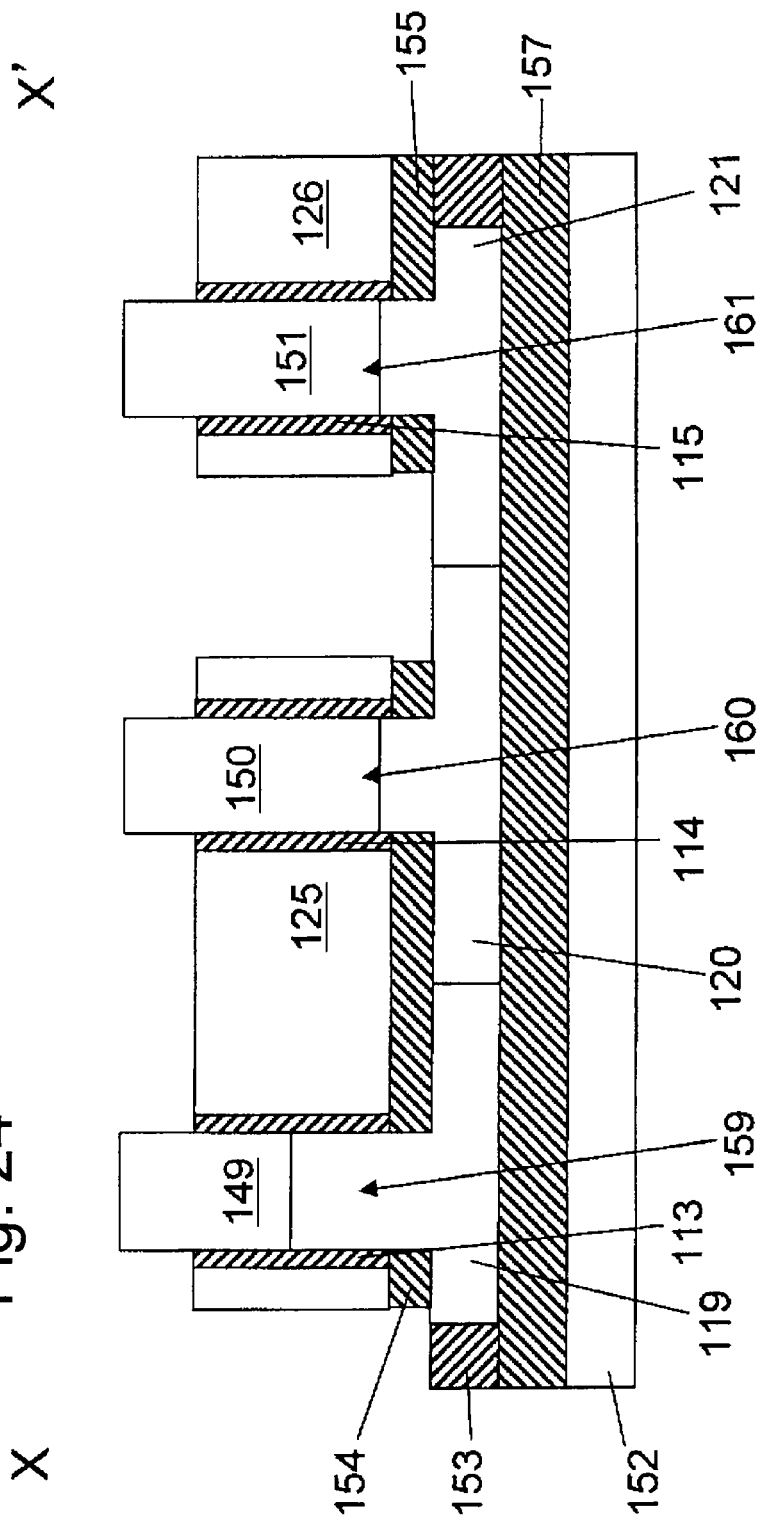
FIG. 24 is a cross-sectional view explaining the method for fabricating a static memory cell according to the embodiment of the present invention.

Subsequently, as illustrated in FIG. 24, the insulating film sidewall composed of the oxide film 184 and the nitride film 185, the insulating film sidewall composed of the oxide film 186 and the nitride film 187, and the insulating film sidewall composed of the oxide film 188 and the nitride film 189 are etched.

Figure 25:
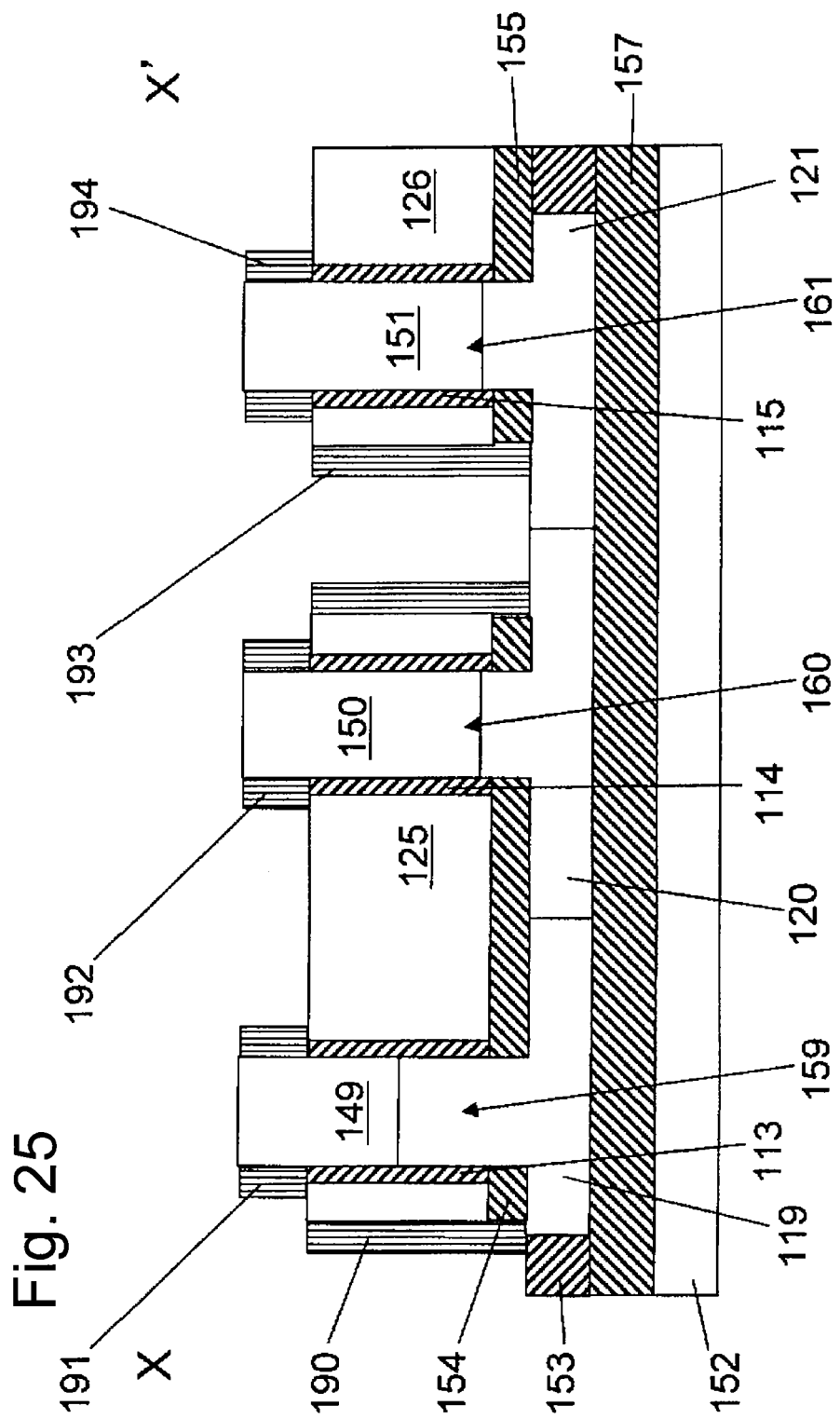
FIG. 25 is a cross-sectional view explaining the method for fabricating a static memory cell according to the embodiment of the present invention.

Then, a nitride film is deposited, and etching is performed to make the nitride film remain as sidewalls. As illustrated in FIG. 25, nitride film sidewalls 190, 191, 192, 193, and 194 are formed.

Figure 26:
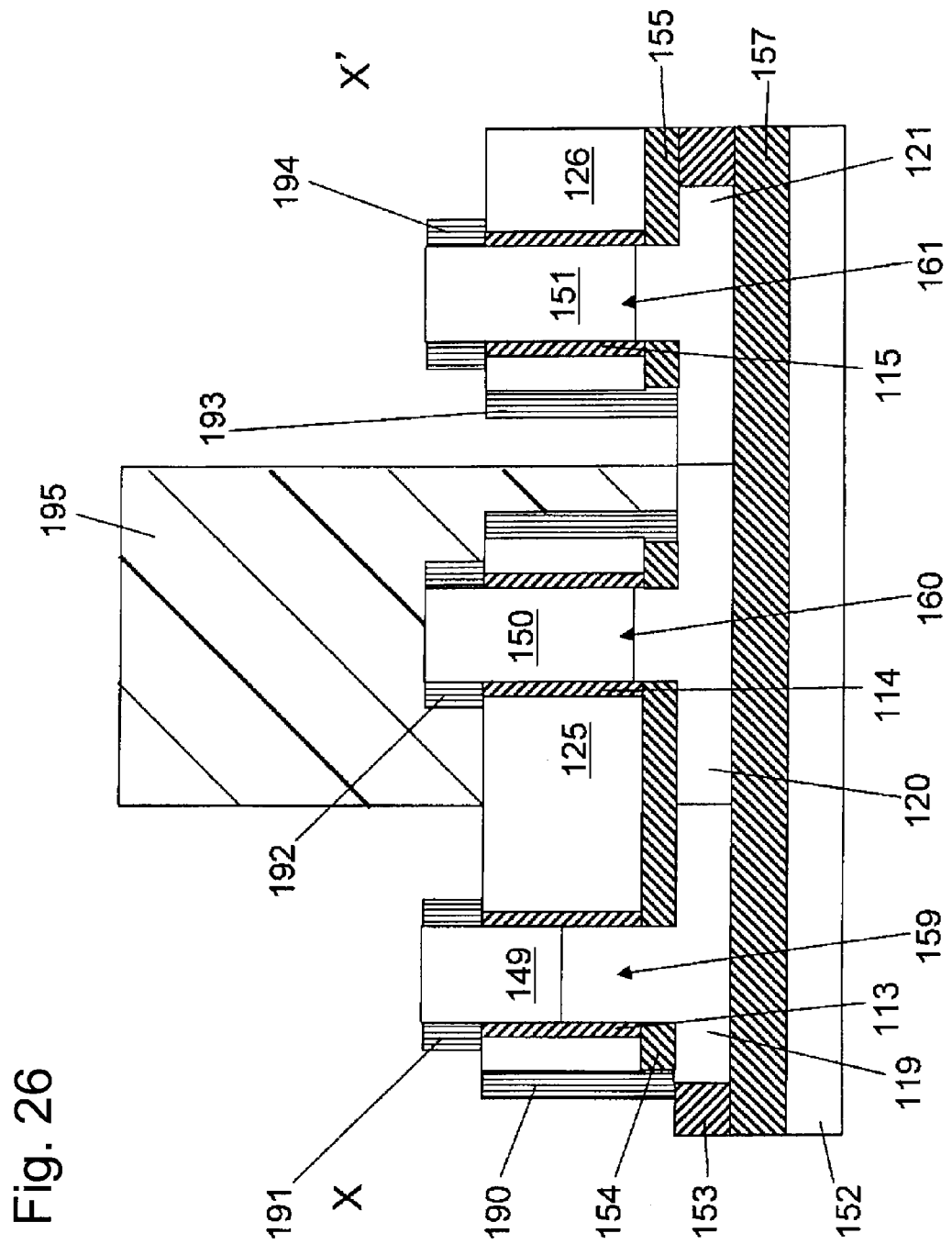
FIG. 26 is a cross-sectional view explaining the method for fabricating a static memory cell according to the embodiment of the present invention.

Subsequently, as illustrated in FIG. 26, a resist 195 for forming a fourth diffusion layer 107 and a second diffusion layer 109 is formed.

Figure 27:
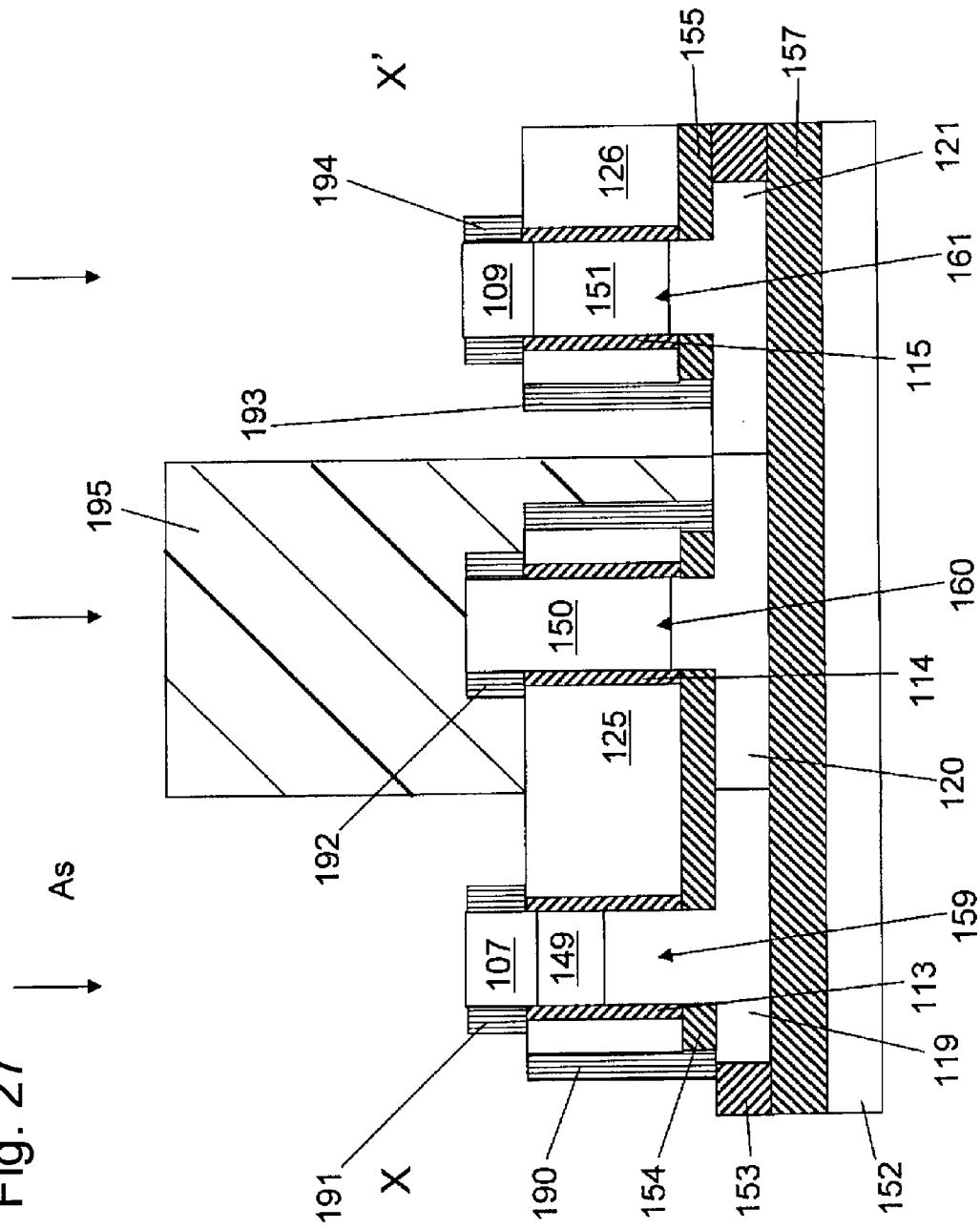
FIG. 27 is a cross-sectional view explaining the method for fabricating a static memory cell according to the embodiment of the present invention.

Then, as illustrated in FIG. 27, arsenic is ion-implanted to form the fourth diffusion layer 107 and the second diffusion layer 109.

Figure 28:
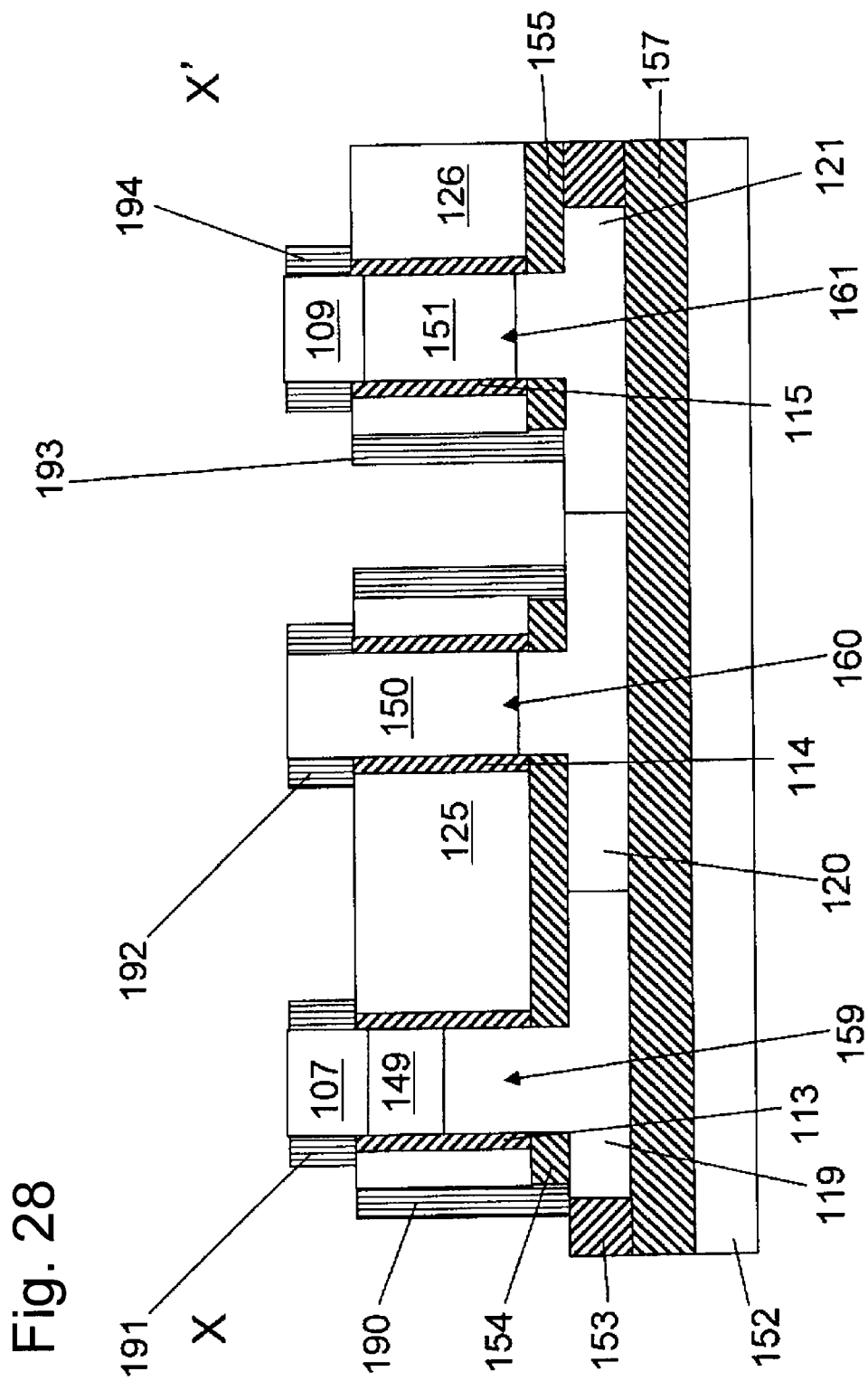
FIG. 28 is a cross-sectional view explaining the method for fabricating a static memory cell according to the embodiment of the present invention.

After that, as illustrated in FIG. 28, the resist 195 is stripped, and heat treatment is carried out.

Figure 29:
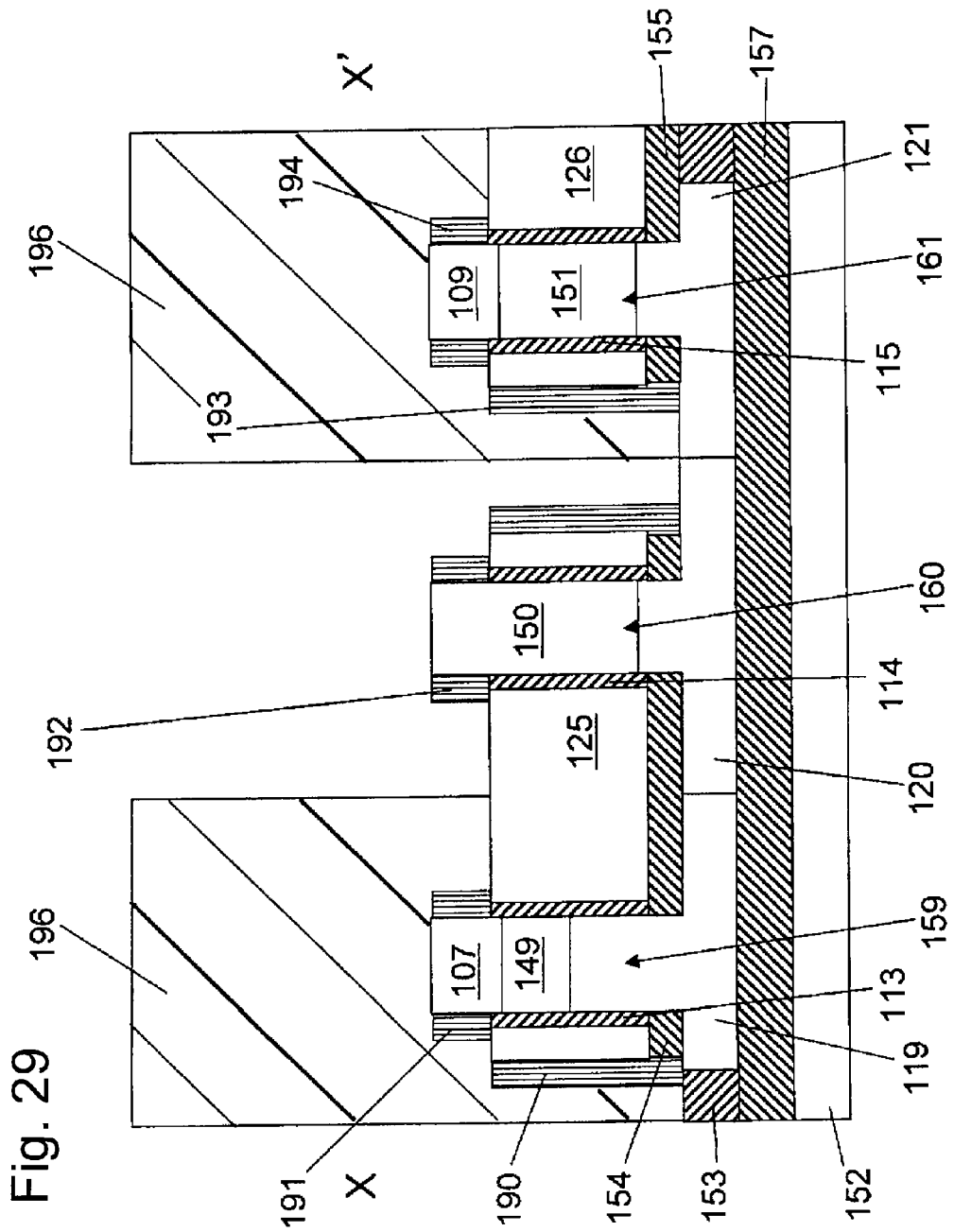
FIG. 29 is a cross-sectional view explaining the method for fabricating a static memory cell according to the embodiment of the present invention.

As illustrated in FIG. 29, a resist 196 for forming a sixth diffusion layer 108 is formed.

Figure 30:
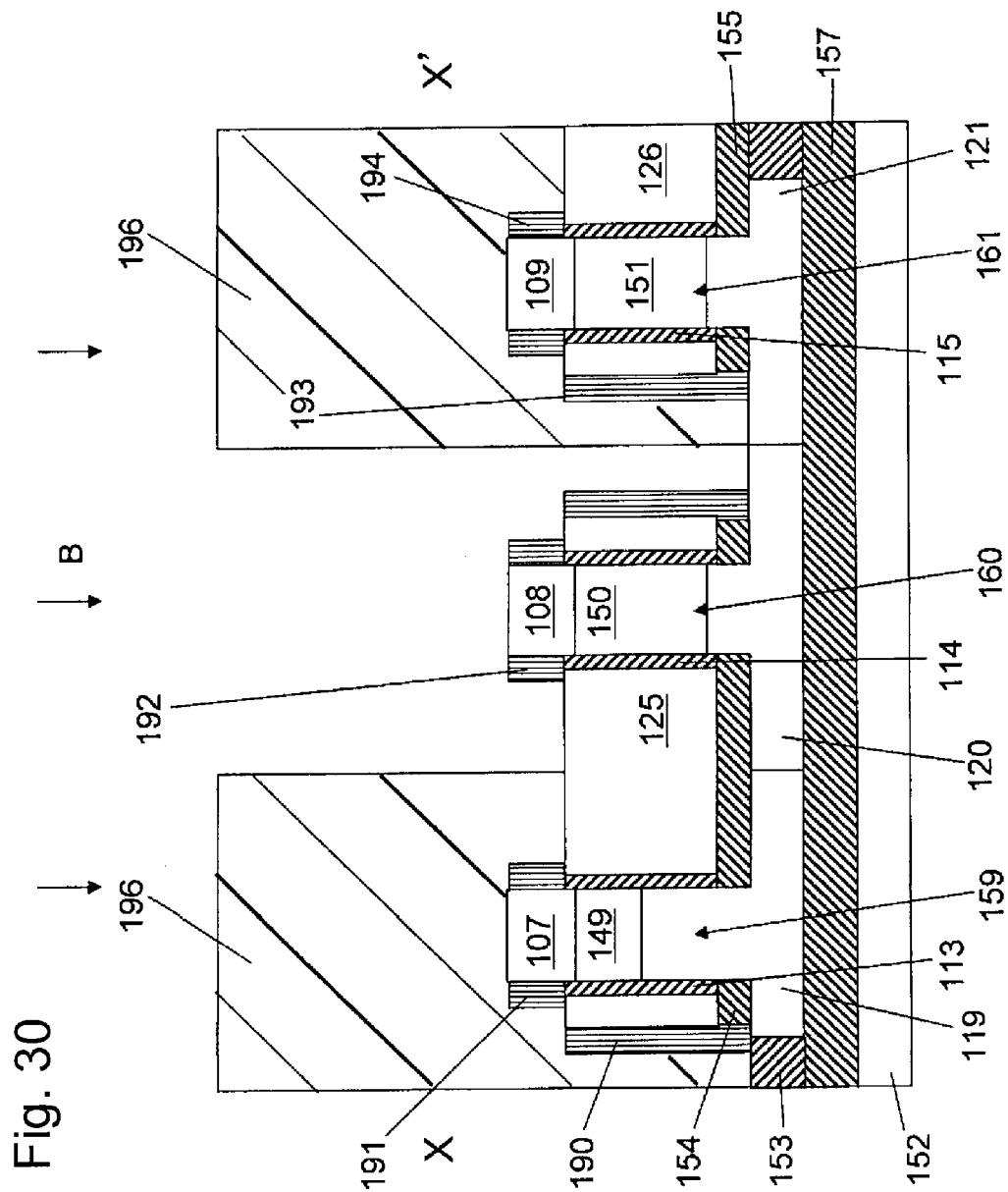
FIG. 30 is a cross-sectional view explaining the method for fabricating a static memory cell according to the embodiment of the present invention.

Subsequently, as illustrated in FIG. 30, boron is ion-implanted to form the sixth diffusion layer 108.

Figure 31:
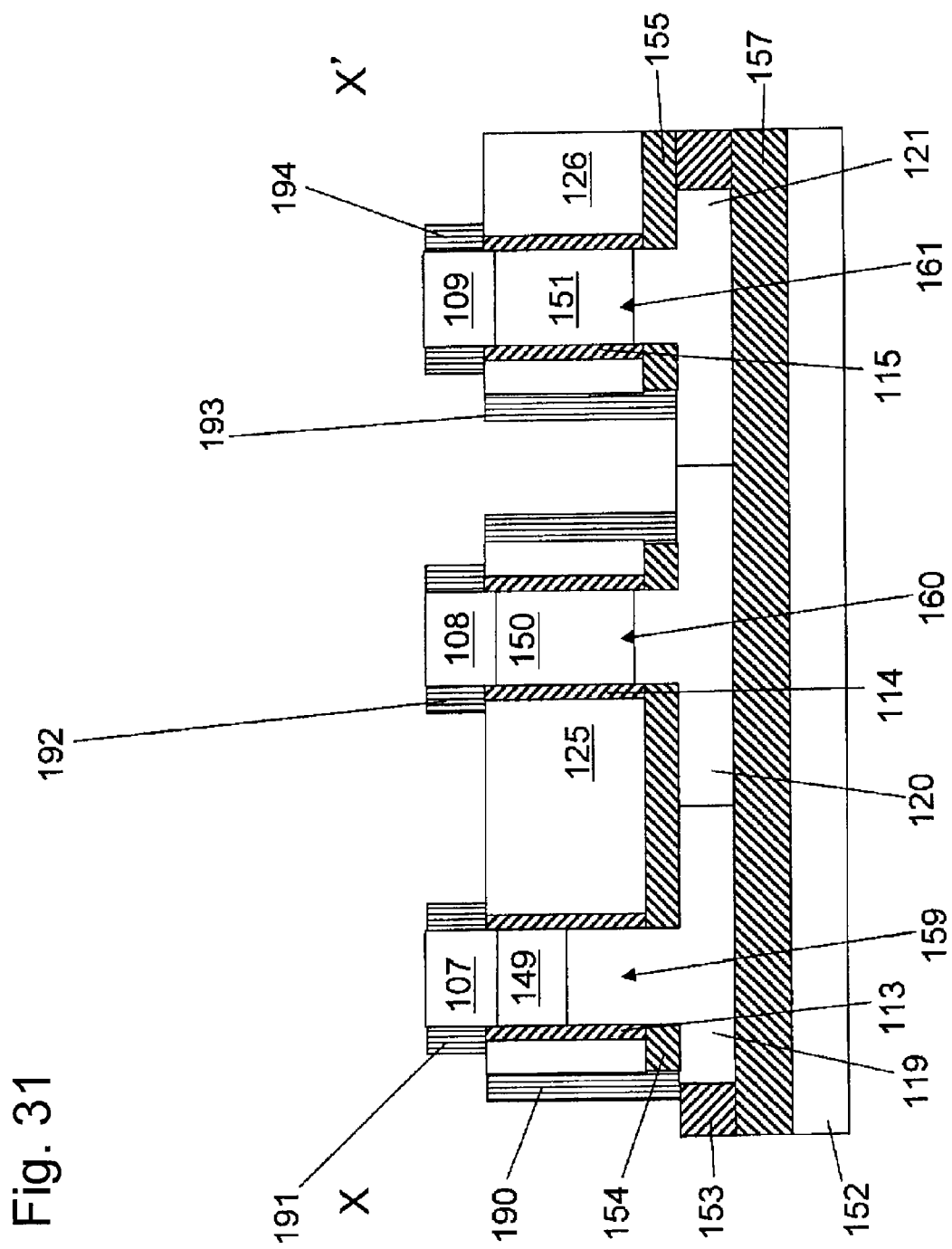
FIG. 31 is a cross-sectional view explaining the method for fabricating a static memory cell according to the embodiment of the present invention.

Then, as illustrated in FIG. 31, the resist 196 is stripped, and heat treatment is carried out.

Figure 32:
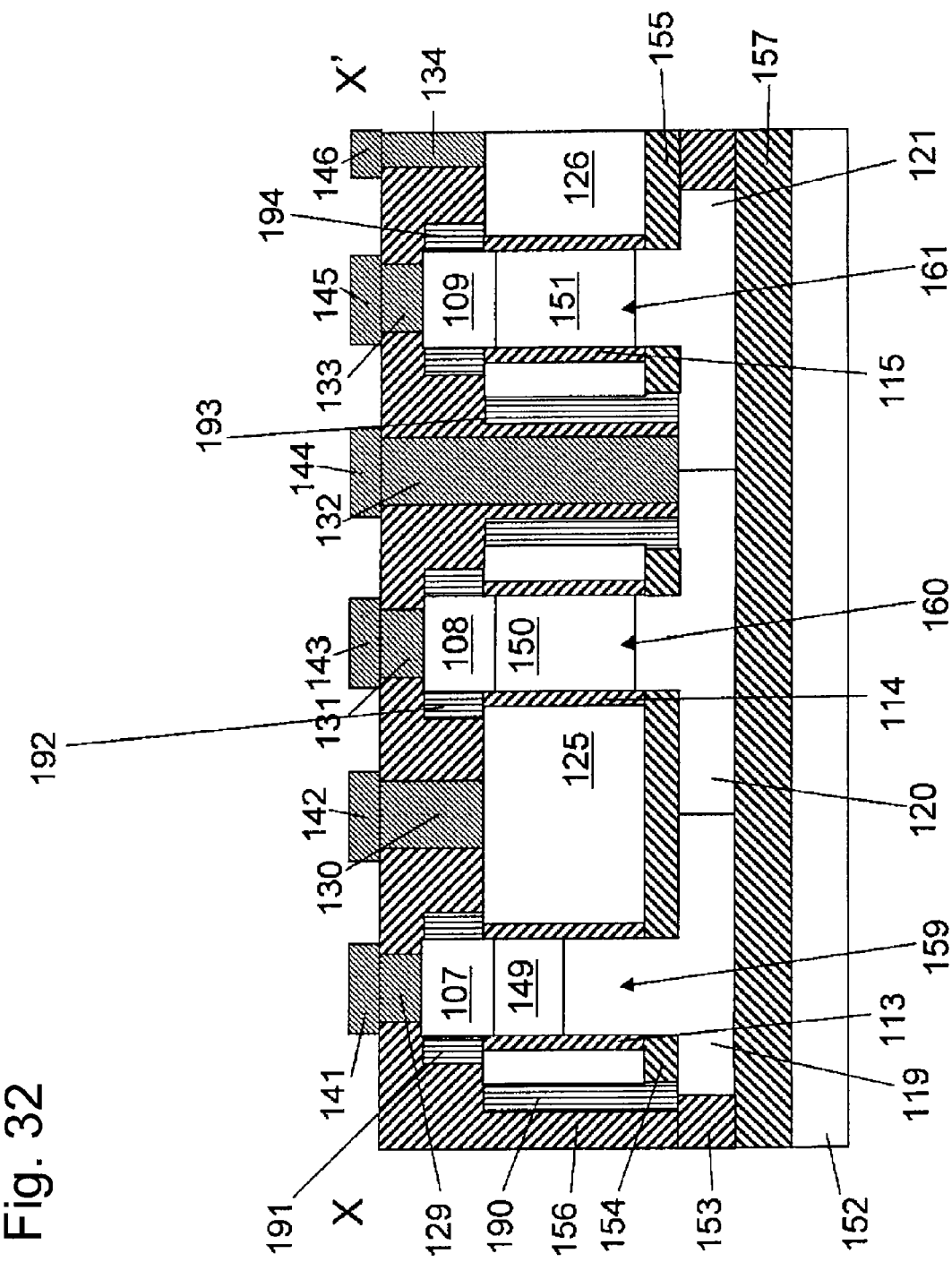
FIG. 32 is a cross-sectional view explaining the method for fabricating a static memory cell according to the embodiment of the present invention.

Subsequently, as illustrated in FIG. 32, an interlayer film 156 is deposited, contacts 129, 130, 131, 132, 133, and 134 are formed, and metals 141, 142, 143, 144, 145, and 146 are formed. Before an interlayer film is formed, silicide layers may be formed on the third diffusion layer 119, the fifth diffusion layer 120, and the first diffusion layer 121. Silicide layers may also be formed on the fourth diffusion layer 107, the sixth diffusion layer 108, and the second diffusion layer 109.

Accordingly, the channel length of a driver transistor is made shorter than the channel length of an access transistor to ensure operational stability. Furthermore, the physical gate length of the driver transistor and the physical gate length of the access transistor are made the same, and therefore the SGT production method described above can be used. That is, the current driving force of the driver transistor can be made double the current driving force of the access transistor to ensure operational stability. Furthermore, only the channel length of the driver transistor is reduced while the physical gate lengths are the same. Therefore, the gate capacitance is not reduced although the current driving force of the driver transistor is doubled. Thus, the occurrence of soft errors can be avoided to ensure operational stability. Additionally, the upper end of the third diffusion layer of the driver transistor is made to be at position higher than the upper end of the first diffusion layer of the access transistor, thus allowing the driver transistor to increase the overlap capacitance between the gate and the third diffusion layer. The occurrence of soft errors can further be avoided to ensure further operational stability. A production method for forming the above structure has been illustrated.

An example of a production process for forming the structure of the static memory cell illustrated in FIG. 5 according to an embodiment of the present invention will be described with reference to FIGS. 33 to 58.

Figure 33:
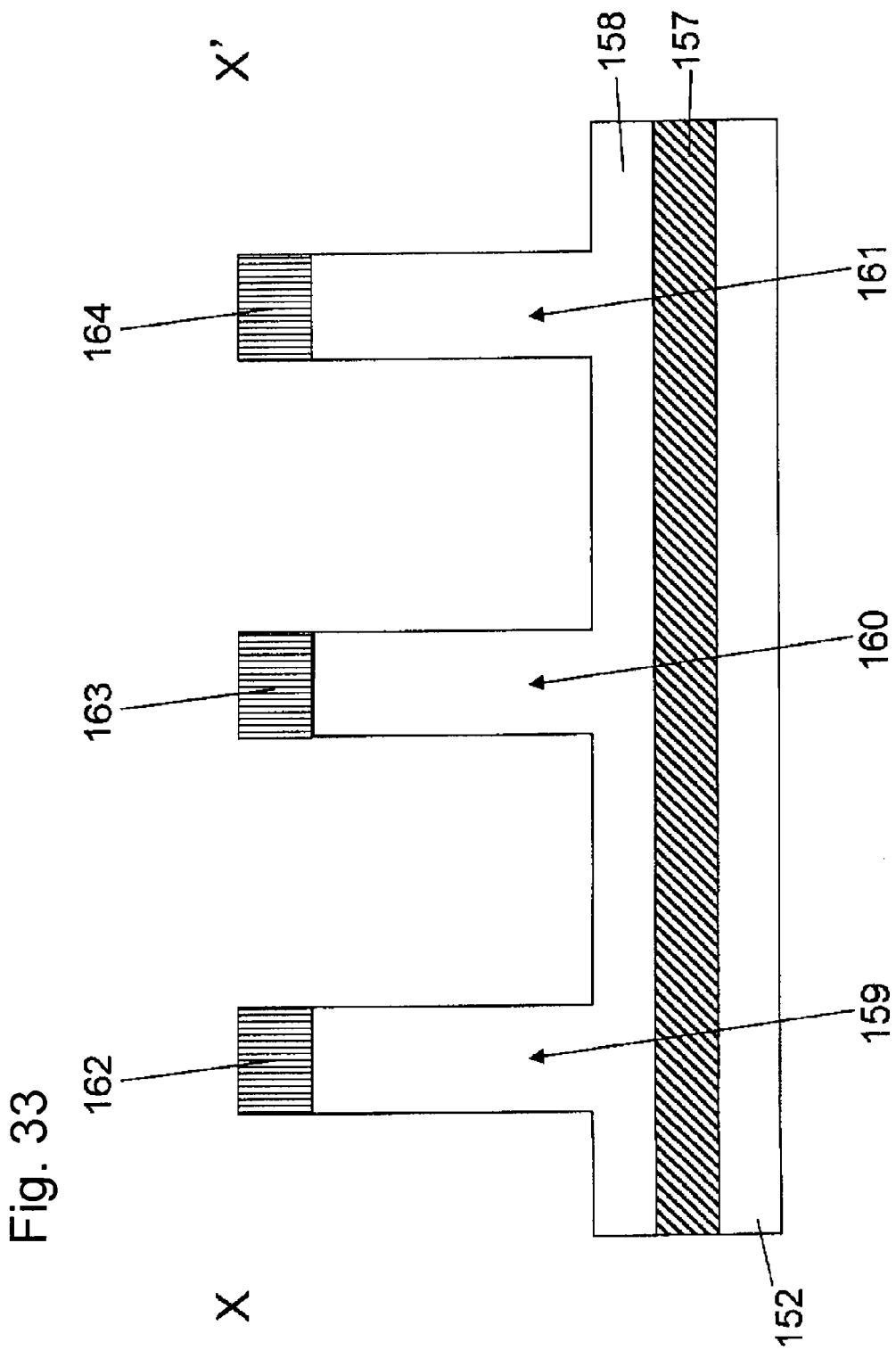
FIG. 33 is a cross-sectional view explaining a method for fabricating a static memory cell according to another embodiment of the present invention.

FIG. 33 illustrates a structure in which an oxide film 157 is formed on a silicon layer 152, a planar silicon layer 158 is formed on the oxide film 157, and pillar-shaped silicon layers 159, 160, and 161 having nitride film hard masks 162, 163, and 164 in upper portions thereof are formed.

Figure 34:
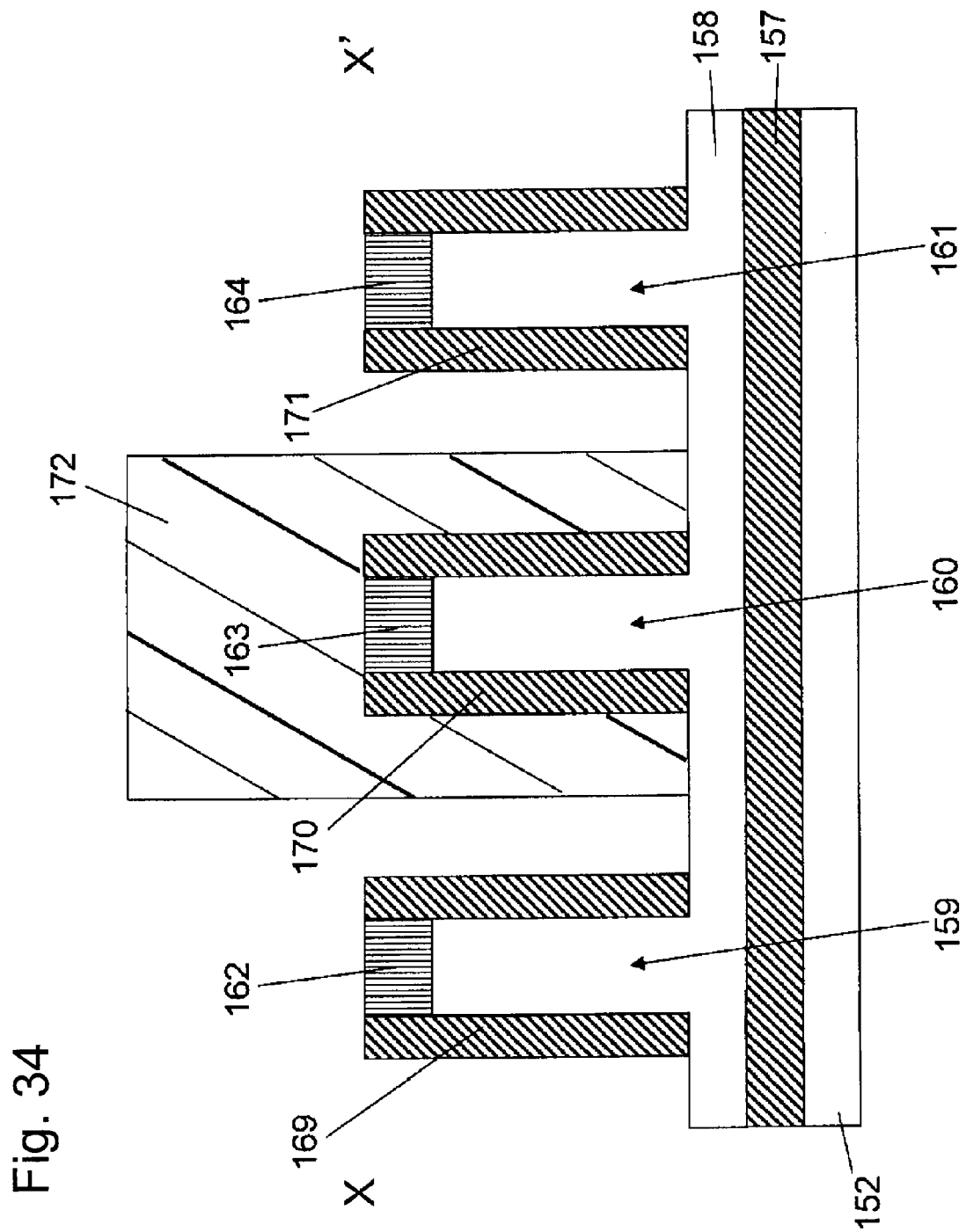
FIG. 34 is a cross-sectional view explaining the method for fabricating a static memory cell according to the embodiment of the present invention.

Subsequently, as illustrated in FIG. 34, an oxide film is deposited and is etched back to form oxide film sidewalls 169, 170, and 171. After that, a resist 172 for forming a third diffusion layer 119 and a first diffusion layer 121 is formed.

Figure 35:
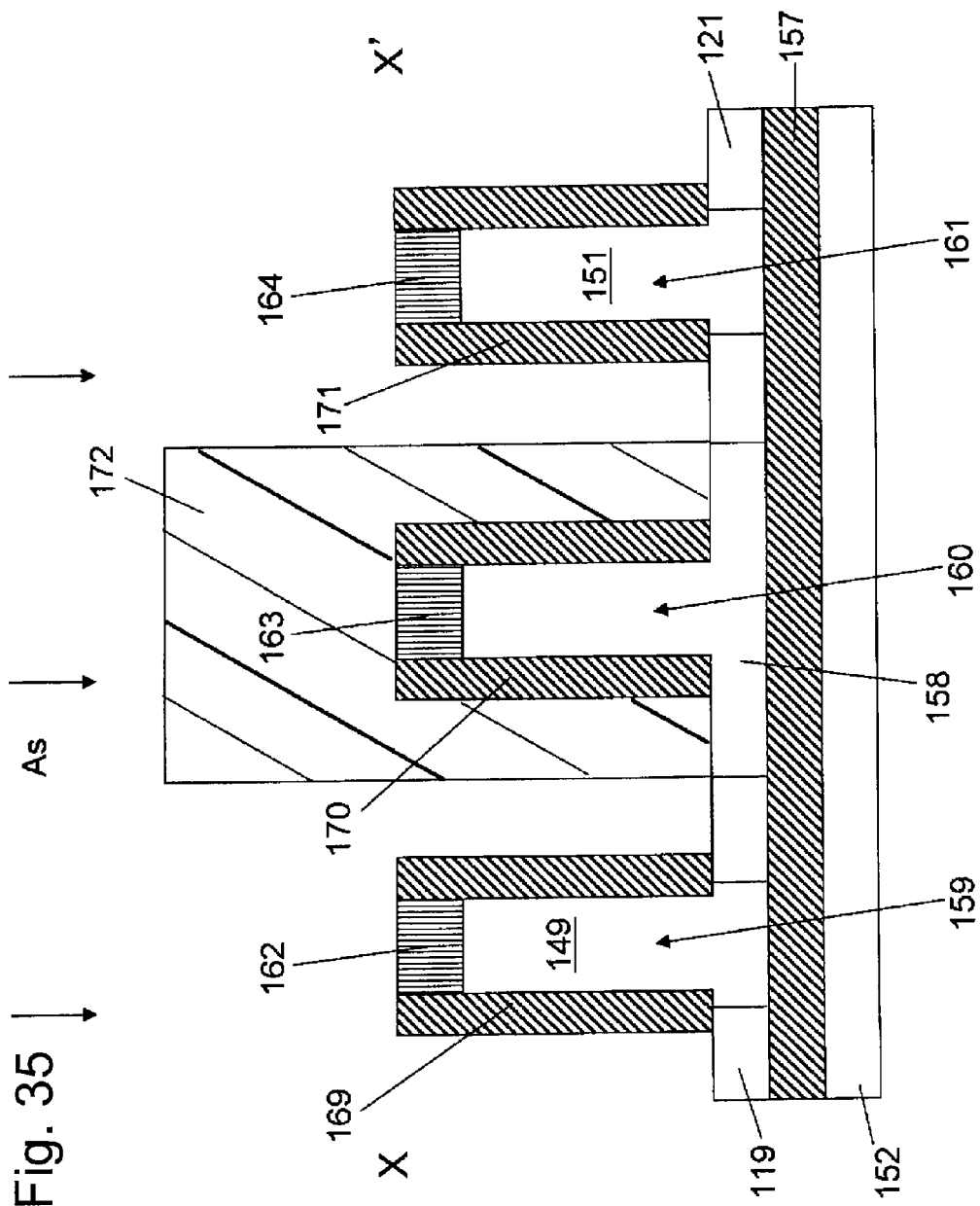
FIG. 35 is a cross-sectional view explaining the method for fabricating a static memory cell according to the embodiment of the present invention.

Then, as illustrated in FIG. 35, arsenic is implanted to form the third diffusion layer 119 and the first diffusion layer 121.

Figure 36:
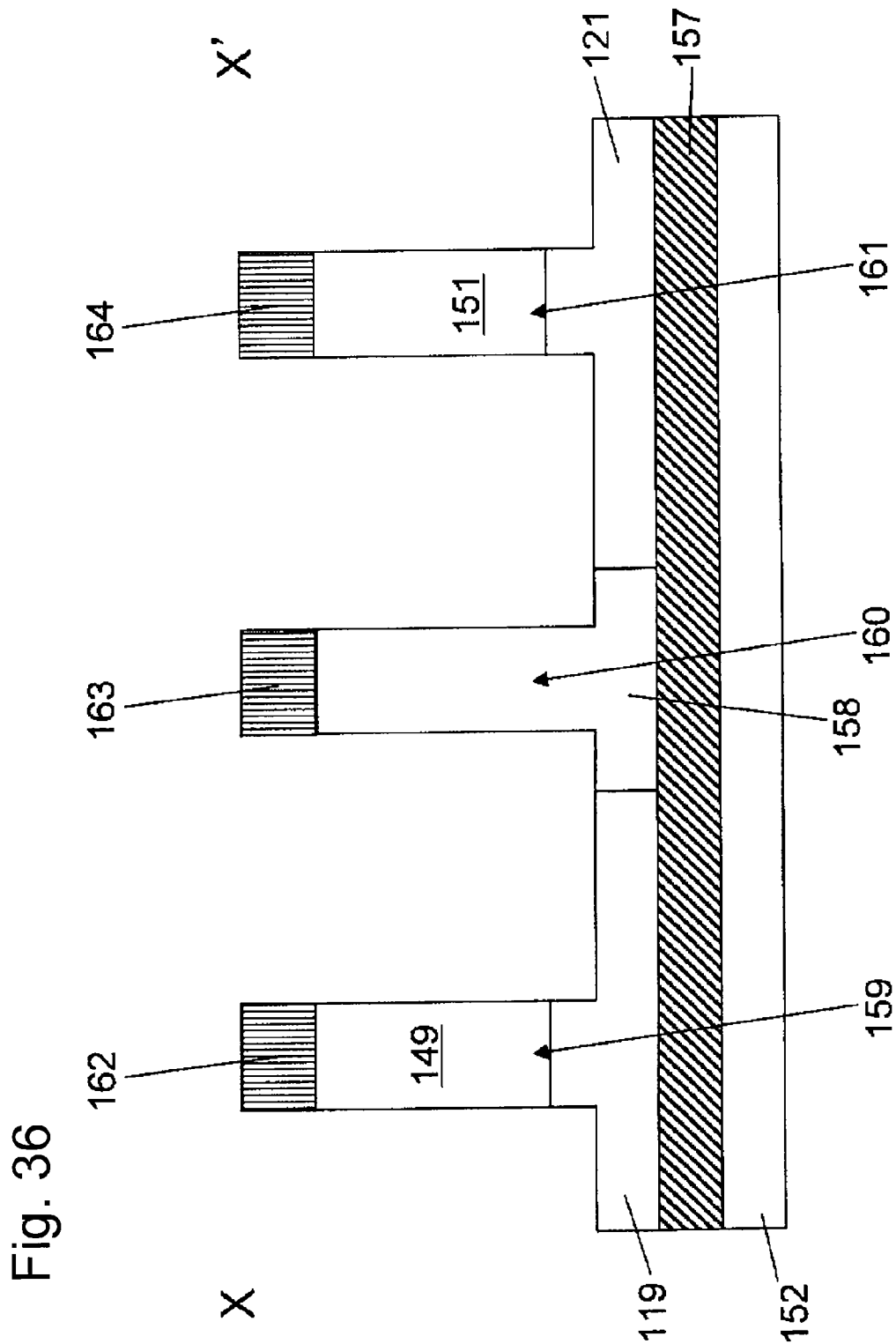
FIG. 36 is a cross-sectional view explaining the method for fabricating a static memory cell according to the embodiment of the present invention.

Subsequently, as illustrated in FIG. 36, the resist 172 is stripped, the oxide film sidewalls 169, 170, and 171 are stripped, and heat treatment is carried out.

Figure 37:
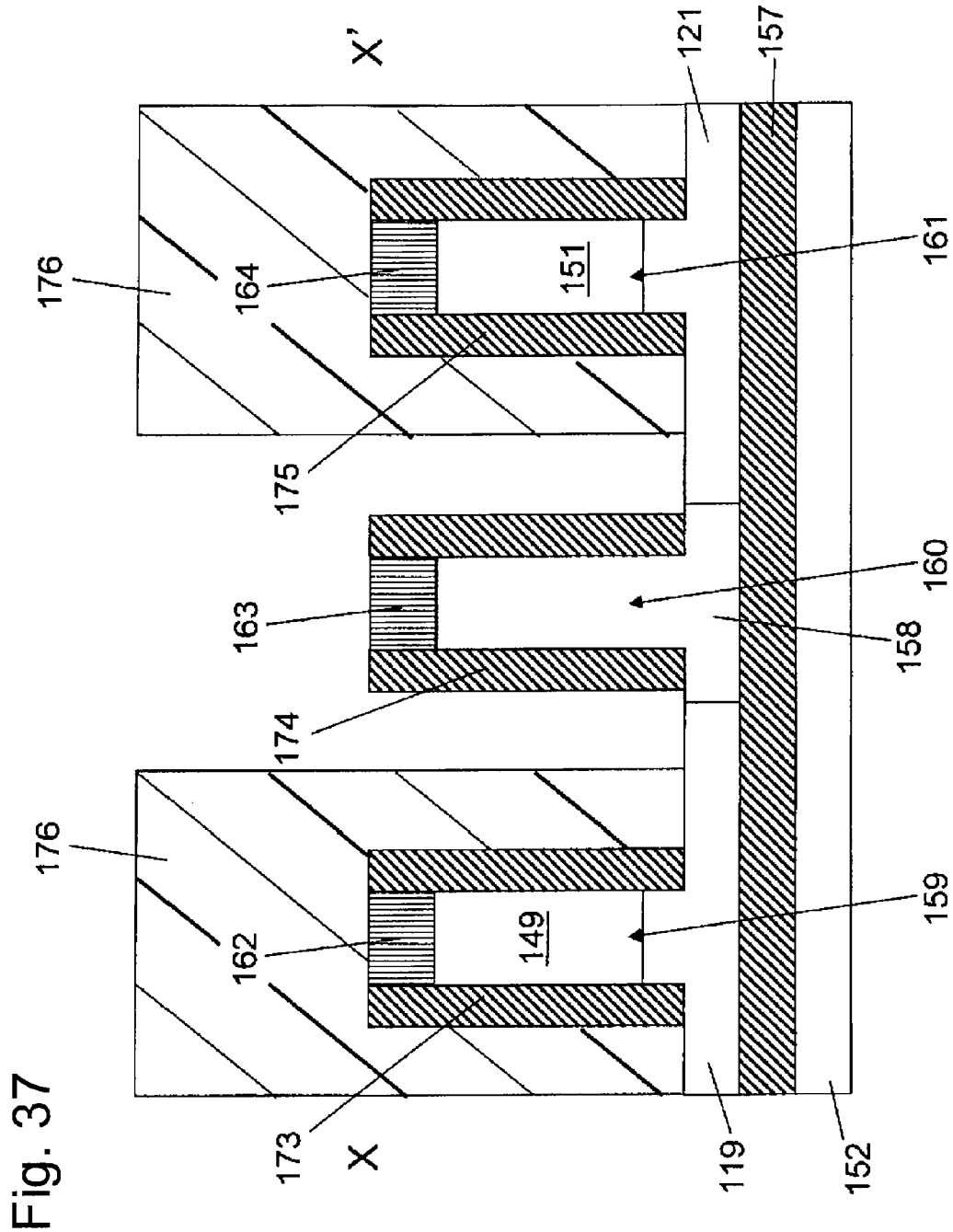
FIG. 37 is a cross-sectional view explaining the method for fabricating a static memory cell according to the embodiment of the present invention.

Then, as illustrated in FIG. 37, oxide film sidewalls 173, 174, and 175 are formed. After that, a resist 176 for forming a fifth diffusion layer 120 is formed.

Figure 38:
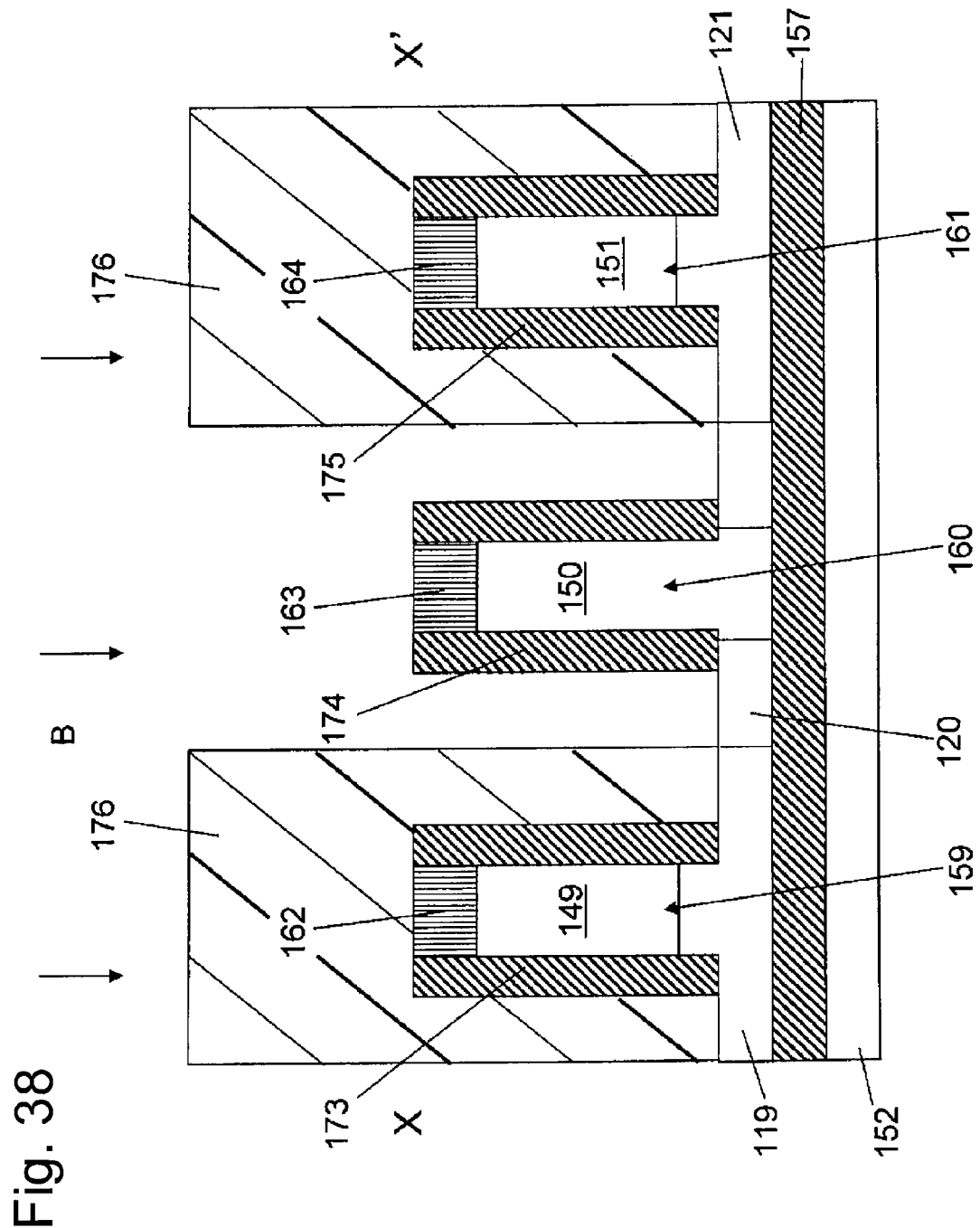
FIG. 38 is a cross-sectional view explaining the method for fabricating a static memory cell according to the embodiment of the present invention.

Subsequently, as illustrated in FIG. 38, boron is implanted to form the fifth diffusion layer 120.

Figure 39:
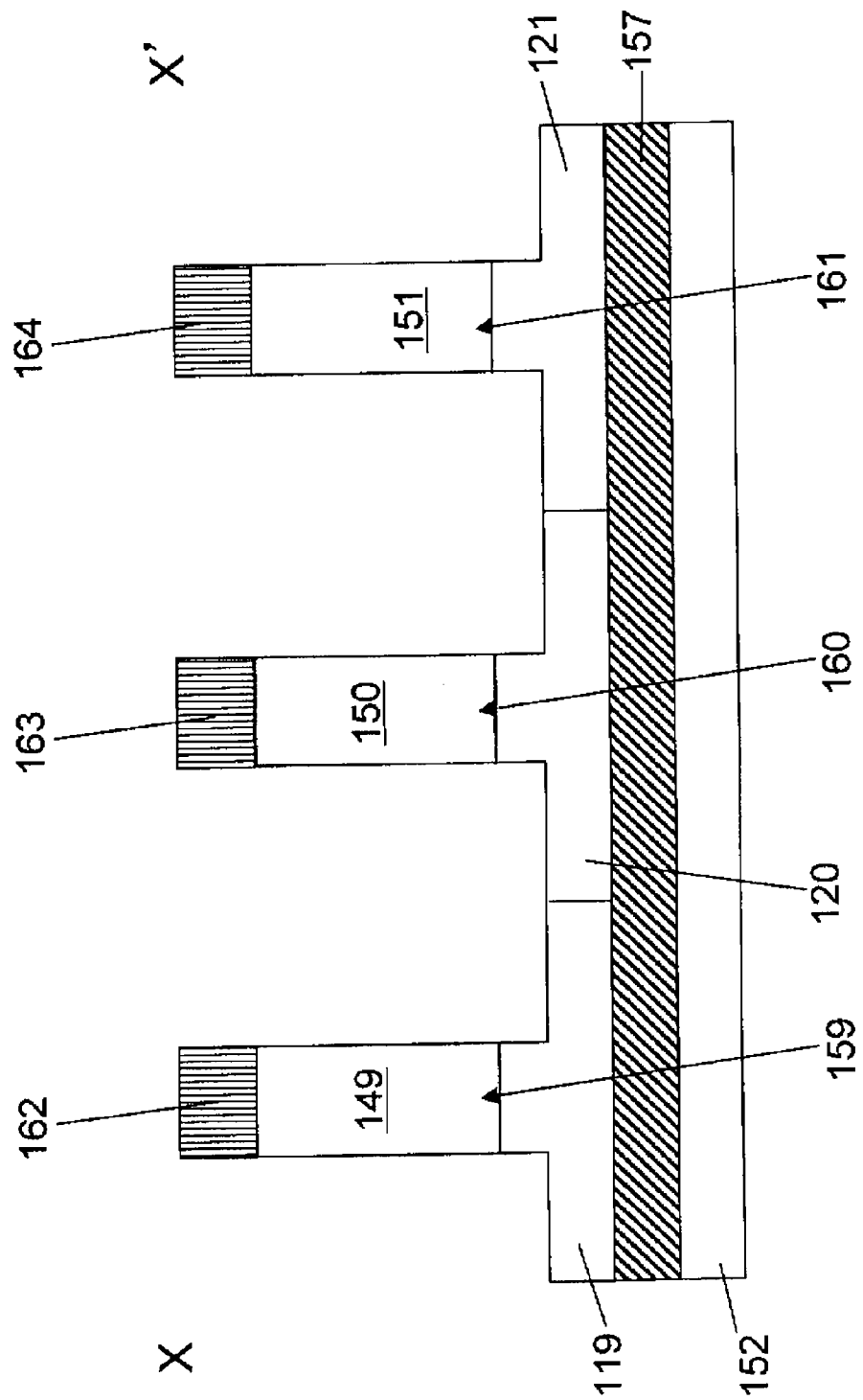
FIG. 39 is a cross-sectional view explaining the method for fabricating a static memory cell according to the embodiment of the present invention.

After that, as illustrated in FIG. 39, the resist 176 is stripped, the oxide film sidewalls 173, 174, and 175 are stripped, and heat treatment is carried out.

Figure 40:
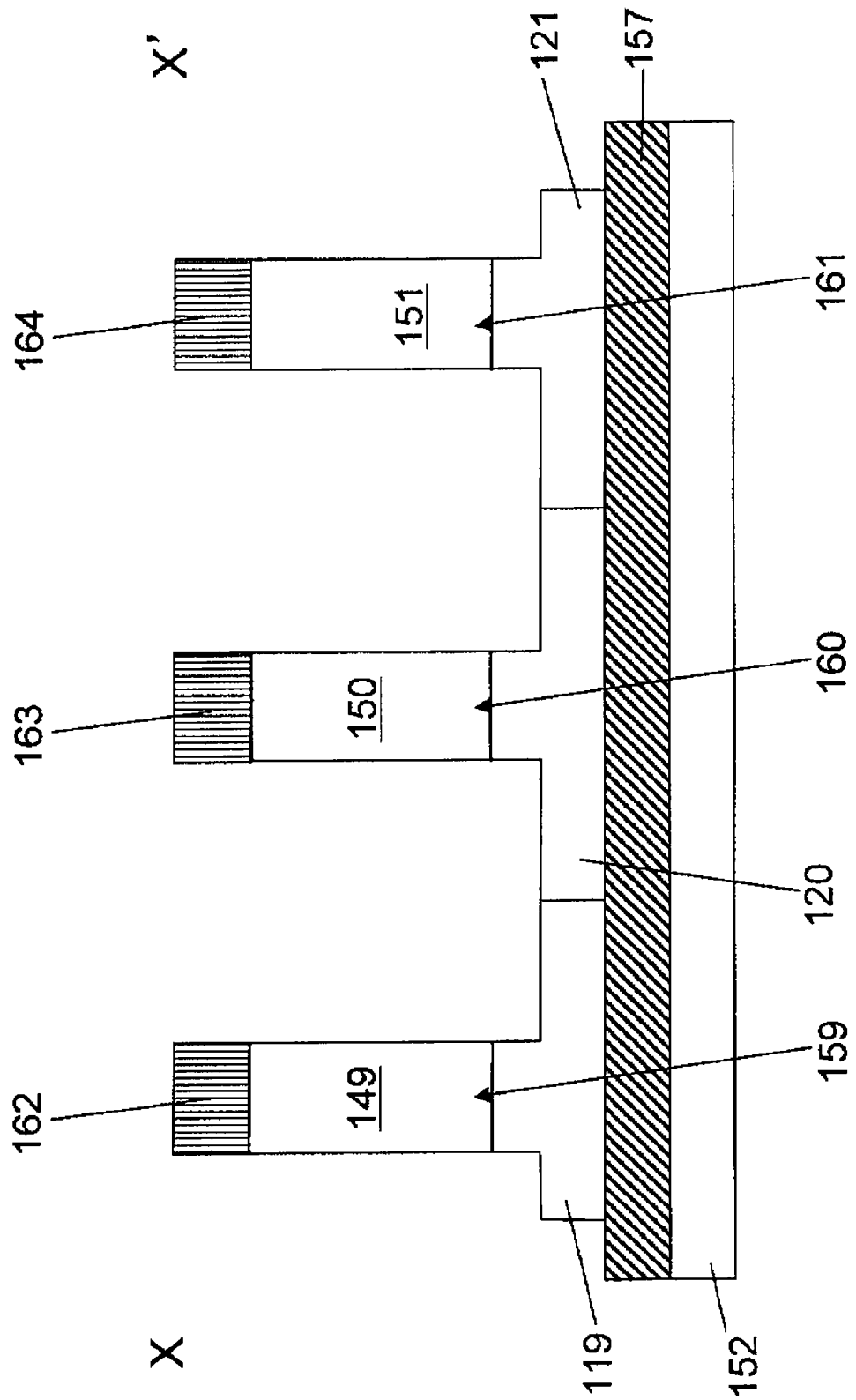
FIG. 40 is a cross-sectional view explaining the method for fabricating a static memory cell according to the embodiment of the present invention.

Subsequently, as illustrated in FIG. 40, a resist for forming elements separately is formed, silicon etching is performed, and the resist is stripped.

Figure 41:
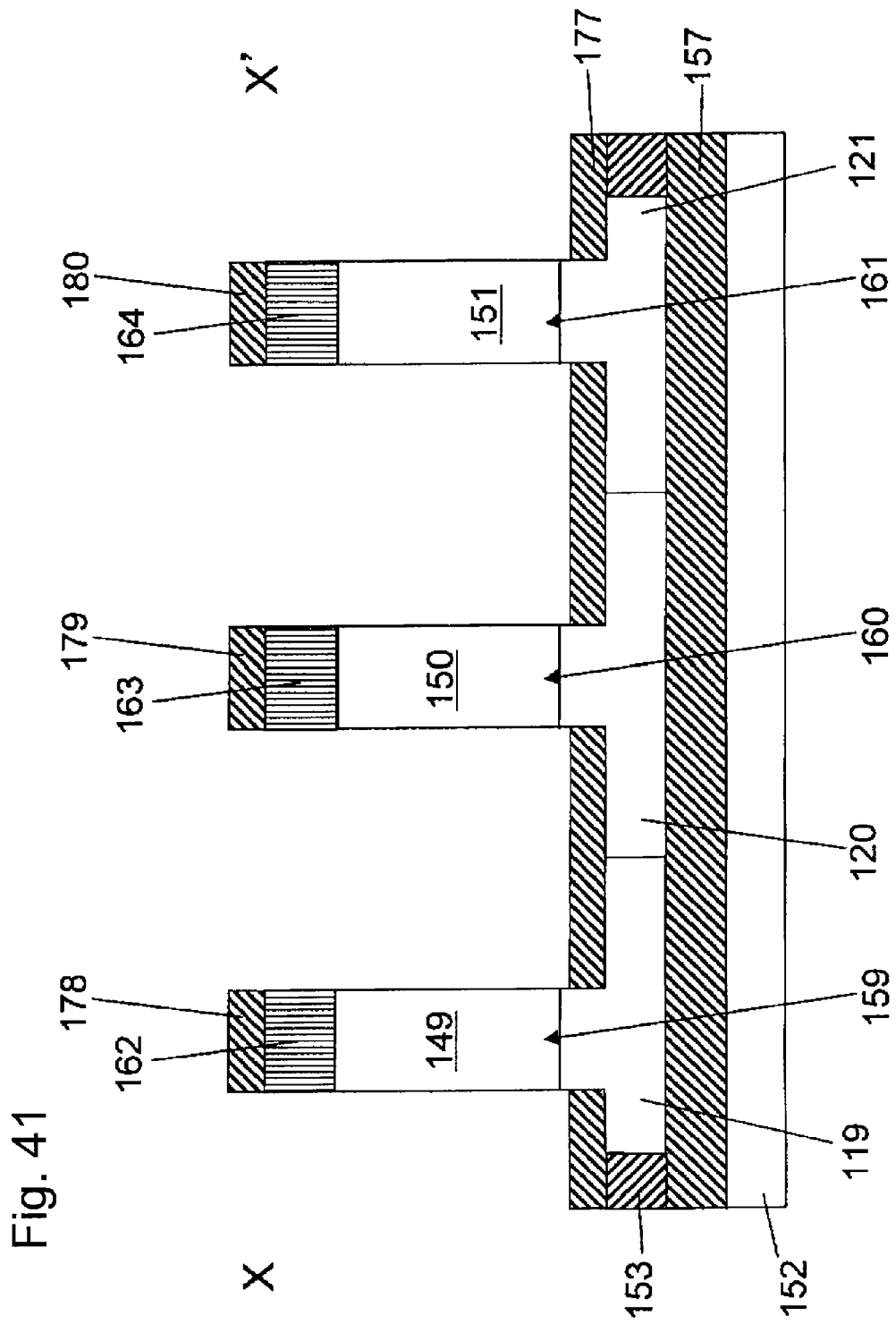
FIG. 41 is a cross-sectional view explaining the method for fabricating a static memory cell according to the embodiment of the present invention.

Then, as illustrated in FIG. 41, an oxide film 153 is formed so as to be buried in spaces between the elements. After that, an atmospheric pressure CVD oxide film is deposited and is etched back to form an oxide film 177. In this case, oxide films 178, 179, and 180 remain on the nitride film hard masks 162, 163, and 164, respectively.

Figure 42:
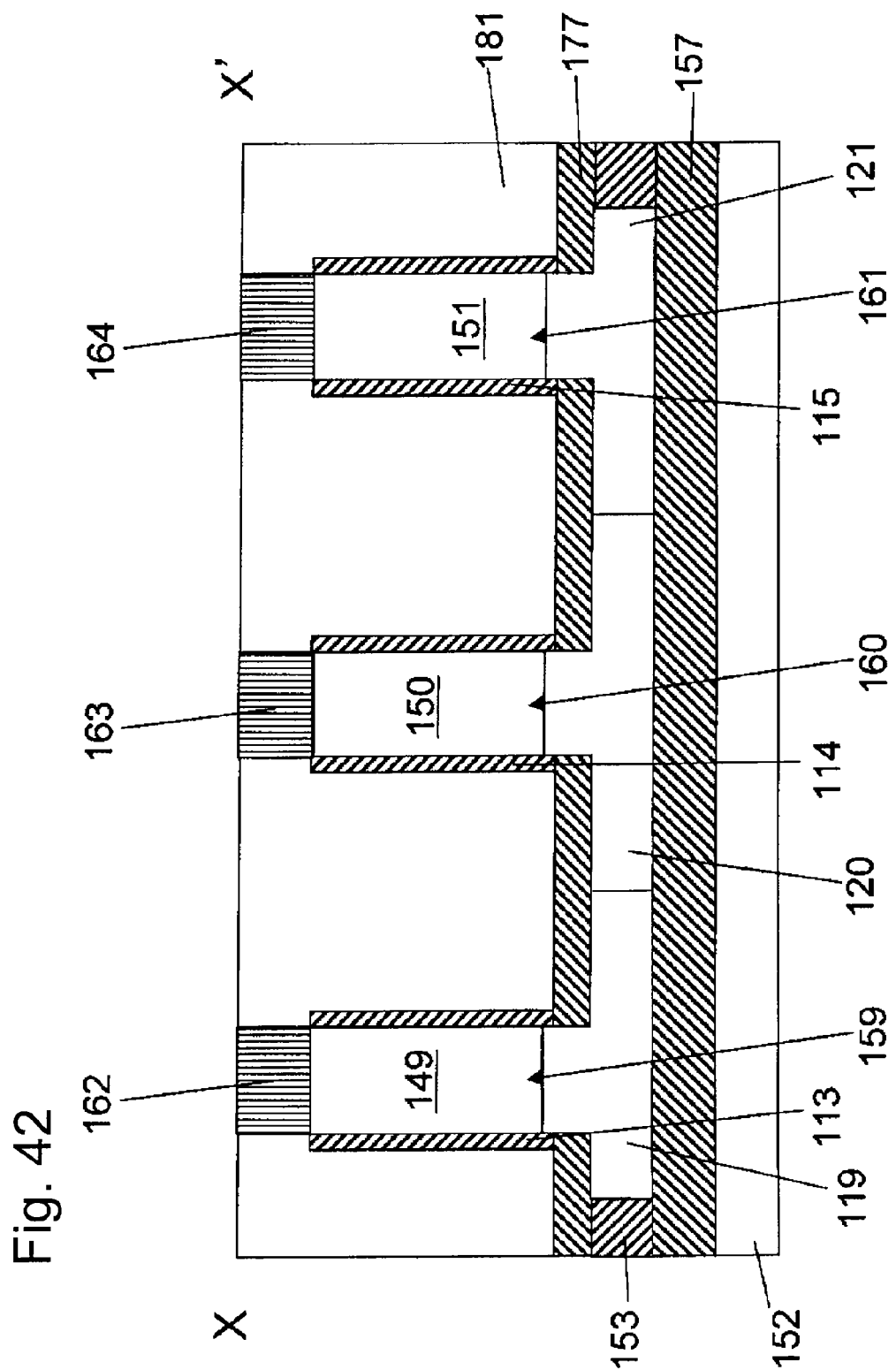
FIG. 42 is a cross-sectional view explaining the method for fabricating a static memory cell according to the embodiment of the present invention.

After that, as illustrated in FIG. 42, gate insulating films 113, 114, and 115 are formed, a gate conductive film 181 is deposited, and planarization is performed. After the oxide films 178, 179, and 180 are exposed, the oxide films 178, 179, and 180 are etched, and planarization is further performed using the nitride film hard masks 162, 163, and 164 as stoppers. Each of the gate insulating films 113, 114, and 115 is one of an oxide film, a nitride film, an oxynitride film, and a high-dielectric film. The gate conductive film 181 is one of a polysilicon film, a metal/polysilicon laminated film, and a metal film.

Figure 43:
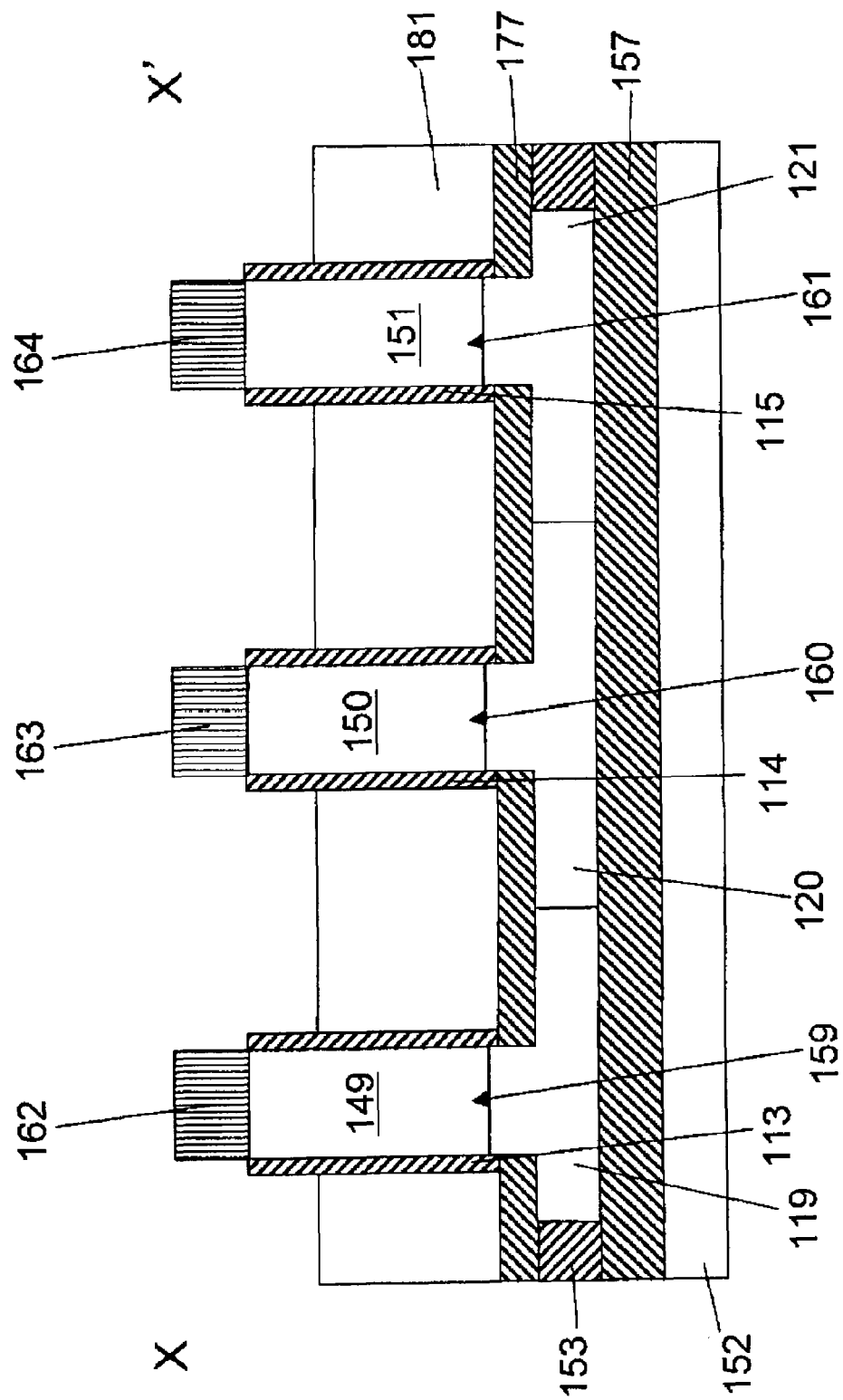
FIG. 43 is a cross-sectional view explaining the method for fabricating a static memory cell according to the embodiment of the present invention.

Subsequently, as illustrated in FIG. 43, the gate conductive film 181 is etched back to obtain a desired physical gate length. Consequently, the physical gate length is made uniform over all the transistors.

Figure 44:
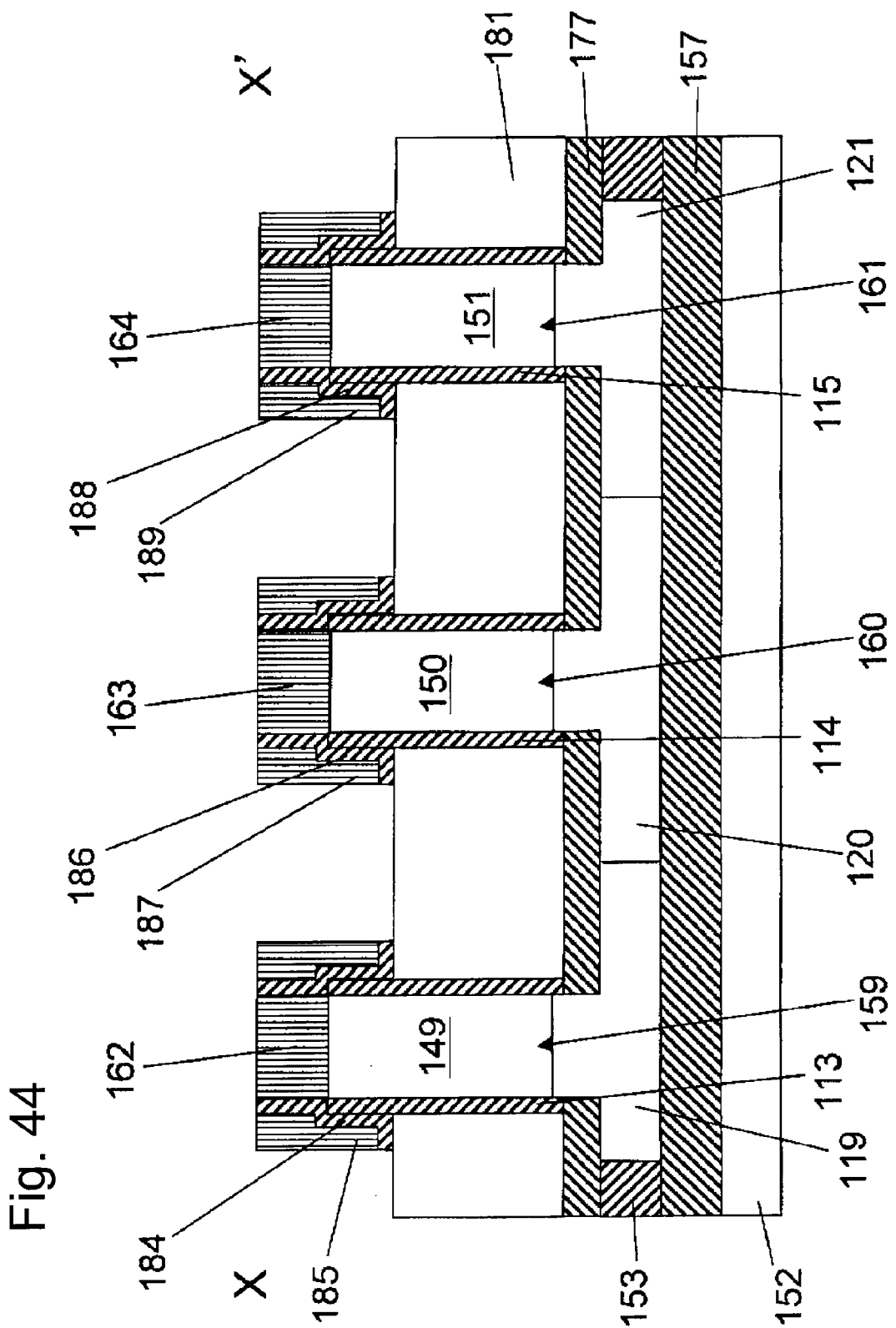
FIG. 44 is a cross-sectional view explaining the method for fabricating a static memory cell according to the embodiment of the present invention.

Then, as illustrated in FIG. 44, an oxide film is deposited, a nitride film is deposited, and etching is performed to make the oxide film and the nitride film remain as sidewalls. An insulating film sidewall composed of an oxide film 184 and a nitride film 185, an insulating film sidewall composed of an oxide film 186 and a nitride film 187, and an insulating film sidewall composed of an oxide film 188 and a nitride film 189 are formed.

Figure 45:
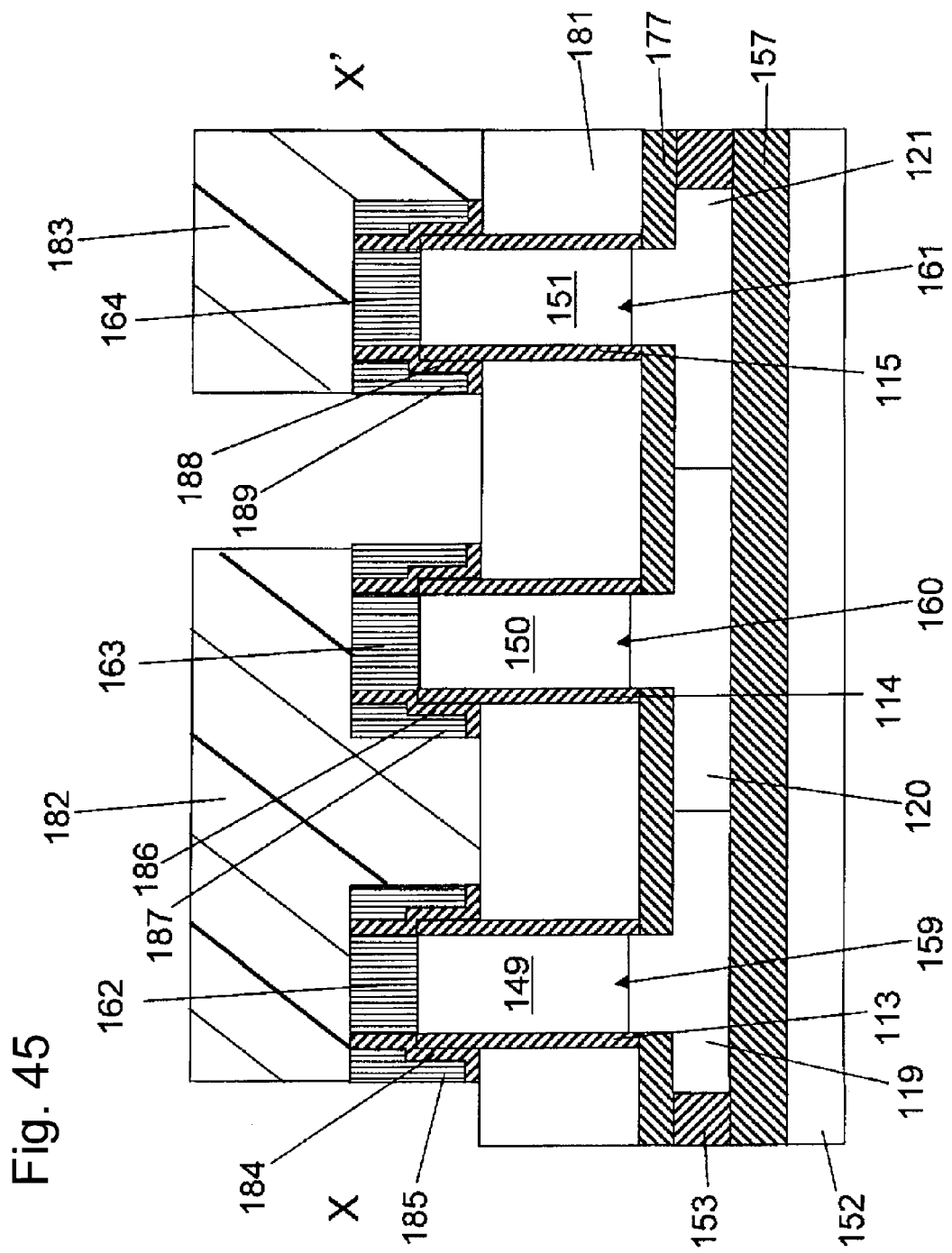
FIG. 45 is a cross-sectional view explaining the method for fabricating a static memory cell according to the embodiment of the present invention.

Further, as illustrated in FIG. 45, resists 182 and 183 for performing gate etching are formed.

Figure 46:
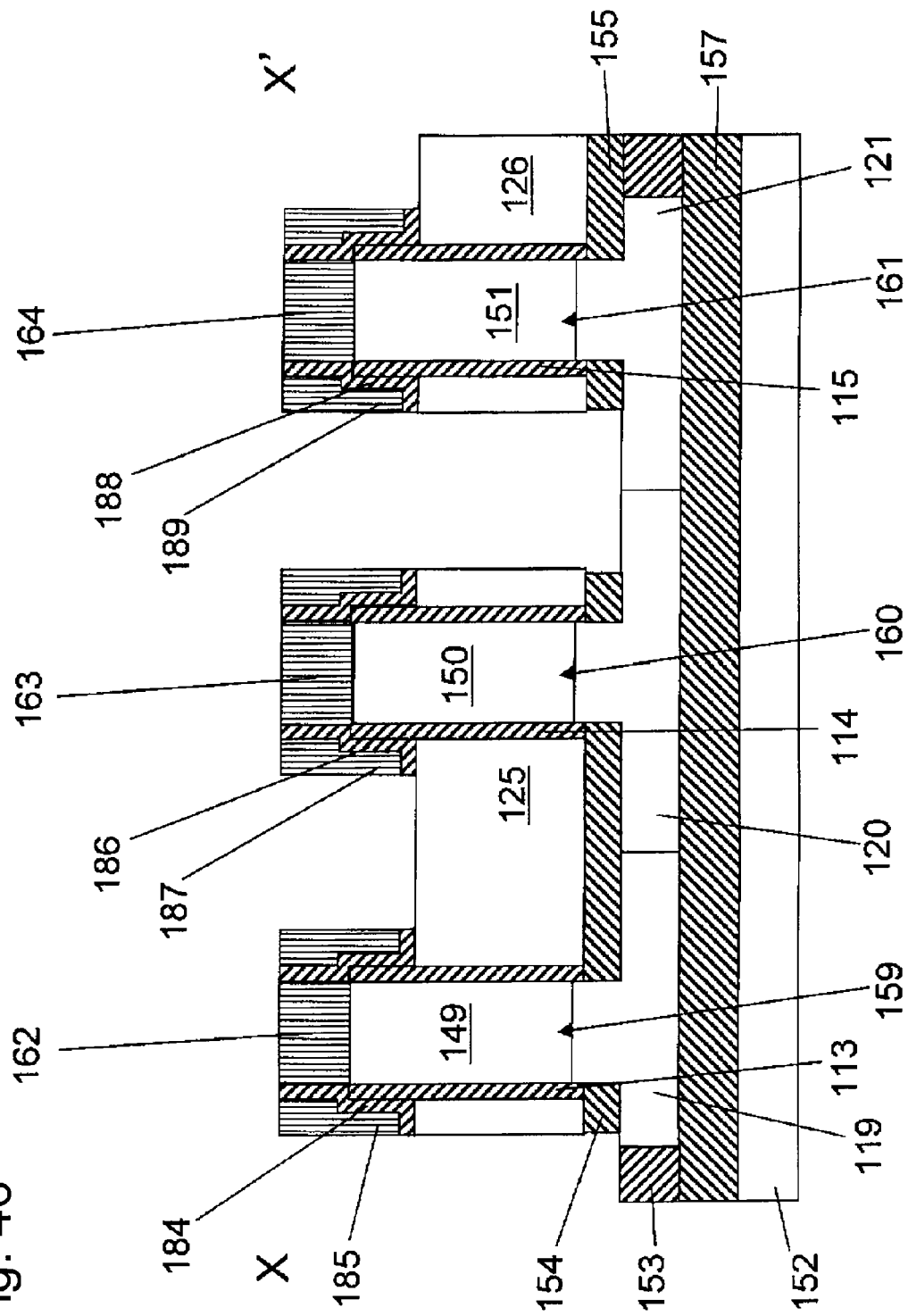
FIG. 46 is a cross-sectional view explaining the method for fabricating a static memory cell according to the embodiment of the present invention.

Then, as illustrated in FIG. 46, the gate conductive film 181 is etched to form gates 125 and 126, and the oxide film 177 is etched to form oxide films 154 and 155. Then, the resists 182 and 183 are stripped.

Figure 47:
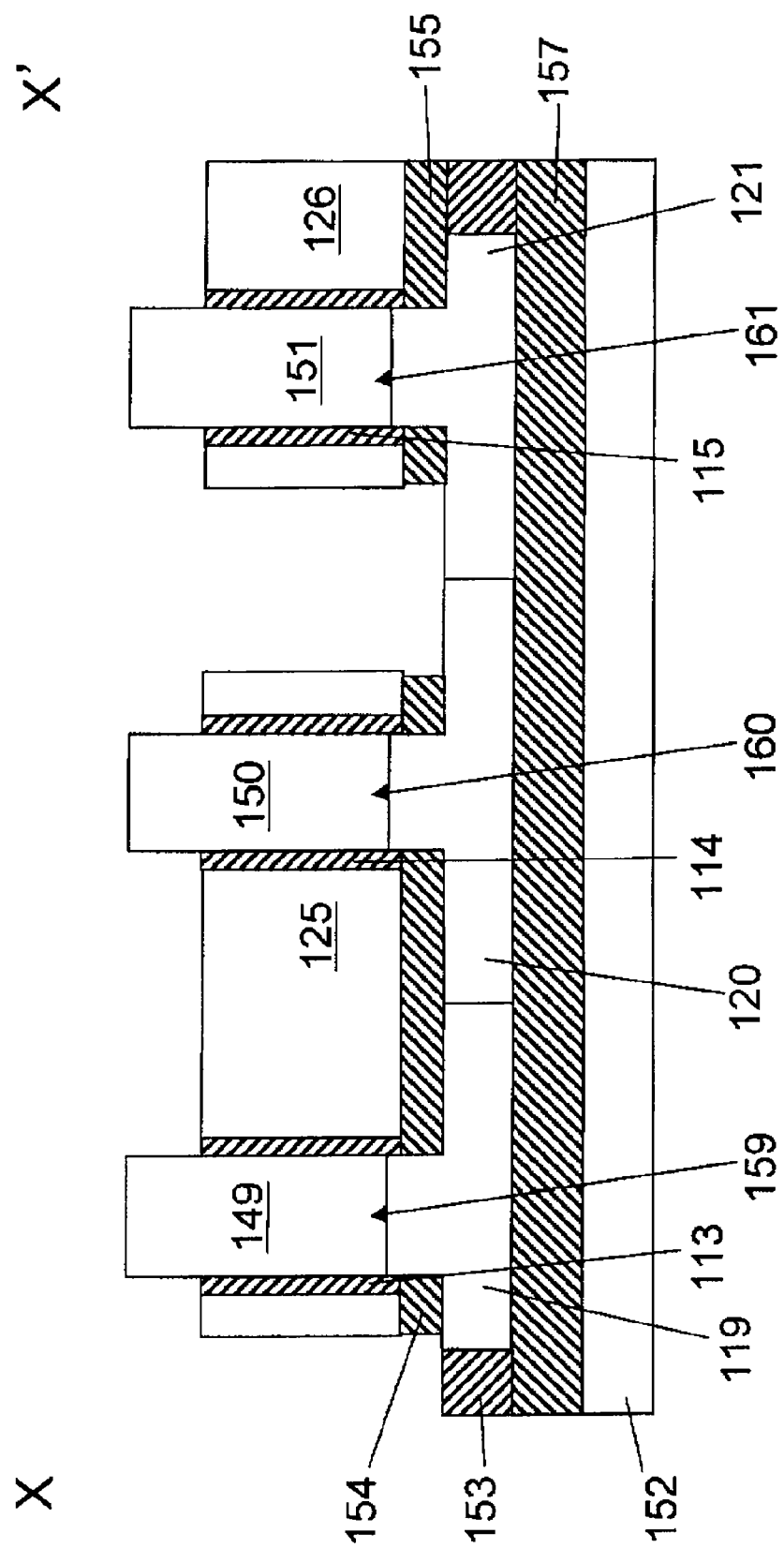
FIG. 47 is a cross-sectional view explaining the method for fabricating a static memory cell according to the embodiment of the present invention.

After that, as illustrated in FIG. 47, the insulating film sidewall composed of the oxide film 184 and the nitride film 185, the insulating film sidewall composed of the oxide film 186 and the nitride film 187, and the insulating film sidewall composed of the oxide film 188 and the nitride film 189 are etched.

Figure 48:
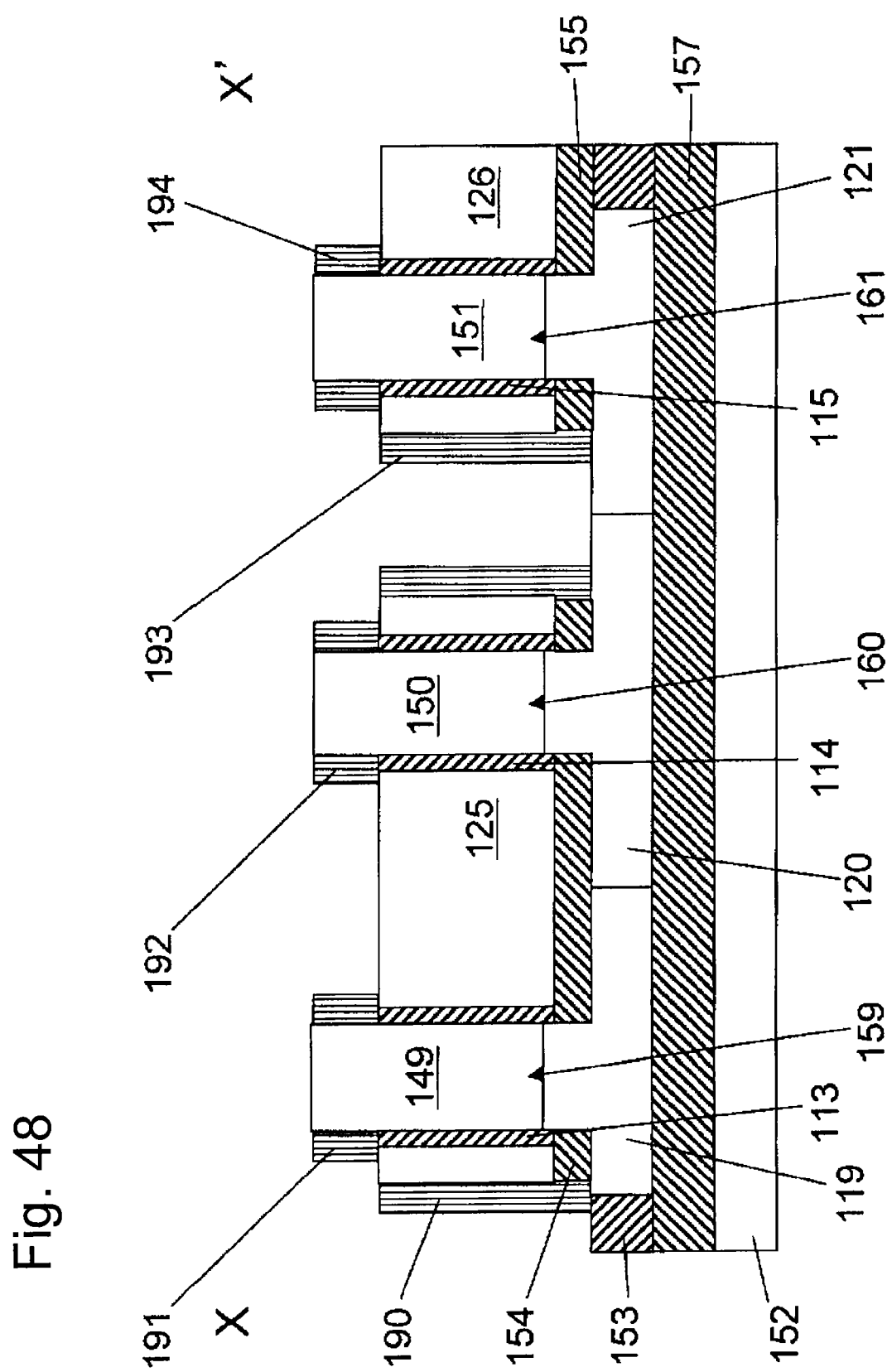
FIG. 48 is a cross-sectional view explaining the method for fabricating a static memory cell according to the embodiment of the present invention.

Subsequently, as illustrated in FIG. 48, a nitride film is deposited and etching is performed to make the nitride film remain as sidewalls to form nitride film sidewalls 190, 191, 192, 193, and 194.

Figure 49:
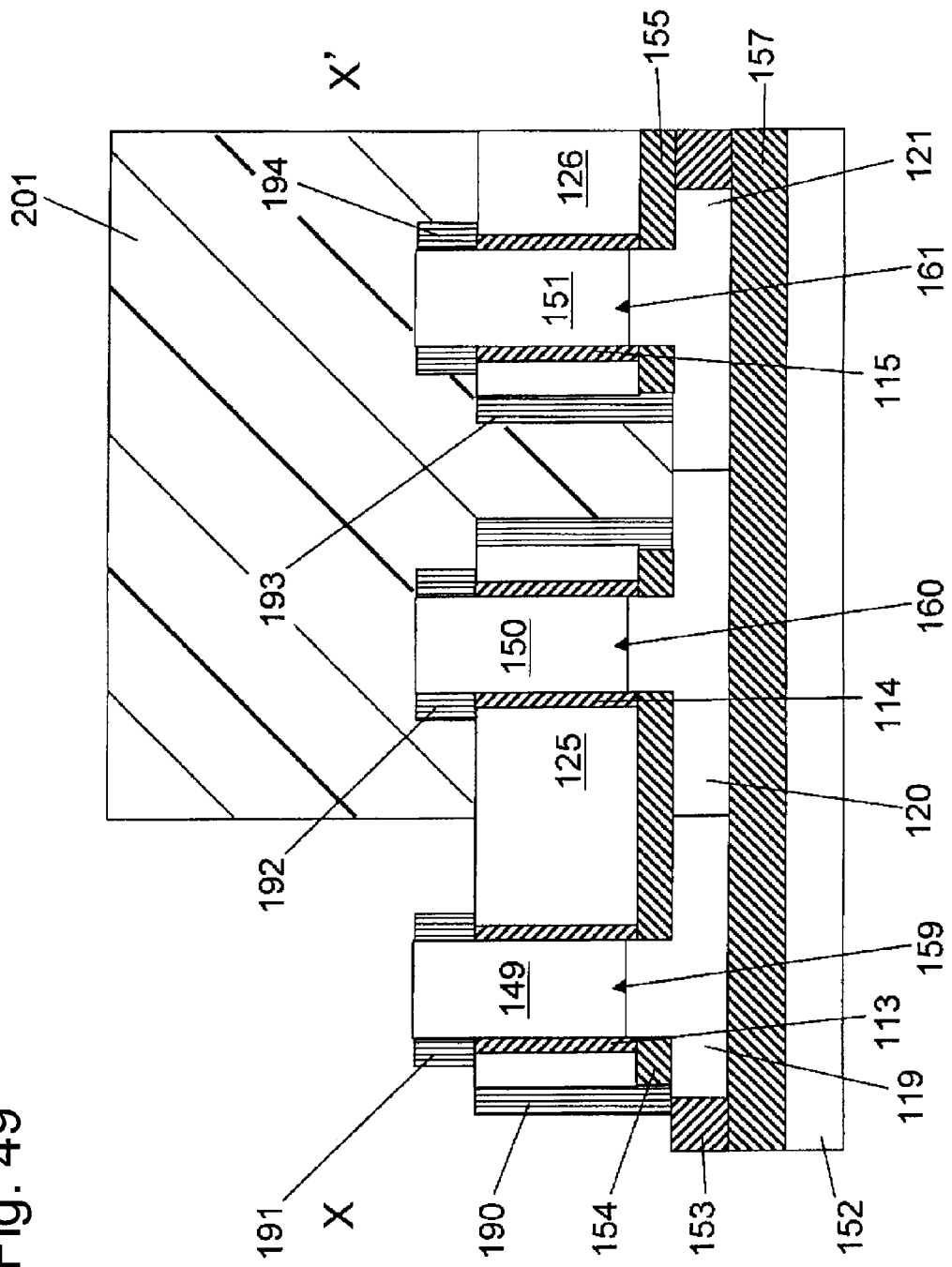
FIG. 49 is a cross-sectional view explaining the method for fabricating a static memory cell according to the embodiment of the present invention.

Then, as illustrated in FIG. 49, a resist 201 for forming a fourth diffusion layer 107 is formed.

Figure 50:
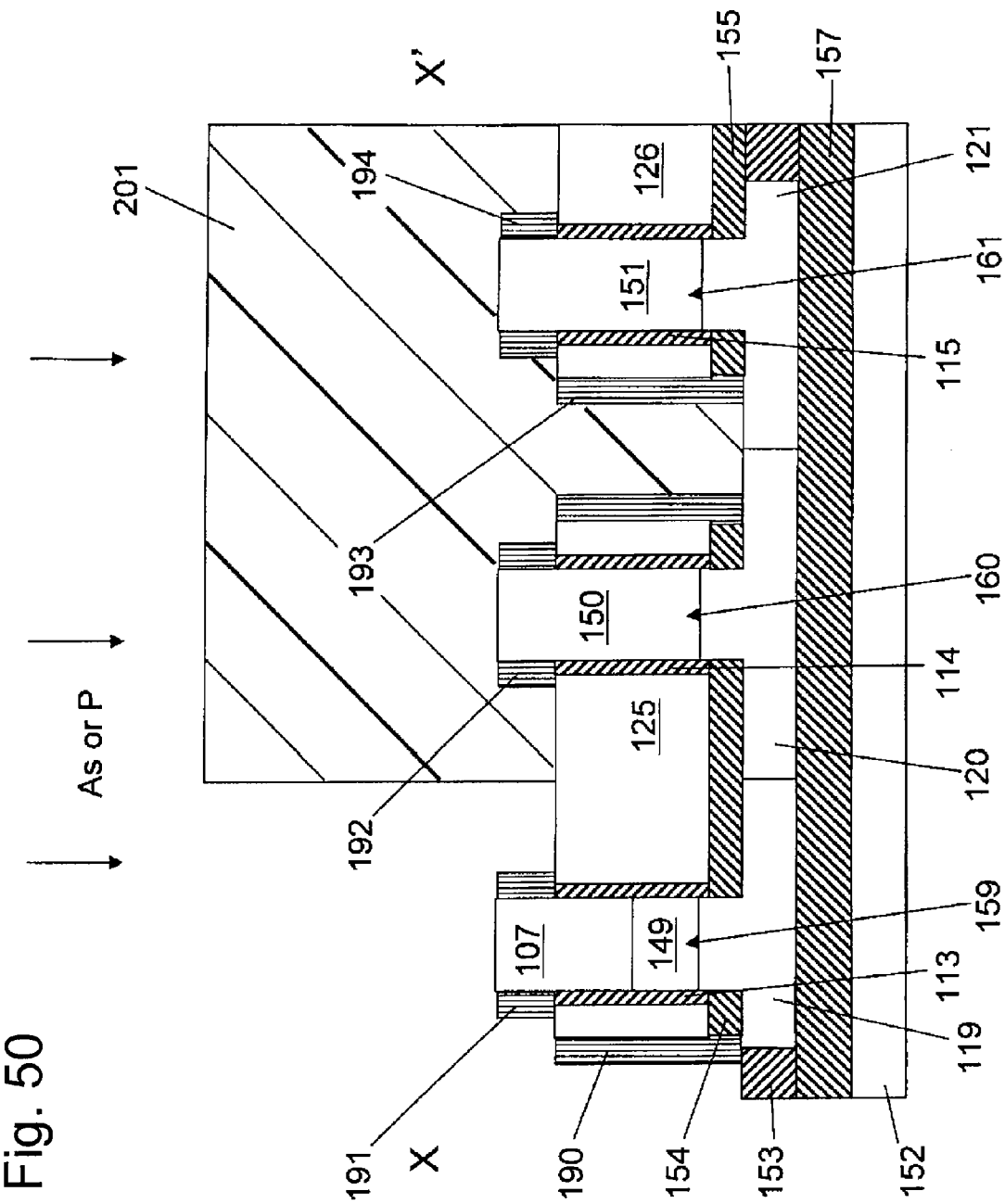
FIG. 50 is a cross-sectional view explaining the method for fabricating a static memory cell according to the embodiment of the present invention.

Subsequently, as illustrated in FIG. 50, arsenic or phosphorus is ion-implanted to form the fourth diffusion layer 107. When arsenic is to be used, the energy of the ion implantation may be increased. In addition, phosphorus having a long diffusion length is used, thus enabling the lower end of the fourth diffusion layer 107 of the third NMOS driver transistor 101 to be at a position lower than the lower end of the second diffusion layer 109 of the first NMOS access transistor 103. Whether to use arsenic or phosphorus may be selected as desired.

Figure 51:
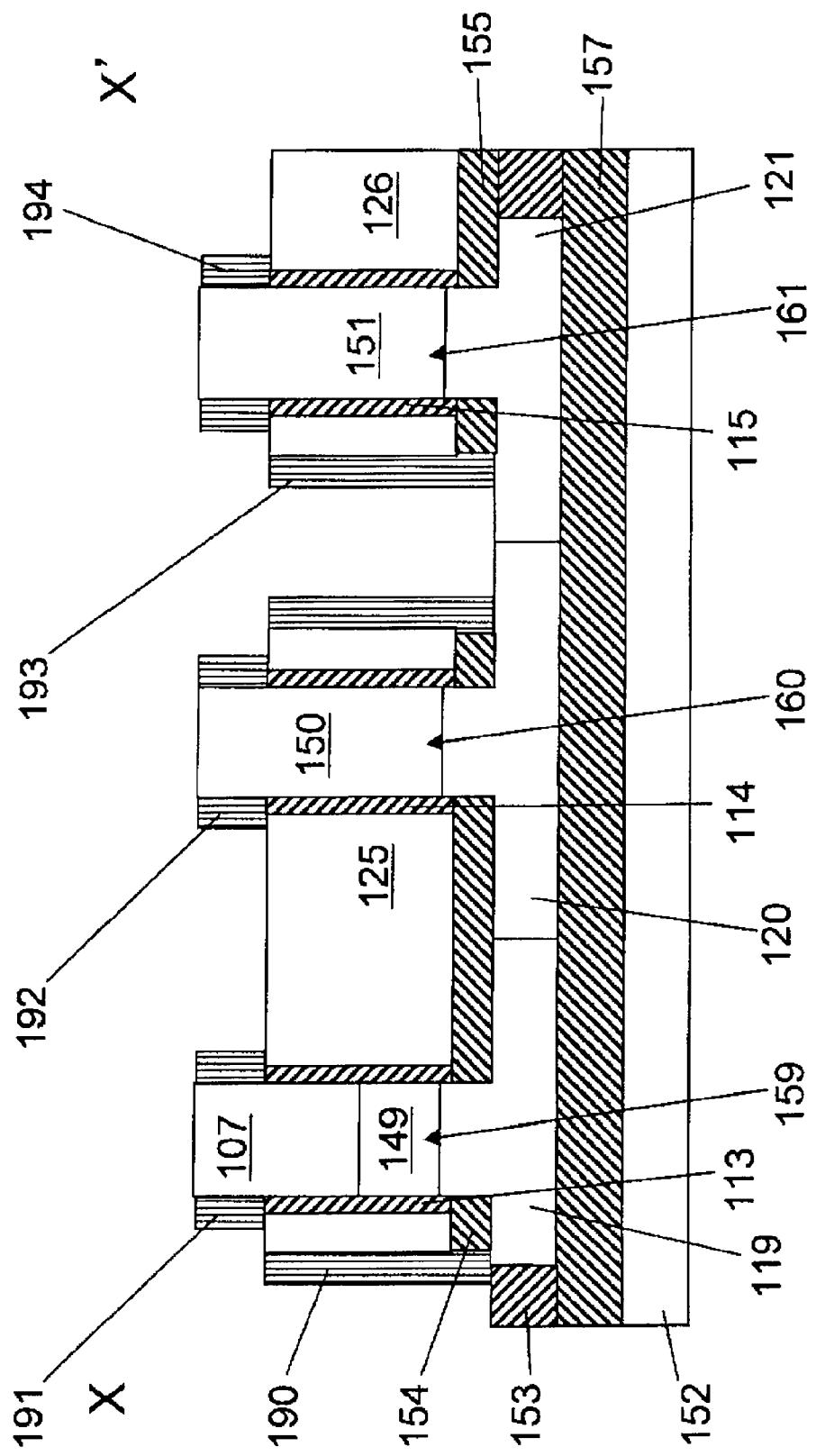
FIG. 51 is a cross-sectional view explaining the method for fabricating a static memory cell according to the embodiment of the present invention.

After that, as illustrated in FIG. 51, the resist 201 is stripped, and heat treatment is carried out.

Figure 52:
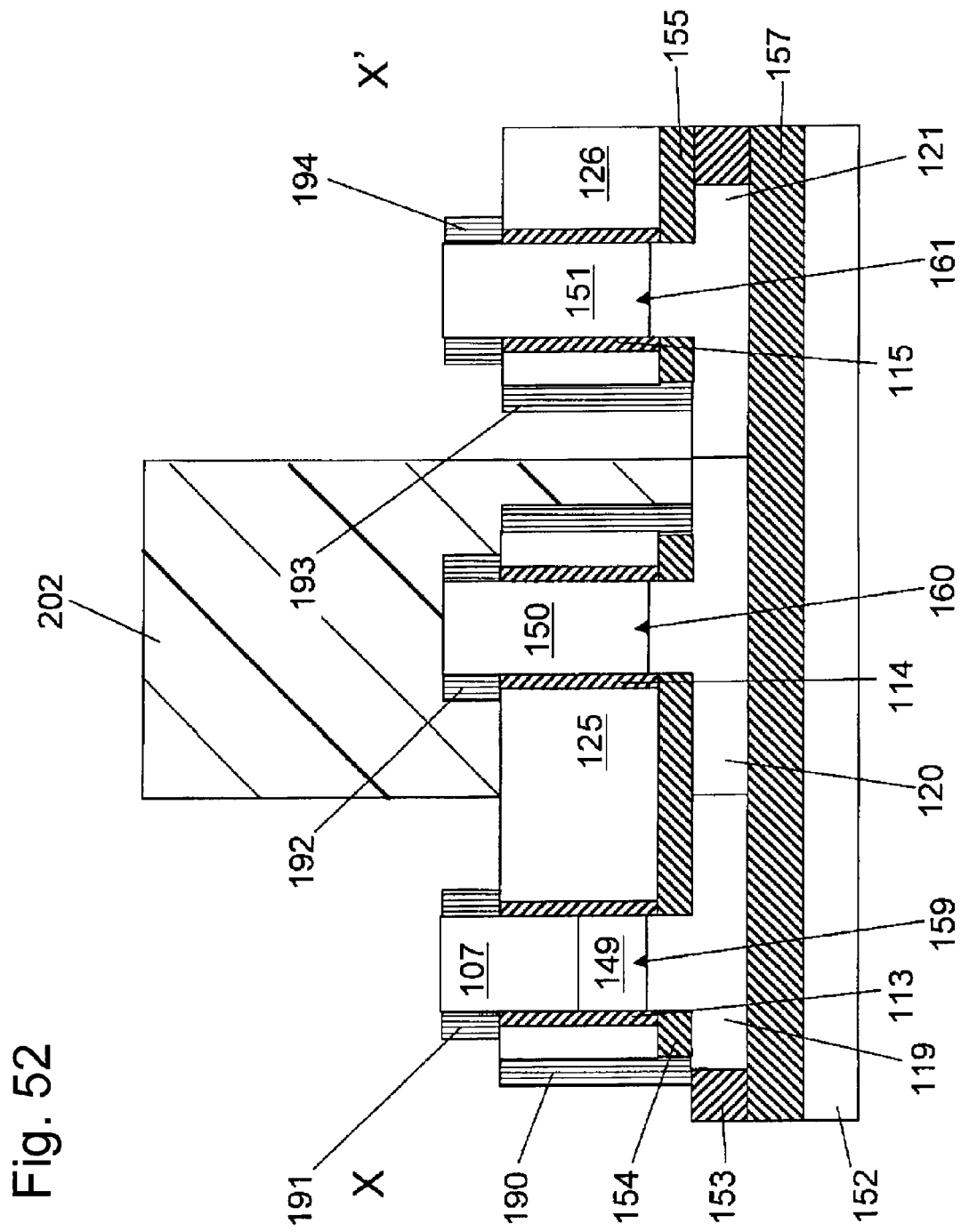
FIG. 52 is a cross-sectional view explaining the method for fabricating a static memory cell according to the embodiment of the present invention.

Then, as illustrated in FIG. 52, a resist 202 for forming a second diffusion layer 109 is formed.

Figure 53:
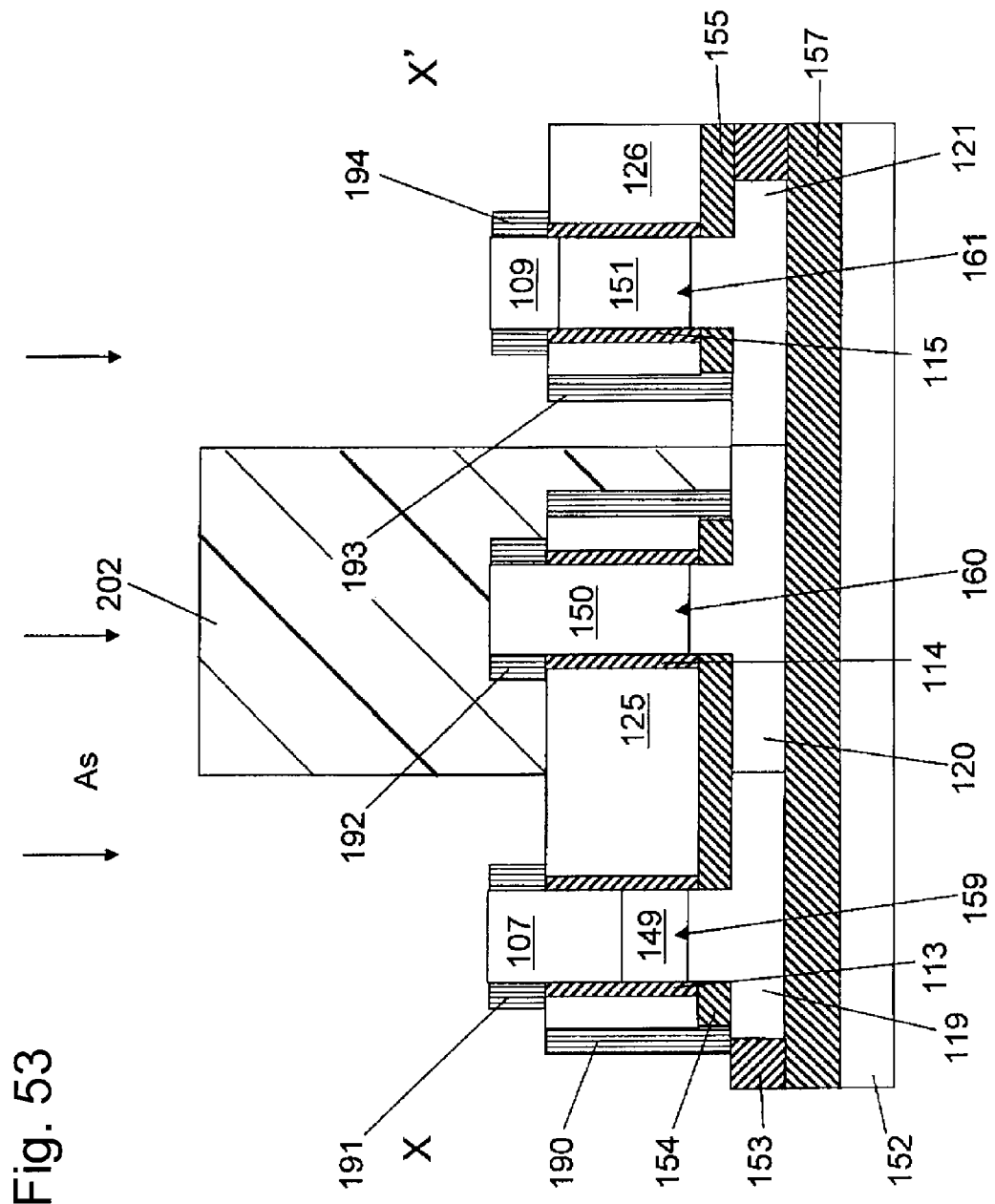
FIG. 53 is a cross-sectional view explaining the method for fabricating a static memory cell according to the embodiment of the present invention.

Subsequently, as illustrated in FIG. 53, arsenic is ion-implanted to from the second diffusion layer 109.

Figure 54:
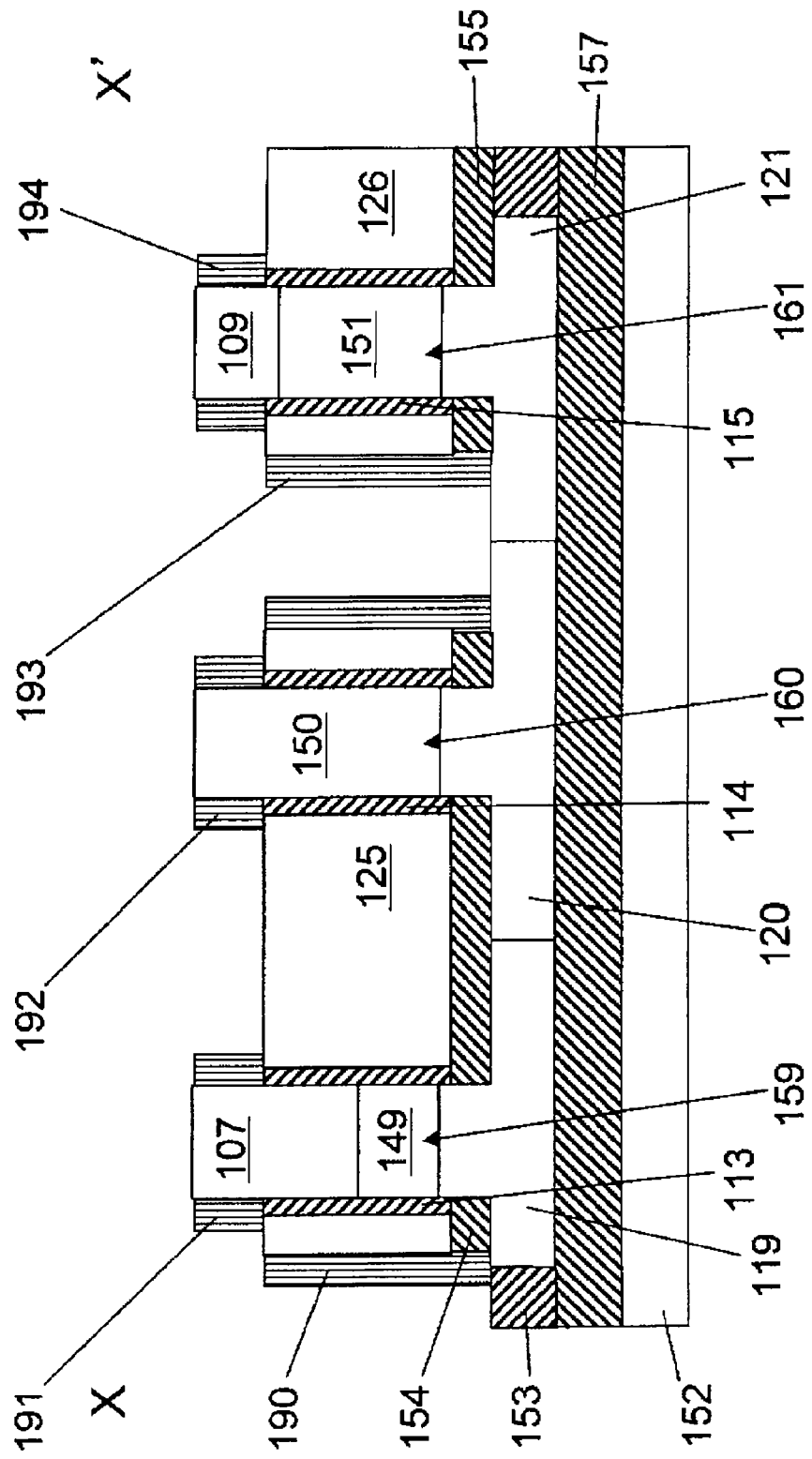
FIG. 54 is a cross-sectional view explaining the method for fabricating a static memory cell according to the embodiment of the present invention.

Subsequently, as illustrated in FIG. 54, the resist 202 is stripped, and heat treatment is carried out.

Figure 55:
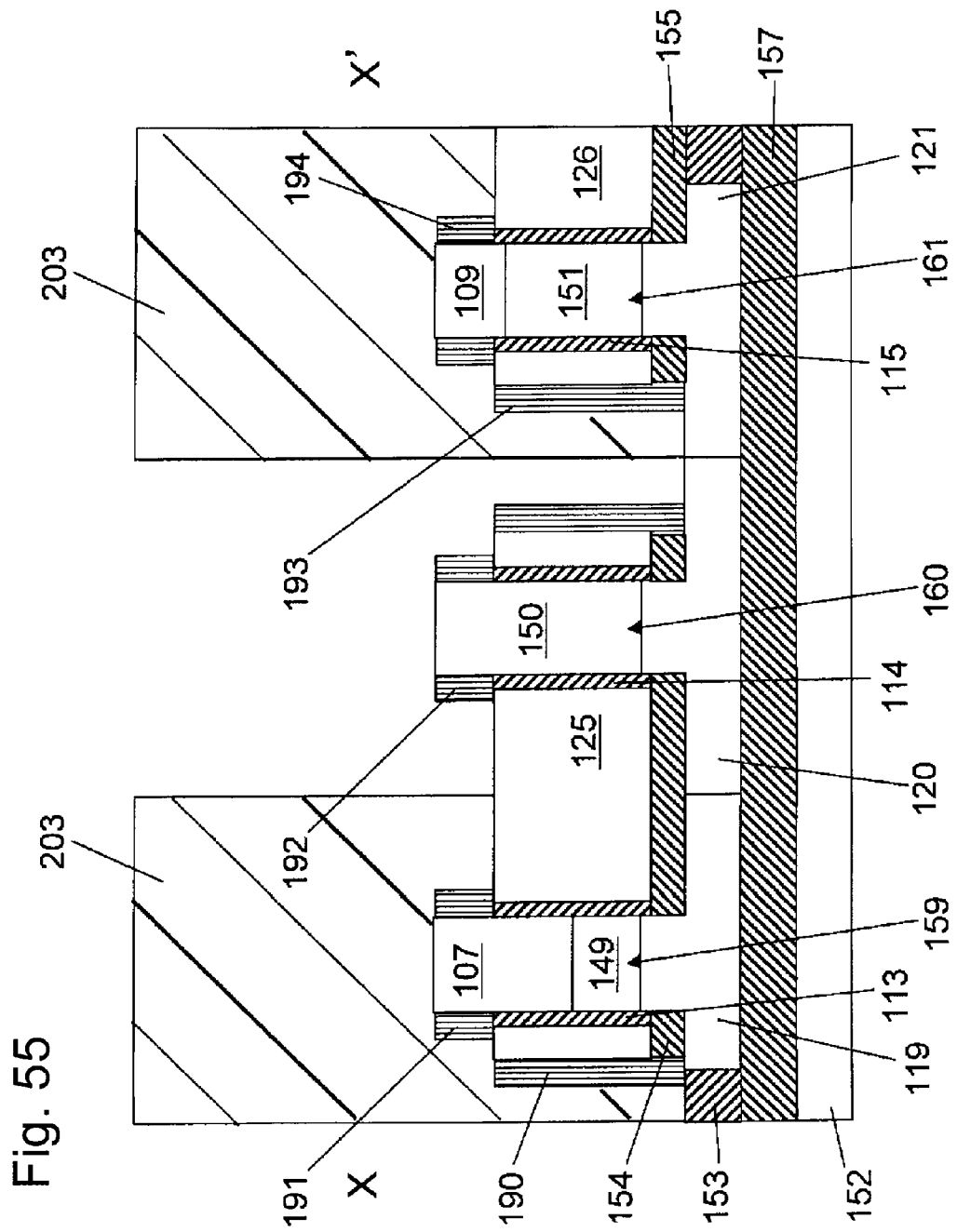
FIG. 55 is a cross-sectional view explaining the method for fabricating a static memory cell according to the embodiment of the present invention.

Subsequently, as illustrated in FIG. 55, a resist 203 for forming a sixth diffusion layer 108 is formed.

Figure 56:
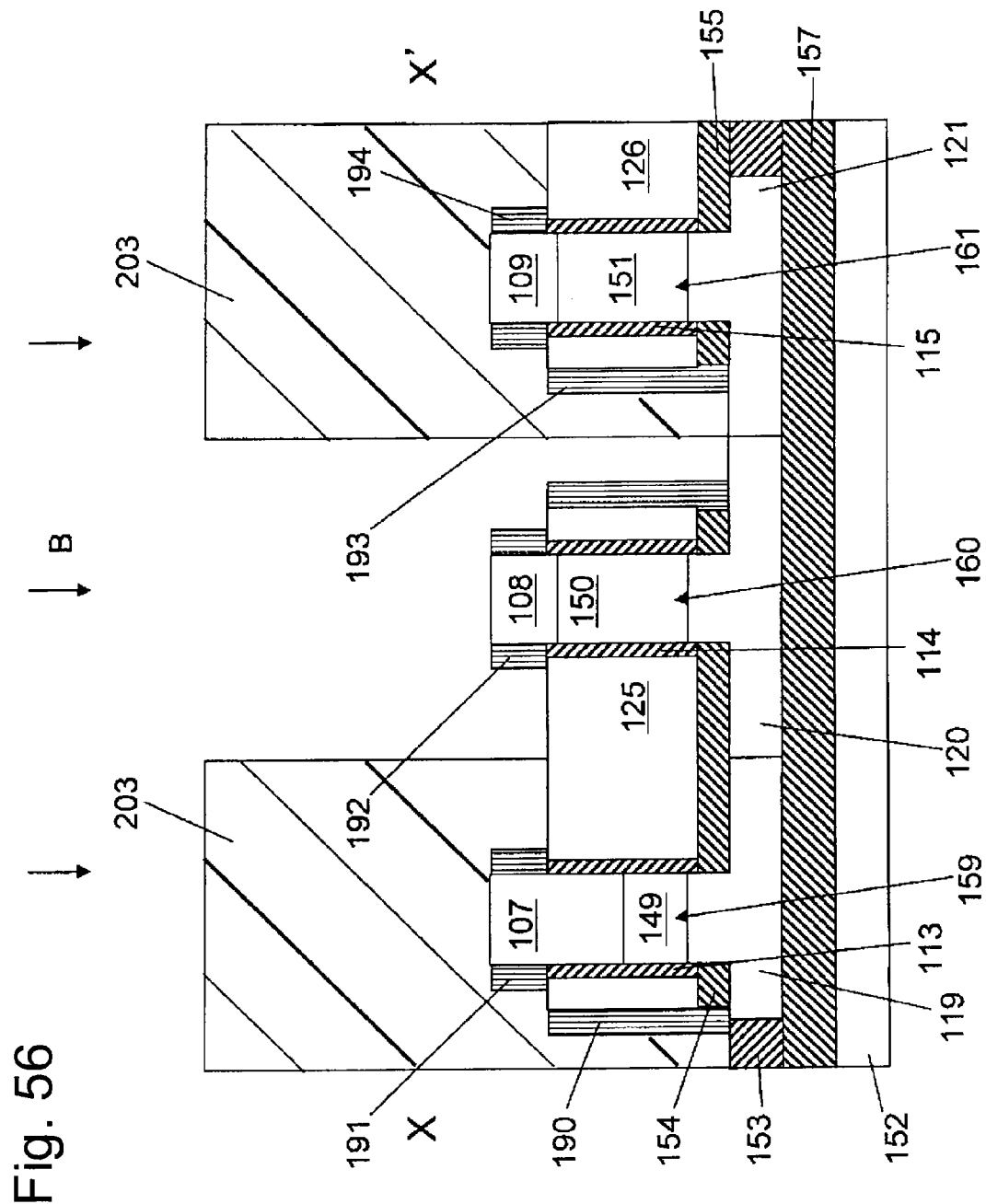
FIG. 56 is a cross-sectional view explaining the method for fabricating a static memory cell according to the embodiment of the present invention.

Subsequently, as illustrated in FIG. 56, boron is ion-implanted to form the sixth diffusion layer 108.

Figure 57:
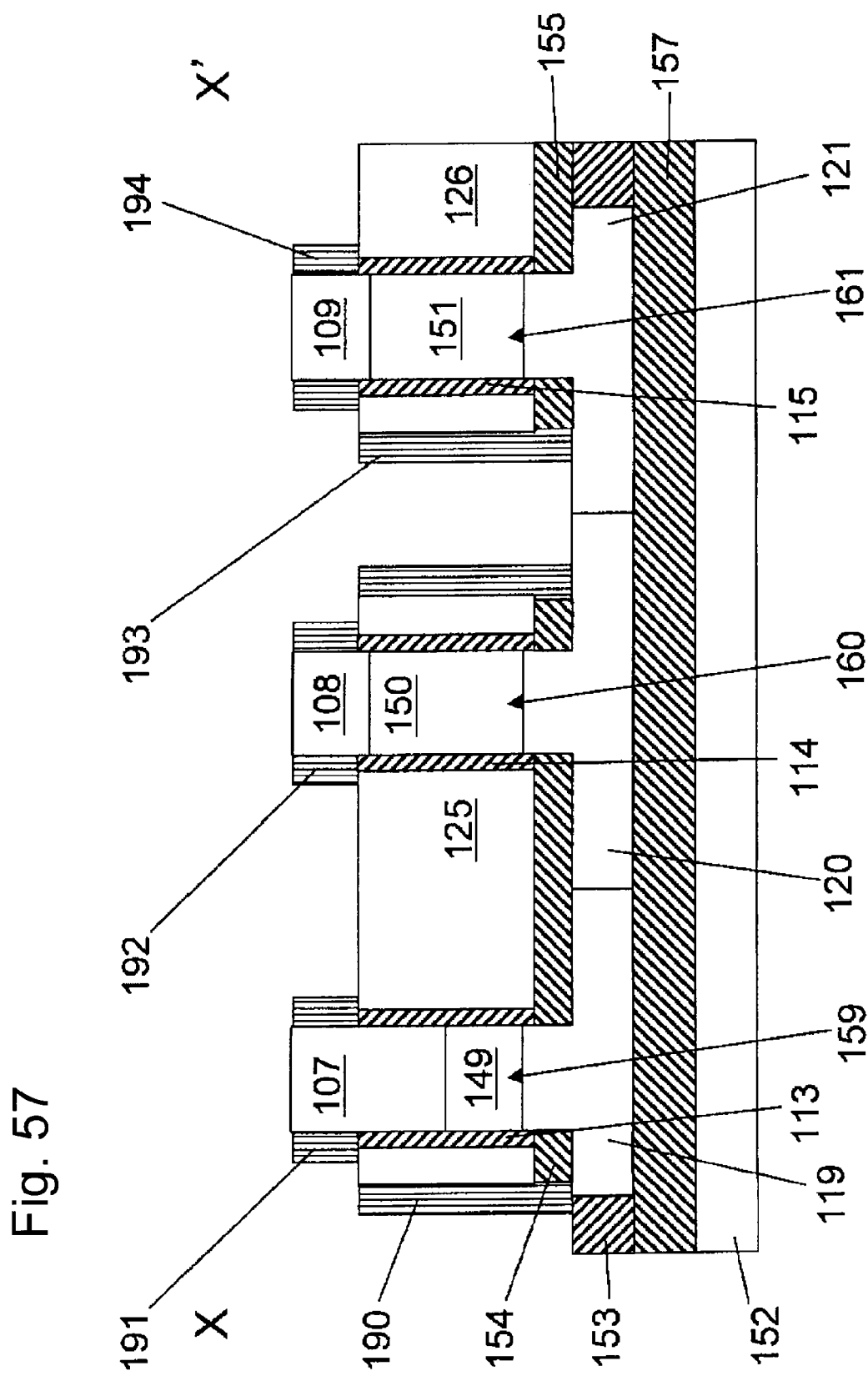
FIG. 57 is a cross-sectional view explaining the method for fabricating a static memory cell according to the embodiment of the present invention.

Subsequently, as illustrated in FIG. 57, the resist 203 is stripped, and heat treatment is carried out.

Figure 58:
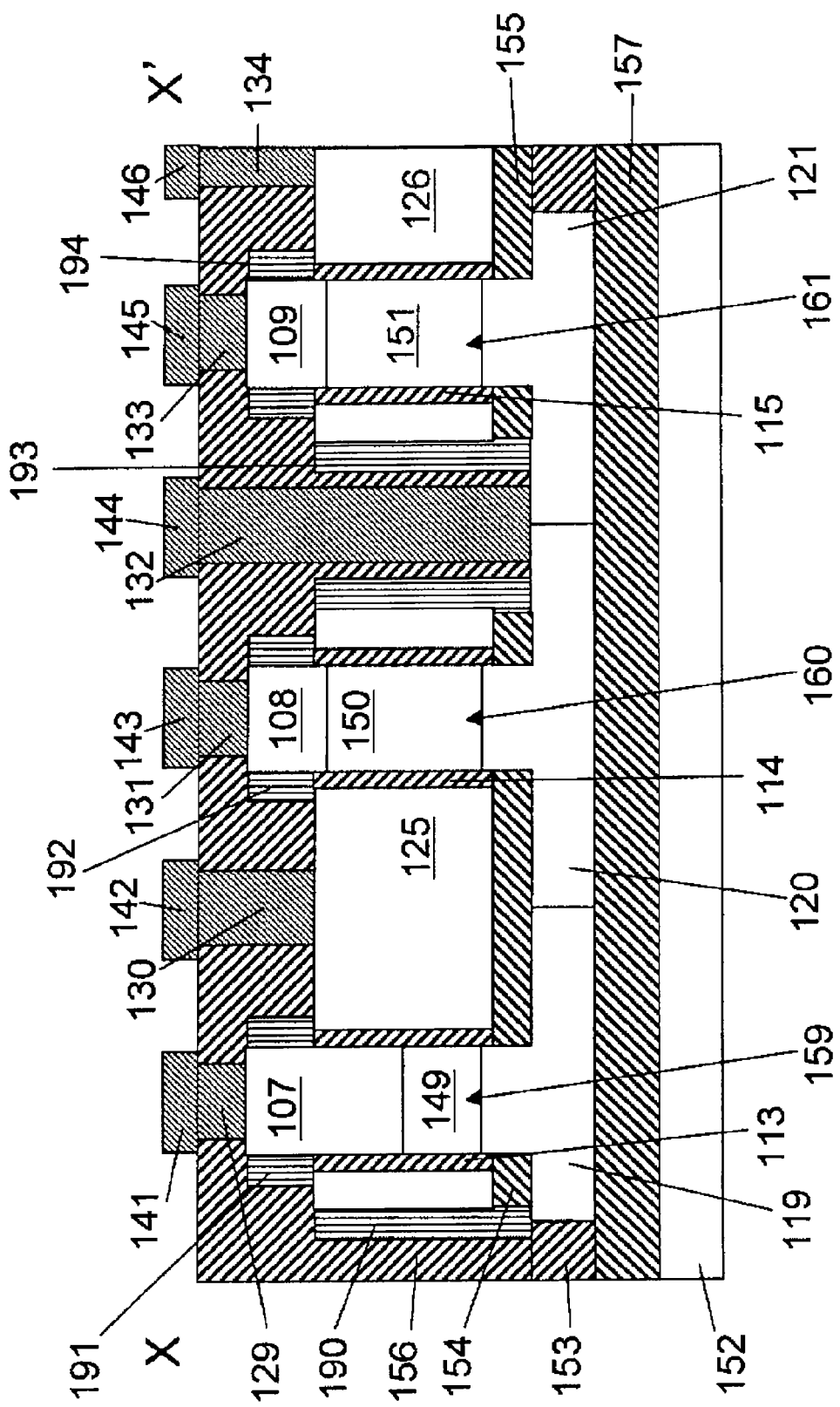
FIG. 58 is a cross-sectional view explaining the method for fabricating a static memory cell according to the embodiment of the present invention.

Then, as illustrated in FIG. 58, an interlayer film 156 is deposited, contacts 129, 130, 131, 132, 133, and 134 are formed, and metals 141, 142, 143, 144, 145, and 146 are formed. Before an interlayer film is formed, silicide layers may be formed on the third diffusion layer 119, the fifth diffusion layer 120, and the first diffusion layer 121. Silicide layers may also be formed on the fourth diffusion layer 107, the sixth diffusion layer 108, and the second diffusion layer 109.

Accordingly, the channel length of a driver transistor is made shorter than the channel length of an access transistor to ensure operational stability, and the duration of heat treatment can be shorter than that in FIG. 4.

While production methods for forming the structures illustrated in FIG. 4 and FIG. 5 have been described, the structure illustrated in FIG. 6 can be formed by using a combination of the method of forming the third diffusion layer 119 and the first diffusion layer 121 illustrated in FIG. 4 and the method of forming the fourth diffusion layer 107 and the second diffusion layer 109 illustrated in FIG. 5.

A variety of embodiments and modifications can be made to the present invention without departing from the broad spirit and scope of the present invention. The foregoing embodiments serve to explain exemplary embodiments of the present invention, and the technical scope of the present invention is not to be limited to the foregoing embodiments.

What is claimed is:

1. A semiconductor device comprising a static memory cell having six MOS transistors arranged on a substrate,
   the six MOS transistors including
      first and second NMOS access transistors for accessing a memory,
      third and fourth NMOS driver transistors for driving a storage node that holds data of the memory cell, and
      first and second PMOS load transistors that supply charges for holding the data of the memory cell,
      each of the first and second NMOS access transistors for accessing the memory having a first diffusion layer, a pillar-shaped semiconductor layer, and a second diffusion layer arranged vertically with respect to the substrate in a hierarchical manner so that the pillar-shaped semiconductor layer resides between the first diffusion layer and the second diffusion layer, the pillar-shaped semiconductor layer having a gate on a side wall thereof,
      each of the third and fourth NMOS driver transistors for driving the storage node that holds the data of the memory cell having a third diffusion layer, a pillar-shaped semiconductor layer, and a fourth diffusion layer arranged vertically with respect to the substrate in a hierarchical manner so that the pillar-shaped semiconductor layer resides between the third diffusion layer and the fourth diffusion layer, the pillar-shaped semiconductor layer having a gate on a side wall thereof,
      each of the first and second PMOS load transistors that supply the charges for holding the data of the memory cell having a fifth diffusion layer, a pillar-shaped semiconductor layer, and a sixth diffusion layer arranged vertically with respect to the substrate in a hierarchical manner so that the pillar-shaped semiconductor layer resides between the fifth diffusion layer and the sixth diffusion layer, the pillar-shaped semiconductor layer having a gate on a side wall thereof,
   wherein the first diffusion layers, the third diffusion layers, and the fifth diffusion layers electrically insulated from the substrate, and
   wherein a length between an upper end of the third diffusion layer and a lower end of the fourth diffusion layer of each of the third and fourth NMOS driver transistors is shorter than a length between an upper end of the first diffusion layer and a lower end of the second diffusion layer of each of the first and second NMOS access transistors, and
   a length between the upper end of the third diffusion layer of each of the third and fourth NMOS driver transistors and a lower end of the gate is different from a length between the lower end of the fourth diffusion layer of each of the third and fourth NMOS driver transistors and an upper end of the gate.

2. The semiconductor device according to claim 1, wherein the length between the upper end of the first diffusion layer and the lower end of the second diffusion layer of each of the first and second NMOS access transistors is within a range of 1.3 times to three times the length between the upper end of the third diffusion layer and the lower end of the fourth diffusion layer of each of the third and fourth NMOS driver transistors.

3. A semiconductor device comprising a static memory cell having six MOS transistors arranged on a substrate,
   the six MOS transistor including
      first and second NMOS access transistors for accessing a memory,
      third and fourth NMOS driver transistors that drive a storage node for holding data of the memory cell, and
      first and second PMOS load transistors that supply charges for holding the data of the memory cell,
      each of the first and second NMOS access transistors for accessing the memory having a first diffusion layer, a pillar-shaped semiconductor layer, and a second diffusion layer arranged vertically with respect to the substrate in a hierarchical manner so that the pillar-shaped semiconductor layer resides between the first diffusion layer and the second diffusion layer, the pillar-shaped semiconductor layer having a gate on a side wall thereof,
      each of the third and fourth NMOS driver transistors for driving the storage node that holds the data of the memory cell having a third diffusion layer, a pillar-shaped semiconductor layer, and a fourth diffusion layer arranged vertically with respect to the substrate in a hierarchical manner so that the pillar-shaped semiconductor layer resides between the third diffusion layer and the fourth diffusion layer, the pillar-shaped semiconductor layer having a gate on a side wall thereof,
      each of the first and second PMOS load transistors that supply the charges for holding the data of the memory cell having a fifth diffusion layer, a pillar-shaped semiconductor layer, and a sixth diffusion layer arranged vertically with respect to the substrate in a hierarchical manner so that the pillar-shaped semiconductor layer resides between the fifth diffusion layer and the sixth diffusion layer, the pillar-shaped semiconductor layer having a gate on a side wall thereof,
   wherein the first diffusion layers, the third diffusion layers, and the fifth diffusion layers are insulated from the substrate, and
   wherein a length between an upper end of the third diffusion layer and a lower end of the fourth diffusion layer of each of the third and fourth NMOS driver transistors is shorter than a length between an upper end of the fifth diffusion layer and a lower end of the sixth diffusion layer of each of the first and second PMOS load transistors, and
   a length between the upper end of the third diffusion layer of each of the third and fourth NMOS driver transistors and a lower end of the gate is different from a length between the lower end of the fourth diffusion layer of each of the third and fourth NMOS driver transistors and an upper end of the gate.

4. The semiconductor device according to claim 3, wherein the length between the upper end of the fifth diffusion layer and the lower end of the sixth diffusion layer of each of the first and second PMOS load transistors is within a range of 1.3 times to three times the length between the upper end of the third diffusion layer and the lower end of the fourth diffusion layer of each of the third and fourth NMOS driver transistors.

5. A semiconductor device comprising a static memory cell having six MOS transistors arranged on a substrate,
the six MOS transistors including
first and second NMOS access transistors for accessing a memory,
third and fourth NMOS driver transistors for driving a storage node that holds data of the memory cell, and
first and second PMOS load transistors that supply charges for holding the data of the memory cell,
each of the first and second NMOS access transistors for accessing the memory having a first diffusion layer, a pillar-shaped semiconductor layer, and a second diffusion layer arranged vertically with respect to the substrate in a hierarchical manner so that the pillar-shaped semiconductor layer resides between the first diffusion layer and the second diffusion layer, the pillar-shaped semiconductor layer having a gate on a side wall thereof,
each of the third and fourth NMOS driver transistors for driving the storage node that holds the data of the memory cell having a third diffusion layer, a pillar-shaped semiconductor layer, and a fourth diffusion layer arranged vertically with respect to the substrate in a hierarchical manner so that the pillar-shaped semiconductor layer resides between the third diffusion layer and the fourth diffusion layer, the pillar-shaped semiconductor layer having a gate on a side wall thereof,
each of the first and second PMOS load transistors that supply the charges for holding the data of the memory cell having a fifth diffusion layer, a pillar-shaped semiconductor layer, and a sixth diffusion layer arranged vertically with respect to the substrate in a hierarchical manner so that the pillar-shaped semiconductor layer resides between the fifth diffusion layer and the sixth diffusion layer, the pillar-shaped semiconductor layer having a gate on a side wall thereof,
wherein the first diffusion layers, the third diffusion layers, and the fifth diffusion layers are electrically insulated from the substrate, a length between an upper end of the third diffusion layer and a lower end of the fourth diffusion layer of each of the third and fourth NMOS driver transistors is shorter than a length between an upper end of the first diffusion layer and a lower end of the second diffusion layer of each of the first and second NMOS access transistors, and shorter than a length between an upper end of the fifth diffusion layer and a lower end of the sixth diffusion layer of each of the first and second PMOS load transistors, and a length from a lower end to an upper end of the each of the gates are the same, and
wherein the upper end of the third diffusion layer of each of the third and fourth NMOS driver transistors is at a position higher than the upper end of the first diffusion layer of each of the first and second NMOS access transistors, and
the length between the upper end of the third diffusion layer of each of the third and fourth NMOS driver transistors and the lower end of the gate is longer than the length between the lower end of the fourth diffusion layer of each of the third and fourth NMOS driver transistors and the upper end of the gate.

6. A method of fabricating a semiconductor device comprising:
providing a device according to claim 5,
wherein the first diffusion layer of each of the first and second NMOS access transistors is formed after the third diffusion layer of each of the third and fourth NMOS driver transistors is formed.

7. A semiconductor device comprising a static memory cell having six MOS transistors arranged on a substrate,
the six MOS transistors including
first and second NMOS access transistors for accessing a memory,
third and fourth NMOS driver transistors for driving a storage node that holds data of the memory cell, and
first and second PMOS load transistors that supply charges for holding the data of the memory cell,
each of the first and second NMOS access transistors for accessing the memory having a first diffusion layer, a pillar-shaped semiconductor layer, and a second diffusion layer arranged vertically with respect to the substrate in a hierarchical manner so that the pillar-shaped semiconductor layer resides between the first diffusion layer and the second diffusion layer, the pillar-shaped semiconductor layer having a gate on a side wall thereof,
each of the third and fourth NMOS driver transistors for driving the storage node that holds the data of the memory cell having a third diffusion layer, a pillar-shaped semiconductor layer, and a fourth diffusion layer arranged vertically with respect to the substrate in a hierarchical manner so that the pillar-shaped semiconductor layer resides between the third diffusion layer and the fourth diffusion layer, the pillar-shaped semiconductor layer having a gate on a side wall thereof,
each of the first and second PMOS load transistors that supply the charges for holding the data of the memory cell having a fifth diffusion layer, a pillar-shaped semiconductor layer, and a sixth diffusion layer arranged vertically with respect to the substrate in a hierarchical manner so that the pillar-shaped semiconductor layer resides between the fifth diffusion layer and the sixth diffusion layer, the pillar-shaped semiconductor layer having a gate on a side wall thereof,
wherein the first diffusion layers, the third diffusion layers, and the fifth diffusion layers are electrically insulated from the substrate, a length between an upper end of the third diffusion layer and a lower end of the fourth diffusion layer of each of the third and fourth NMOS driver transistors is shorter than a length between an upper end of the first diffusion layer and a lower end of the second diffusion layer of each of the first and second NMOS access transistors, and shorter than a length between an upper end of the fifth diffusion layer and a lower end of the sixth diffusion layer of each of the first and second PMOS load transistors, and a length from a lower end to an upper end of the each of the gates are the same, and wherein the lower end of the fourth diffusion layer of each of the third and fourth NMOS driver transistors is at a position lower than the lower end of the second diffusion layer of each of the first and second NMOS access transistors, and the length between the upper end of the third diffusion layer of each of the third and fourth NMOS driver transistors and the lower end of the gate is shorter than the length between the lower end of the fourth diffusion layer of each of the third and fourth NMOS driver transistors and the upper end of the gate.

8. A method of fabricating a semiconductor device comprising:

providing a device according to claim 7, wherein the fourth diffusion layers of the third and fourth NMOS driver transistors and the second diffusion layers of the first and second NMOS access transistors are formed by ion implantation, and wherein energy of ion implantation for forming the fourth diffusion layer of each of the third and fourth NMOS driver transistors is higher than energy of ion implantation for forming the second diffusion layer of each of the first and second NMOS access transistors.

9. The semiconductor device according to claim 7, wherein the fourth diffusion layers of the third and fourth NMOS driver transistors include phosphorus.

10. A semiconductor device comprising a static memory cell having six MOS transistors arranged on a substrate, the six MOS transistors including first and second NMOS access transistors for accessing a memory, third and fourth NMOS driver transistors for driving a storage node that holds data of the memory cell, and first and second PMOS load transistors that supply charges for holding the data of the memory cell, each of the first and second NMOS access transistors for accessing the memory having a first diffusion layer, a pillar-shaped semiconductor layer, and a second diffusion layer arranged vertically with respect to the substrate in a hierarchical manner so that the pillar-shaped semiconductor layer resides between the first diffusion layer and the second diffusion layer, the pillar-shaped semiconductor layer having a gate on a side wall thereof, each of the third and fourth NMOS driver transistors for driving the storage node that holds the data of the memory cell having a third diffusion layer, a pillar-shaped semiconductor layer, and a fourth diffusion layer arranged vertically with respect to the substrate in a hierarchical manner so that the pillar-shaped semiconductor layer resides between the third diffusion layer and the fourth diffusion layer, the pillar-shaped semiconductor layer having a gate on a side wall thereof, each of the first and second PMOS load transistors that supply the charges for holding the data of the memory cell having a fifth diffusion layer, a pillar-shaped semiconductor layer, and a sixth diffusion layer arranged vertically with respect to the substrate in a hierarchical manner so that the pillar-shaped semiconductor layer resides between the fifth diffusion layer and the sixth diffusion layer, the pillar-shaped semiconductor layer having a gate on a side wall thereof, wherein the first diffusion layers, the third diffusion layers, and the fifth diffusion layers are electrically insulated from the substrate, wherein a length between an upper end of the third diffusion layer and a lower end of the fourth diffusion layer of each of the third and fourth NMOS driver transistors is shorter than a length between an upper end of the first diffusion layer and a lower end of the second diffusion layer of each of the first and second NMOS access transistors, wherein a length from a lower end to an upper end of the each of the gates are the same wherein the upper end of the third diffusion layer of each of the third and fourth NMOS driver transistors is at a position higher than the upper end of the first diffusion layer of each of the first and second NMOS access transistors, and wherein the lower end of the fourth diffusion layer of each of the third and fourth NMOS driver transistors is at a position lower than the lower end of the second diffusion layer of each of the first and second NMOS access transistors.

* * * * *